(12) United States Patent
Sunamura et al.

(10) Patent No.: US 9,680,031 B2
(45) Date of Patent: Jun. 13, 2017

(54) SEMICONDUCTOR DEVICE AND MANUFACTURING METHOD THEREOF

(71) Applicant: Renesas Electronics Corporation, Koutou-ku, Tokyo (JP)

(72) Inventors: Hiroshi Sunamura, Kanagawa (JP); Kishou Kaneko, Kanagawa (JP); Yoshihiro Hayashi, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/052,114

(22) Filed: Feb. 24, 2016

(65) Prior Publication Data

US 2016/0172504 A1 Jun. 16, 2016

Related U.S. Application Data

(63) Continuation of application No. 13/972,962, filed on Aug. 22, 2013, now Pat. No. 9,331,071.

(30) Foreign Application Priority Data

Sep. 5, 2012 (JP) ................................. 2012-195291

(51) Int. Cl.
*H01L 29/786* (2006.01)
*H01L 27/088* (2006.01)
(Continued)

(52) U.S. Cl.
CPC ...... *H01L 29/7869* (2013.01); *H01L 21/8221* (2013.01); *H01L 23/522* (2013.01);
(Continued)

(58) Field of Classification Search
USPC ....................................................... 257/337
See application file for complete search history.

(56) References Cited

U.S. PATENT DOCUMENTS 4,272,880 A * 6/1981 Pashley ............... H01L 21/0274
148/DIG. 91
4,500,905 A * 2/1985 Shibata .................... G11C 5/00
257/74

(Continued)

FOREIGN PATENT DOCUMENTS

CN 101197394 A 6/2008
JP 2008-112909 A 5/2008

(Continued)

OTHER PUBLICATIONS

Kaneko, K. et.al., "Operation of Functional Circuit Elements using BEOL-Transistor with InGaZnO Channel for On-chip High/Low Voltage Bridging I/Os and High-Current Switches", 2012 Symposium on VLSI Technology Digest of Technical Papers, pp. 123-124 (2012).

(Continued)

*Primary Examiner* — Earl Taylor
(74) *Attorney, Agent, or Firm* — Shapiro, Gabor and Rosenberger, PLLC

(57) ABSTRACT

Provided is an in-wiring-layer active element (component) which allows for electrical isolation between a gate electrode and a channel in a top gate structure. A semiconductor device includes a first wiring layer, a second wiring layer, and a semiconductor element. The first wiring layer has a first interlayer insulating layer, and a first wire embedded in the first interlayer insulating layer. The second wiring layer has a second interlayer insulating layer, and second wires embedded in the second interlayer insulating layer. The semiconductor element is provided at least in the second wiring layer. The semiconductor element includes a semiconductor layer provided in the second wiring layer, a gate insulating film provided in contact with the semiconductor layer, a gate electrode provided on the opposite side of the (Continued)

semiconductor layer via the first gate insulating film, and a first side wall film provided over a side surface of the semiconductor layer.

6 Claims, 32 Drawing Sheets

(51) Int. Cl.
*H01L 29/66* (2006.01)
*H01L 21/822* (2006.01)
*H01L 23/522* (2006.01)
*H01L 23/532* (2006.01)
*H01L 27/06* (2006.01)
*H01L 27/12* (2006.01)
*H01L 29/792* (2006.01)

(52) U.S. Cl.
CPC .... *H01L 23/53295* (2013.01); *H01L 27/0688* (2013.01); *H01L 27/088* (2013.01); *H01L 27/1225* (2013.01); *H01L 29/66477* (2013.01); *H01L 29/66969* (2013.01); *H01L 29/78618* (2013.01); *H01L 29/78648* (2013.01); *H01L 29/78696* (2013.01); *H01L 29/792* (2013.01); *H01L 2924/0002* (2013.01); *H01L 2924/00011* (2013.01)

(56) References Cited

U.S. PATENT DOCUMENTS

| | | | | |
|---|---|---|---|---|
| 4,933,298 A * | 6/1990 | Hasegawa | H01L 21/2026 | 257/353 |
| 4,939,568 A * | 7/1990 | Kato | H01L 21/6835 | 257/686 |
| 5,028,976 A * | 7/1991 | Ozaki | H01L 21/8221 | 117/923 |
| 5,041,884 A * | 8/1991 | Kumamoto | H01L 27/0688 | 257/347 |
| 5,128,732 A * | 7/1992 | Sugahara | H01L 27/0688 | 257/351 |
| 5,422,302 A * | 6/1995 | Yonehara | H01L 21/8221 | 117/913 |
| 5,652,453 A * | 7/1997 | Iwamatsu | H01L 27/1203 | 257/347 |
| 5,670,812 A * | 9/1997 | Adler | H01L 27/0688 | 257/347 |
| 5,976,953 A * | 11/1999 | Zavracky | H01L 23/49833 | 257/700 |
| 6,030,873 A * | 2/2000 | Iwamatsu | H01L 21/84 | 257/349 |
| 6,037,635 A * | 3/2000 | Yamazaki | H01L 27/0688 | 257/351 |
| 6,172,381 B1 * | 1/2001 | Gardner | H01L 21/76838 | 257/152 |
| 6,259,118 B1 * | 7/2001 | Kadosh | H01L 27/0688 | 257/365 |
| 6,424,020 B1 * | 7/2002 | Vu | A61B 3/113 | 257/507 |
| 6,600,173 B2 * | 7/2003 | Tiwari | H01L 21/76254 | 257/347 |
| 6,611,023 B1 * | 8/2003 | En | H01L 29/42384 | 257/288 |
| 6,635,552 B1 * | 10/2003 | Gonzalez | H01L 21/76254 | 257/E21.568 |
| 6,638,834 B2 * | 10/2003 | Gonzalez | H01L 21/76254 | 257/E21.568 |
| 6,821,826 B1 * | 11/2004 | Chan | H01L 21/6835 | 257/74 |
| 6,887,753 B2 * | 5/2005 | Gonzalez | H01L 21/28512 | 257/303 |
| 6,927,431 B2 * | 8/2005 | Gonzalez | H01L 21/28512 | 257/288 |
| 7,312,487 B2 * | 12/2007 | Alam | H01L 21/2007 | 257/278 |
| 7,670,885 B2 * | 3/2010 | Mitsuhashi | H01L 29/41783 | 257/E29.151 |
| 7,692,194 B2 * | 4/2010 | Yamazaki | H01L 29/42384 | 257/347 |
| 7,696,063 B2 * | 4/2010 | Tsuchiya | H01L 21/8221 | 257/52 |
| 7,915,163 B2 * | 3/2011 | Konevecki | H01L 21/28282 | 257/E21.585 |
| 7,915,164 B2 * | 3/2011 | Konevecki | H01L 21/28282 | 257/E21.585 |
| 7,939,831 B2 * | 5/2011 | Anzai | H01L 27/1214 | 257/59 |
| 7,947,981 B2 * | 5/2011 | Yamazaki | H01L 27/1233 | 257/258 |
| 7,982,250 B2 * | 7/2011 | Yamazaki | H01L 21/8221 | 257/278 |
| 8,044,464 B2 * | 10/2011 | Yamazaki | H01L 23/433 | 257/347 |
| 8,153,506 B2 * | 4/2012 | Anzai | H01L 27/1214 | 438/119 |
| 8,198,165 B2 * | 6/2012 | Ohnuma | H01L 29/41783 | 257/E21.619 |
| 8,378,341 B2 * | 2/2013 | Hayashi | H01L 21/28282 | 257/314 |
| 8,378,403 B2 * | 2/2013 | Kato | H01L 27/0688 | 257/296 |
| 8,389,417 B2 * | 3/2013 | Yamazaki | H01L 21/8221 | 257/288 |
| 8,470,648 B2 * | 6/2013 | Yamazaki | H01L 21/76254 | 257/E21.567 |
| 8,476,626 B2 * | 7/2013 | Yamazaki | G11C 11/403 | 257/43 |
| 8,530,973 B2 * | 9/2013 | Hanaoka | H01L 21/76823 | 257/366 |
| 8,559,220 B2 * | 10/2013 | Yamazaki | G11C 11/405 | 365/149 |
| 8,581,309 B2 * | 11/2013 | Yamazaki | H01L 23/433 | 257/255 |
| 8,587,066 B2 * | 11/2013 | Zhu | H01L 21/8221 | 257/347 |
| 8,630,130 B2 * | 1/2014 | Kurokawa | H01L 27/0688 | 365/189.011 |
| 8,680,520 B2 * | 3/2014 | Yamazaki | H01L 27/1203 | 257/43 |
| 8,809,850 B2 * | 8/2014 | Yamazaki | H01L 27/0688 | 257/43 |
| 8,809,853 B2 * | 8/2014 | Saito | H01L 27/1156 | 257/43 |
| 8,896,042 B2 * | 11/2014 | Yamazaki | G11C 11/405 | 257/296 |
| 8,896,046 B2 * | 11/2014 | Kato | H01L 27/0688 | 257/298 |
| 8,896,049 B2 * | 11/2014 | Isobe | H01L 21/84 | 257/213 |
| 2003/0059999 A1 * | 3/2003 | Gonzalez | H01L 21/76254 | 438/200 |
| 2006/0071074 A1 * | 4/2006 | Konevecki | H01L 21/28282 | 235/454 |
| 2006/0186441 A1 * | 8/2006 | Takayama | G02F 1/136286 | 257/257 |
| 2008/0128808 A1 * | 6/2008 | Yamazaki | H01L 21/84 | 257/347 |
| 2008/0179597 A1 * | 7/2008 | Yamazaki | H01L 27/1233 | 257/59 |
| 2009/0050941 A1 * | 2/2009 | Yamazaki | H01L 21/76254 | 257/255 |
| 2009/0078970 A1 * | 3/2009 | Yamazaki | H01L 21/8221 | 257/255 |
| 2009/0079000 A1 * | 3/2009 | Yamazaki | H01L 23/433 | 257/351 |
| 2009/0142888 A1 * | 6/2009 | Tsuchiya | H01L 21/8221 | 438/151 |
| 2009/0203177 A1 * | 8/2009 | Mitsuhashi | H01L 29/41783 | 438/166 |

(56) References Cited

U.S. PATENT DOCUMENTS

| | | | | |
|---|---|---|---|---|
| 2009/0242891 | A1* | 10/2009 | Mitsuhashi | H01L 29/66772 257/66 |
| 2010/0148171 | A1* | 6/2010 | Hayashi | H01L 21/28282 257/43 |
| 2010/0187524 | A1* | 7/2010 | Isobe | H01L 21/84 257/43 |
| 2011/0027968 | A1* | 2/2011 | Yamazaki | H01L 21/76254 438/458 |
| 2011/0089417 | A1* | 4/2011 | Yamazaki | H01L 27/0688 257/43 |
| 2011/0140099 | A1* | 6/2011 | Yamazaki | H01L 27/0688 257/43 |
| 2012/0001243 | A1* | 1/2012 | Kato | H01L 27/0688 257/296 |
| 2012/0032236 | A1* | 2/2012 | Yamazaki | H01L 23/433 257/255 |
| 2012/0268849 | A1* | 10/2012 | Tomatsu | H01L 27/0266 361/56 |
| 2012/0292614 | A1* | 11/2012 | Matsubayashi | G11C 15/04 257/43 |
| 2012/0293202 | A1* | 11/2012 | Nishijima | H03K 19/1776 326/41 |
| 2012/0298987 | A1* | 11/2012 | Sakata | H01L 27/0688 257/43 |
| 2014/0061810 | A1* | 3/2014 | Sunamura | H01L 27/1225 257/368 |
| 2014/0319647 | A1* | 10/2014 | Jung | H01L 27/088 257/499 |

FOREIGN PATENT DOCUMENTS

| | | |
|---|---|---|
| JP | 2009-32794 A | 2/2009 |
| JP | 2009 094494 A | 4/2009 |
| JP | 2009-283819 A | 12/2009 |
| JP | 2010-141230 A | 6/2010 |
| JP | 2011-109079 A | 6/2011 |

OTHER PUBLICATIONS

Kaneko, K. et.al., "A Novel BEOL-Transistor (BETr) with InGaZnO Embedded in Cu-Interconnects for On-chip High Voltage I/Os in Standard CMOS LSIs", 2011 Symposium on VLSI Technology Digest of Technical Papers, pp. 120-121 (2011).

Kaneko, K. et.al., "Highly Reliable BEOL-Transistor with Oxygen-controlled InGaZnO and Gate/Drain Offset Design for High/Low Voltage Bridging I/O Operations", 2011 IEEE International Electron Devices Meeting (IEDM), pp. 155-158 (2011).

Office Action issued Mar. 1, 2016, in Japanese Patent Application No. 2012-195291.

Office Action issued Aug. 25, 2016, in Chinese Patent Application No. 201310400070.1.

\* cited by examiner

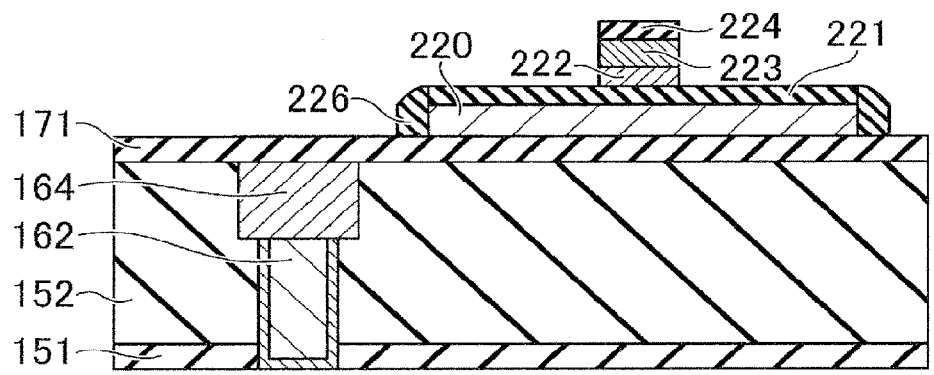
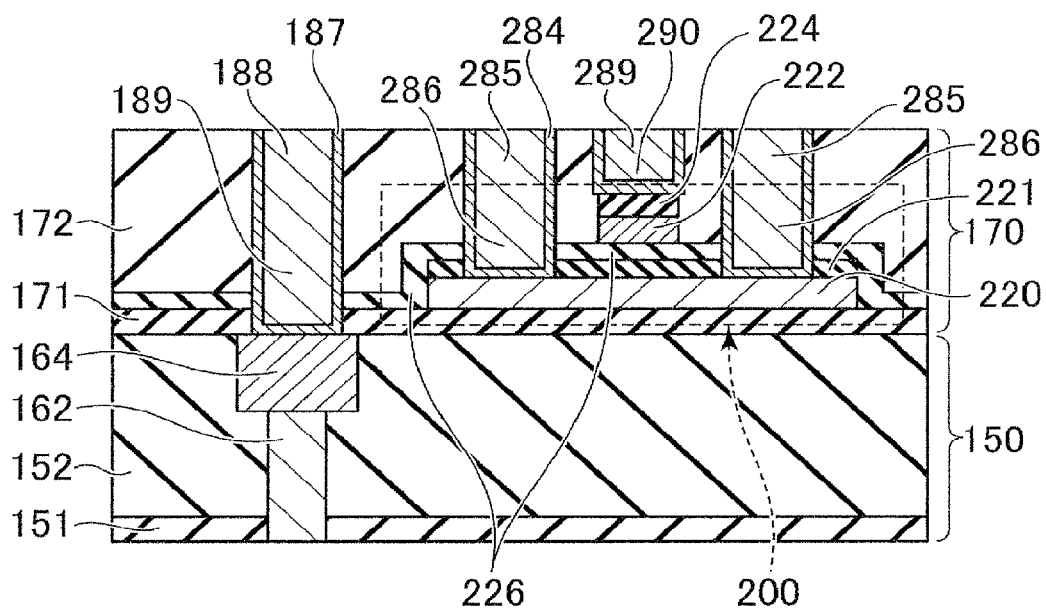

SEMICONDUCTOR DEVICE AND MANUFACTURING METHOD THEREOF

CROSS-REFERENCE TO RELATED APPLICATIONS

The disclosure of Japanese Patent Application No. 2012-195291 filed on Sep. 5, 2012 including the specification, drawings and abstract is incorporated herein by reference in its entirety.

BACKGROUND

The present invention relates to a semiconductor device, and can be used appropriately for a semiconductor device having, e.g., an active element (component) in a wiring layer.

A technique which provides an active element (component) in a wiring layer in a semiconductor device has been known. The active element (component) allows the function of such a semiconductor device to be changed without involving a change in the layout of semiconductor elements formed over a semiconductor substrate. Therefore, it is possible to manufacture a plurality of types of semiconductor devices having different functions using the semiconductor substrate, while keeping the same layout of the semiconductor elements over the semiconductor substrate. In this case, the manufacturing cost of the semiconductor devices can be reduced.

For example, a semiconductor device and a manufacturing method of the semiconductor device are disclosed in Japanese Unexamined Patent Publication No. 2010-141230 (corresponding US Patent Application Publication No. 2010/148171 (A1)). The semiconductor device includes a semiconductor substrate, a first wiring layer, a semiconductor layer, a gate insulating film, and a gate electrode. The first wiring layer includes an insulating layer formed over the semiconductor substrate, and first wires embedded in the surface of the insulating film. The semiconductor layer is located over the first wiring layer. The gate insulating film is located over or under the semiconductor layer. The gate electrode is located on the opposite side of the semiconductor layer via the gate insulating film. At this time, the semiconductor layer, the gate insulating film, and the gate electrode form a transistor as an active element (component). It is possible to use, e.g., one of the first wires as the gate electrode. It is also possible to use, e.g., a diffusion preventing film in the first wiring layer as the gate insulating film. In that case, the gate insulating film is formed under the semiconductor layer. The semiconductor device has a so-called bottom-gate element structure. The semiconductor device can further include a charge trap film, and a back-gate electrode over the semiconductor layer. In this case, the semiconductor device basically has a bottom-gate element structure, which is a double-gate element structure auxiliarily also including the gate opposing the bottom gate.

As a related-art technology, a technique for a semiconductor device is disclosed in Japanese Unexamined Patent Publication No. 2009-94494 (corresponding US Patent Application Publication No. 2009/078970 (A1)). In the semiconductor device, over a substrate having an insulating surface, a plurality of field effect transistors are stacked with respective interlayer insulating layers interposed therebetween. The semiconductor layers included in the plurality of field effect transistors are isolated from each other by the semiconductor substrate. The semiconductor layers are joined with the substrate having the foregoing insulating surface or with respective insulating layers provided over the foregoing interlayer insulating layers. The plurality of field effect transistors are each covered with an insulating film which gives a strain to each of the semiconductor layers.

A manufacturing method of a semiconductor device, the semiconductor device, an electrooptical device, and an electronic device are disclosed in Japanese Unexamined Patent Publication No. 2009-283819. In the manufacturing method of the semiconductor device, a plurality of semiconductor films are laminated. The manufacturing method of the semiconductor device includes five steps. The first step is the step of forming a plug electrode including carbon nanotube over the first semiconductor film. The second step is the step of forming an interlayer insulating film around the formed plug electrode. The third step is the step of planarizing the surface of the interlayer insulating film to expose the top portion of the plug electrode. The fourth step is the step of forming the amorphous second semiconductor film over the interlayer insulating film and the top portion of the plug electrode. The fifth step is the step of supplying energy to the amorphous second semiconductor film to cause the exposed plug electrode to function as a catalyst and crystallize the amorphous second semiconductor film.

As a related-art technology, an LSI is disclosed in Non-Patent Document 1 (2012 Symposium on VLSI Technology digest of Technical Papers, 123-124 (2012)) in which an oxide semiconductor layer is incorporated in a multilayer interconnect layer. Also, as a related-art technology, a CMOS circuit using an oxide semiconductor layer is disclosed in Non-Patent Document 2 (2011 Symposium on VLSI Technology Digest of Technical Papers, 120-121 (2011)). Also, as a related-art technology, a transistor device structure using an oxide semiconductor layer is disclosed in Non-Patent Document 3 (2011 IEEE International Electron Devices Meeting (IEDM), 155-158 (2011)).

RELATED ART DOCUMENTS

Patent Documents

Patent Document 1
Japanese Unexamined Patent Publication No. 2010-141230
[Patent Document 2]
Japanese Unexamined Patent Publication No. 2009-094494
[Patent Document 3]
Japanese Unexamined Patent Publication No. 2009-283819

Non-Patent Documents

Non-Patent Document 1
K. Kaneko et al., "Operation of Functional Circuit Elements using BEOL-Transistor with InGaZnO Channel for On-chip High/Low Voltage Bridging I/Os and High-Current Switches", 2012 Symposium on VLSI Technology Digest of Technical Papers, 123-124 (2012).
[Non-Patent Document 2]
K. Kaneko et al., "A Novel BEOL-Transistor (BETr) with InGaZnO Embedded in Cu-Interconnects for On-chip High Voltage I/Os in Standard CMOS LSIs", 2011 Symposium on VLSI Technology Digest of Technical Papers, 120-121 (2011).
[Non-Patent Document 3]
K. Kaneko et al., "High Reliable BEOL-Transistor with Oxygen-controlled InGaZnO and Gate/Drain Offset Design for High/Low Voltage Bridging I/O Operations", 2011 IEEE International Electron Devices Meeting (IEDM), 155-158 (2011).

SUMMARY

In Japanese Unexamined Patent Publication No. 2010-141230 mentioned above, the transistor as the in-wiring-layer active element (component) has the bottom-gate element structure or the double-gate element structure based on the bottom-gate element structure. This leads to several structural problems. For example, a gate electrode normally needs to have such a structure as to extend completely across a semiconductor layer. However, in providing the transistor of Japanese Unexamined Patent Publication No. 2010-141230 mentioned above with such a structure, the following problem is encountered. In the case of simultaneously forming the semiconductor layer and the gate insulating film and then forming the gate electrode, at the side surfaces of the ends of the semiconductor layer, the gate electrode undesirably comes in contact with the semiconductor layer. In the case of forming the semiconductor layer and then simultaneously forming the gate insulating film and the gate electrode also, the gate insulating film is thinned at the side surfaces of the ends of the semiconductor layer. As a result, it is highly possible that the gate electrode undesirably comes in contact with the semiconductor layer.

Other problems and novel features of the present invention will become apparent from a statement in the present specification and the accompanying drawings.

In an embodiment, a semiconductor element (active element (component)) having a top-gate element structure is provided in a wiring layer in a semiconductor device. Over side surfaces of a semiconductor layer in the semiconductor element (active element (component)), side wall films (sidewalls) other than an interlayer insulating film are provided.

According to the embodiment, there are the side wall films at positions where a gate electrode extends across the semiconductor layer. This can prevent contact between the gate electrode and the semiconductor layer and provide electrical isolation between the gate electrode and the semiconductor layer.

BRIEF DESCRIPTION OF THE DRAWINGS

FIG. 17H is a cross-sectional view showing the example of the manufacturing method of the semiconductor device according to the fifth embodiment;

FIG. 18 is a cross-sectional view showing an example of a configuration of a semiconductor device according to a sixth embodiment;

DETAILED DESCRIPTION

Hereinbelow, a description will be given of a semiconductor device and a manufacturing method of the semiconductor device according to each of embodiments with reference to the accompanying drawings.

First Embodiment

Figure 1A:
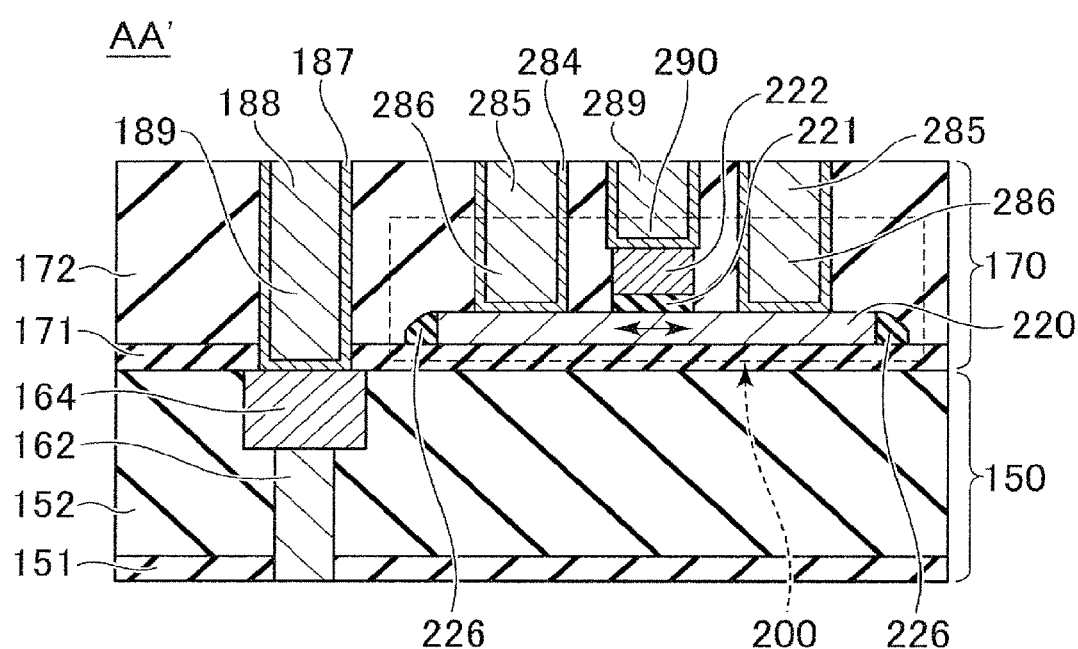
FIG. 1A is a cross-sectional view showing an example of a configuration of a semiconductor device according to a first embodiment.
Figure 1B:
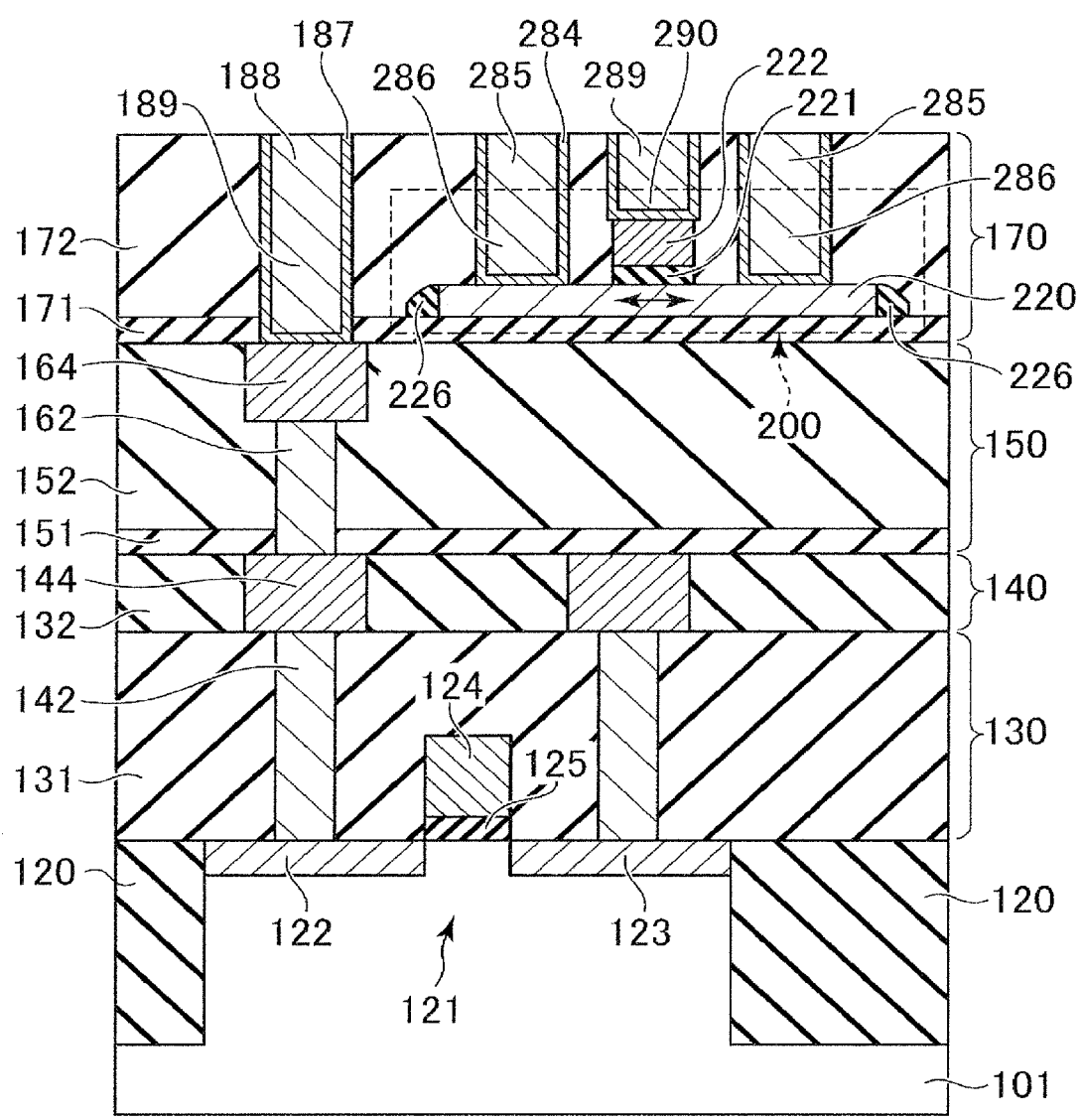
FIG. 1B is a cross-sectional view showing the example of the configuration of the semiconductor device according to the first embodiment.
Figure 2:
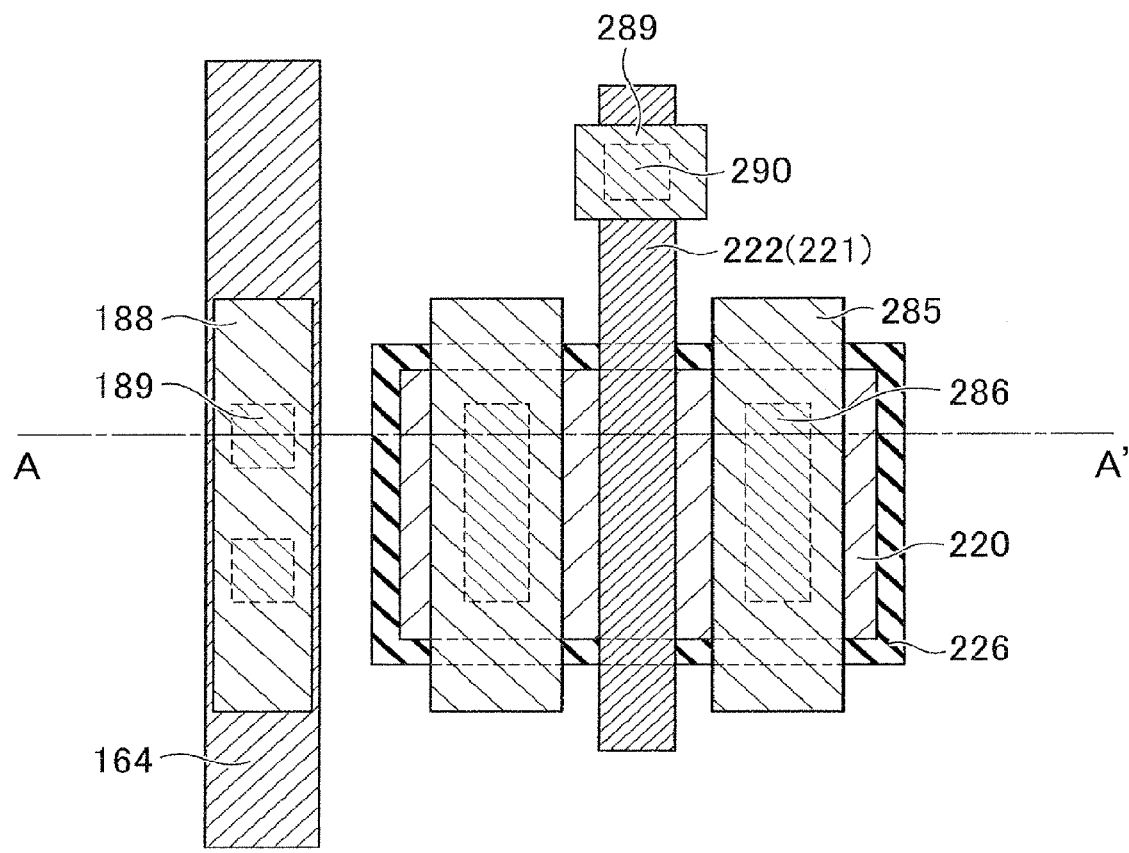
FIG. 2 is a plan view showing the example of the configuration of the semiconductor device according to the first embodiment.

A description will be given of a configuration of a semiconductor device according to the first embodiment. FIGS. 1A, 1B, and 2 are cross-sectional views and a plan view each showing an example of the configuration of the semiconductor device according to the present embodiment. Note that FIGS. 1A and 1B show cross sections each along the line A-A' of FIG. 2, and FIG. 1A shows the main portion of FIG. 1B.

A semiconductor device 100 of the present embodiment includes a first wiring layer 150, a second wiring layer 170, and a semiconductor element 200. The first wiring layer 150 has a first interlayer insulating layer 152, and a first wire 164 embedded in the first interlayer insulating layer 152. The second wiring layer 170 has a second interlayer insulating layer 172 formed above the first wiring layer 150, and second wires 188, 285, and 289 each embedded in the second interlayer insulating layer 172. The semiconductor element 200 is provided at least in the second wiring layer 170. The semiconductor element 200 includes a semiconductor layer 220, a gate insulating film 221, a gate electrode 222, and first side wall films 226. The semiconductor layer 220 is provided in the second wiring layer 170. The gate insulating film 221 is provided in contact with the semiconductor layer 220. The gate electrode 222 is provided on the opposite side of the semiconductor layer 220 via the gate insulating film 221. The first side wall films (226) are provided on the side surfaces of the semiconductor layer 220. It can be said that the semiconductor element 200 is an in-wiring-layer active element (component) (or in-wiring-layer functional element) provided in the wiring layer.

By providing such a configuration, even when the gate electrode 222 extends to the ends of the island-shaped semiconductor layer 220 in the semiconductor element 200, it is possible to prevent a phenomenon in which the gate electrode 222 comes in direct contact with the semiconductor layer 220 at the side surfaces of the ends of the semiconductor layer 220. This can stabilize the operation of the semiconductor element 200 and improve the reliability thereof. In particular, when the gate electrode 222 has such a structure (FIG. 2) as to extend across the island-shaped semiconductor layer 220, it is preferable to provide the foregoing configuration.

Also, in the semiconductor element 200, the gate electrode is not the first wire 164 of the first wiring layer 150, but the dedicated gate electrode 222 is provided. Therefore, the characteristics of the gate electrode are not limited to those of a wiring material. As the gate electrode 222, a metal material having desired characteristics can be used. As a result, there is no limit to the work function of the gate electrode, and a threshold voltage can be set.

Also, in the semiconductor element 200, the gate insulating film is not a diffusion preventing film (e.g., a Cu diffusion preventing film) in the second wiring layer 170, but the dedicated gate insulating film 221 is provided. Therefore, the characteristics of the gate insulating film are not limited to those of the material of the diffusion preventing film. As the gate electrode 222, a desired material having a desired film thickness can be used. As a result, an increase in gate capacitance (i.e., a characteristic improvement) can be easily achieved.

A further description will be given below of the semiconductor device 100.

The semiconductor device 100 includes a semiconductor substrate 101, a contact layer 130 provided over the semiconductor substrate 101, and a wiring layer 140 provided over the contact layer 130. The semiconductor substrate 101 includes a semiconductor element shown by way of example by a transistor or a capacitive element. In the example of the drawing, a transistor 121 is formed. The transistor 121 includes source/drain electrodes 122 and 123, a gate electrode 124, and a gate insulating film 125. The transistor 121 is isolated from other elements by an isolating layer 120. The contact layer 130 includes an interlayer insulating layer 131 provided over the semiconductor substrate 100, and contacts 142 embedded in the interlayer insulating layer 131. The wiring layer 140 includes an interlayer insulating layer 132 provided over the interlayer insulating layer 131, and wires 144 embedded in the interlayer insulating layer 132. The source/drain electrodes 122 and 123 of the transistor 121 are coupled to the wires 144 via the contacts 142.

The first wiring layer 150 includes a cap insulating layer 151 provided over the wiring layer 140, and a first interlayer insulating layer 152 provided over the cap insulating layer 151. The cap insulating layer 151 prevents diffusion of the wiring material (e.g., Cu) of the wires 144. The first wiring layer 150 further includes a via 162 and the first wire 164. The via 162 has the lower end thereof extending through the cap insulating layer 151 and coupled to the wire 144 and the upper end thereof coupled to the first wire 164. The first wire 164 is provided on the top surface side of the first interlayer insulating layer 152.

The second wiring layer 170 includes a cap insulating layer 171 provided over the first wiring layer 150, and a second interlayer insulating layer 172 provided over the cap insulating layer 171. The cap insulating layer 171 prevents diffusion of the wiring material (e.g., Cu) of the first wire 164. The second wiring layer 170 further includes a via 189 and the second wire 188. The via 189 has the lower end thereof extending through the cap insulating layer 171 and coupled to the first wire 164 and the upper end thereof coupled to the second wire 188. The second wire 188 is provided on the top surface side of the second interlayer insulating layer 172. In the example of the drawing, the via 189 and the second wire 188 in a dual damascene structure are shown.

The second wiring layer 170 further includes the island-shaped semiconductor layer 220 provided over the cap insulating layer 171, the gate insulating film 221 provided over the semiconductor layer 220, the gate electrode 222 provided over the gate insulating film 221, and the sidewalls 226 provided around the semiconductor layer 220. The semiconductor layer 220 functions as a channel. The gate electrode 222, the gate insulating film 221, and the semiconductor layer 220 form the semiconductor element 200 as the transistor. The gate electrode 222 has such a structure as to extend completely across the island-shaped semiconductor layer 220. Consequently, the gate electrode 222 may come in contact with the side surfaces of the ends of the semiconductor layer 220 at the end surfaces of the semiconductor layer 220. However, since the side surfaces of the semiconductor layer 222 are provided with the sidewalls 226, the phenomenon in which the gate electrode 222 comes in contact with the semiconductor layer 220 can be prevented.

The second wiring layer 170 further includes a via 290 and the second wire 289 which are coupled to the gate electrode 222. The via 290 has the lower end thereof coupled to the end portion (end portion distant from the semiconductor layer 220) of the gate electrode 222 and the upper end thereof coupled to the second wire 289. The second wire 289 is provided on the top surface side of the second interlayer insulating layer 172. In the example of the drawing, the via 290 and the second wire 289 in a dual damascene structure are shown. The second wiring layer 170 further includes contacts 286 as source/drain electrodes and the second wires 285. The contacts 286 have the lower ends thereof coupled to the semiconductor layer 220 and the upper ends thereof coupled to the second wires 285. The second wires 285 are provided on the top surface side of the second interlayer insulating layer 172. In the example of the drawing, the contacts 286 and the second wires 285 in a dual damascene structure are shown.

In other words, in the semiconductor device 100 according to the present embodiment, the semiconductor element 200 uses the semiconductor layer (oxide semiconductor) 220 formed over the cap insulating layer (e.g., Cu diffusion preventing layer) 171 provided over the first wiring layer (e.g., Cu wiring layer) 150 as the channel. The semiconductor layer 220 is patterned into an island shape and, over the end surfaces (side surfaces) thereof, the sidewalls 226 are formed. Over the semiconductor layer 220, the gate insulating film 221 and the gate electrode 222 that have been patterned are disposed. The vias coupling the first wiring layer (Cu wiring layer) 150 to the second wires (or pad electrodes) 285 are used as the source/drain electrodes (contacts 286) of the semiconductor element 200. The source/drain electrodes (contacts 286) are disposed on both sides of the gate insulating film 221 and the gate electrode 222. The gate electrode 222 has a shape which extends over and across the semiconductor layer 220. However, since the side surfaces of the semiconductor layer 220 are protected by the sidewalls 226, the gate electrode 222 is kept from coming in contact with the semiconductor layer 220.

Next, a description will be given of the manufacturing method of the semiconductor device according to the present embodiment. FIGS. 3A to 3J are cross-sectional views each showing an example of the manufacturing method of the semiconductor device according to the present embodiment. Each of the drawings corresponds to a cross section along the line A-A' of FIG. 2. Note that, in FIGS. 3A to 3J, the illustration of the semiconductor substrate 101, the contact layer 130, and the wiring layer 140 is omitted.

Figure 3A:
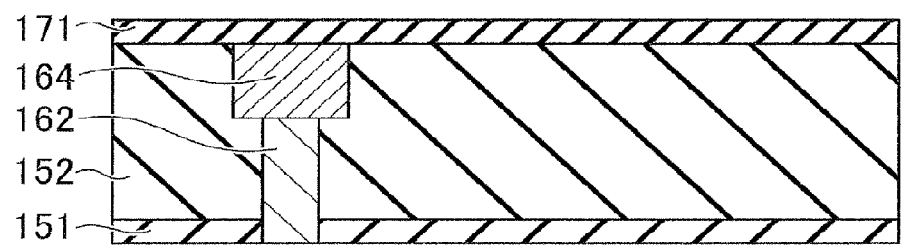
FIG. 3A is a cross-sectional view showing an example of a manufacturing method of the semiconductor device according to the first embodiment.
Figure 3B:
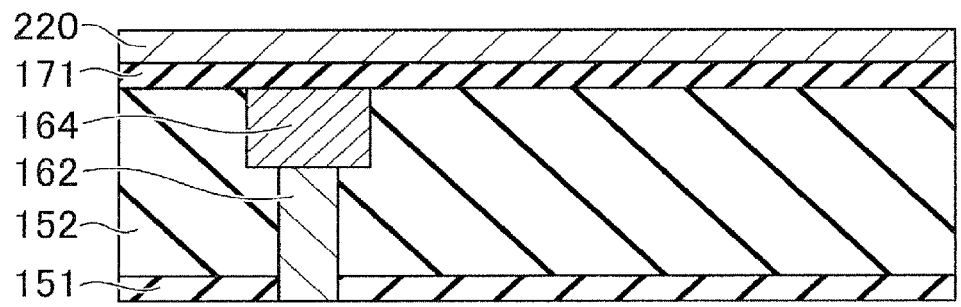
FIG. 3B is a cross-sectional view showing the example of the manufacturing method of the semiconductor device according to the first embodiment.
Figure 3C:
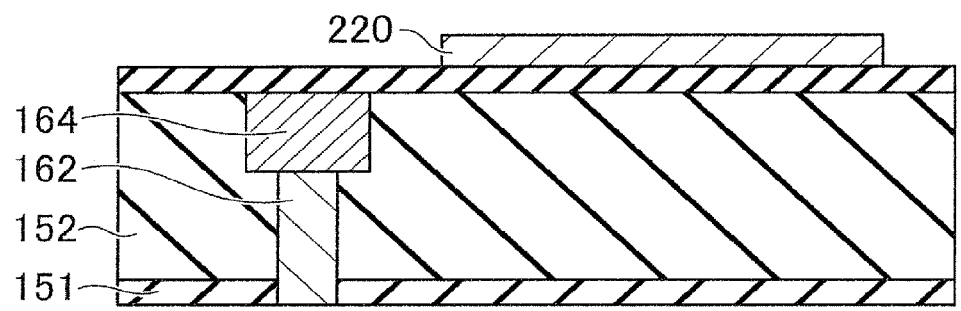
FIG. 3C is a cross-sectional view showing the example of the manufacturing method of the semiconductor device according to the first embodiment.
Figure 3D:
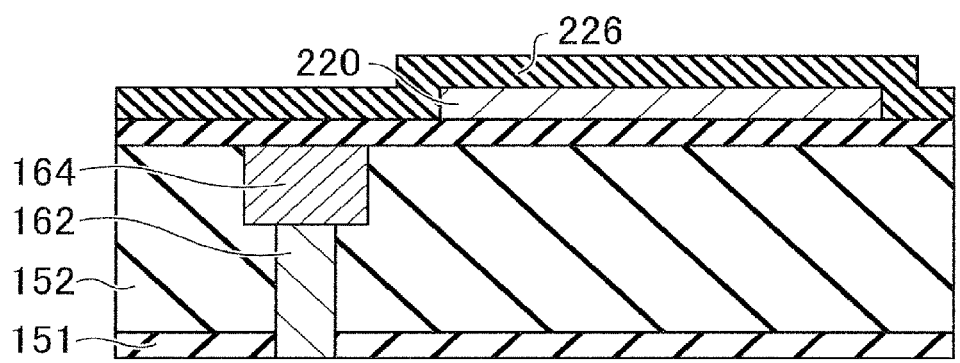
FIG. 3D is a cross-sectional view showing the example of the manufacturing method of the semiconductor device according to the first embodiment.
Figure 3E:
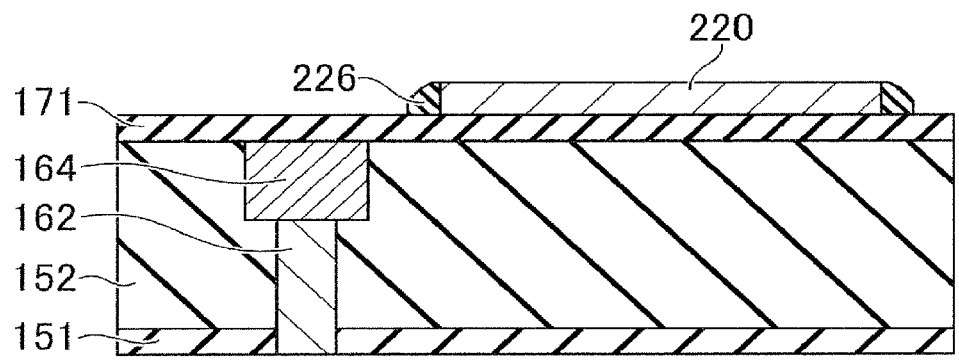
FIG. 3E is a cross-sectional view showing the example of the manufacturing method of the semiconductor device according to the first embodiment.
Figure 3F:
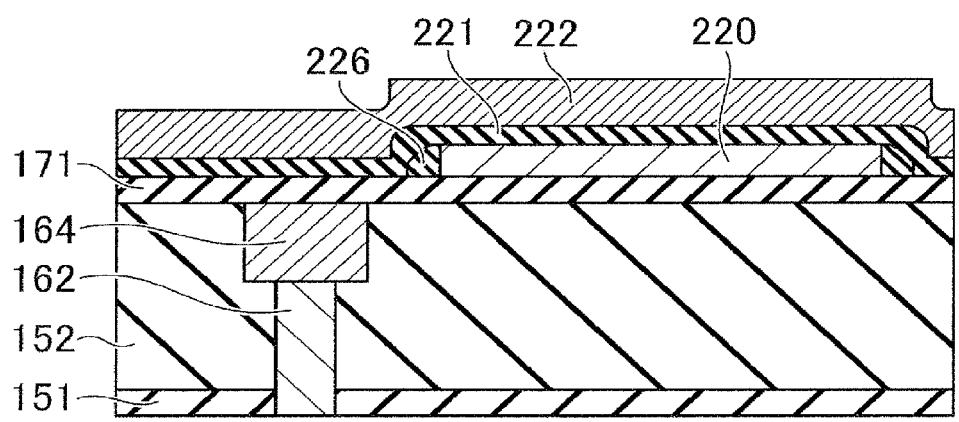
FIG. 3F is a cross-sectional view showing the example of the manufacturing method of the semiconductor device according to the first embodiment.
Figure 3G:
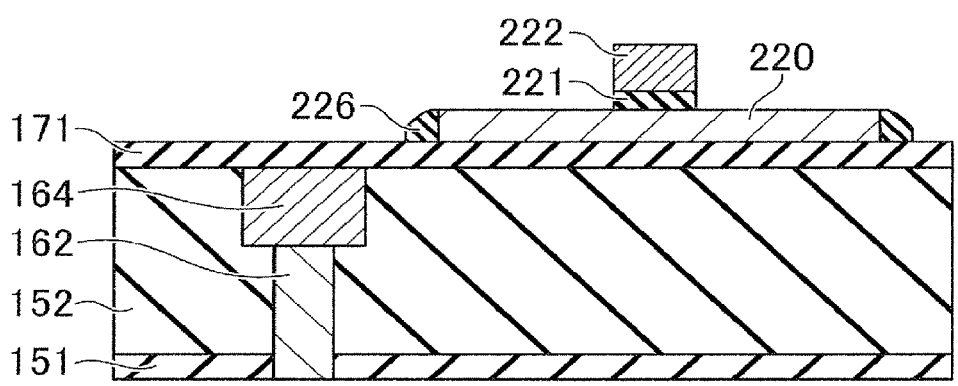
FIG. 3G is a cross-sectional view showing the example of the manufacturing method of the semiconductor device according to the first embodiment.

First, as shown in FIGS. 3A to 3C, the step of forming the island-shaped semiconductor layer 220 over the wiring layers (150 and 171) having the first wire 164 is performed. Then, as shown in FIG. 3D, the step of forming the insulating film (226) so as to cover the semiconductor layer 220 and the wiring layers (150 and 170) therewith is performed. Subsequently, as shown in FIG. 3E, the step of etching back the insulating film (226) to form the sidewalls 226 covering the side surfaces of the semiconductor layer 220 is performed. Thereafter, as shown in FIGS. 3F to 3G, the step of successively forming the first gate insulating film 221 and the gate electrode 222 over the semiconductor layer 220 is performed. At this time, the gate electrode 222 is formed over the first gate insulating film 221 so as to extend over the semiconductor layer 220 and the sidewalls 226.

In the present embodiment, as shown in the steps of FIGS. 3D and 3E, the sidewalls 226 are formed over the side surfaces of the island-shaped semiconductor layer 220. Since the sidewalls 226 cover the exposed side surfaces of the semiconductor layer 220, the side surfaces of the semiconductor layer 220 are not affected by the subsequent steps. Specifically, the sidewalls 226 physically/chemically/electrically isolate/protect the semiconductor layer 220 from the gate electrode 222, which is formed subsequently. This allows the foregoing isolating/protecting function of the sidewalls 226 to prevent a phenomenon such as the contact or reaction of the gate electrode 222 with or to the semiconductor layer 220. As a result, it is possible to stabilize the operation of the semiconductor element 200 and improve the reliability thereof.

A further description will be given below of the manufacturing method of the semiconductor device 100 according to the present embodiment.

First, as shown in FIG. 1, the semiconductor substrate 101 is formed with the isolating layer 120. Then, over the semiconductor substrate 101, e.g., the transistor 121 is formed as the semiconductor element. Subsequently, the contact layer 130 (including the interlayer insulating layer 131 and the contact 142), and the wiring layer 140 (including the interlayer insulating layer 132 and the wires (copper (Cu) wires) 144) are formed. For the foregoing steps, a conventionally known method can be used.

Next, as shown in FIG. 3A, over the wiring layer 140 (not shown), the cap layer 151 for preventing diffusion of copper (Cu) and the first interlayer insulating layer 152 are deposited in this order. Examples of the material of the cap insulating layer 151 include silicon nitride (SiN) and silicon carbonitride (SiCN). Examples of the material of the first interlayer insulating layer 152 include silicon dioxide ($SiO_2$). Subsequently, in the first interlayer insulating layer 152, the via 162 and the first wire 164 are embedded using a single damascene method or a dual damascene method. In this manner, the first wiring layer 150 is formed. Examples of the material of the via 162 and the first wire 164 include copper (Cu). Thereafter, the cap insulating layer 171 is formed so as to cover the first interlayer insulating film 152 and the first wire 164. Examples of the material of the cap insulating layer 171 include silicon nitride (SiN) and silicon carbonitride (SiCN). The film thickness thereof is about 10 to 50 nm. The foregoing steps are performed by the same method as used to form a typical semiconductor device having a copper (Cu) wiring layer.

Next, as shown in FIG. 3B, over the cap insulating layer 171, the semiconductor layer 220 serving as the channel of the semiconductor element 200 is formed by, e.g., a sputtering method. Preferred examples of the material of the channel include an InGaZnO (IGZO) layer, an InZnO layer, a ZnO layer, a ZnAlO layer, a ZnCuO layer, an NiO layer, a SnO layer, a $SnO_2$ layer, a CuO layer, a $Cu_2O$ layer, a $Ta_2O_5$ layer, a $TiO_2$ layer, a laminated structure of any two or more of the foregoing layers, and a laminated structure of any one or more of the foregoing layers and another material. Each of the foregoing layers can be formed at a relatively low temperature which does not affect the properties of the wiring layer. The film thickness thereof is about 10 to 50 nm. Subsequently, as shown in FIG. 3C, the semiconductor layer 220 is patterned using typical photolithography and dry etching. As a result, the island-shaped semiconductor layer 220 is formed. Around the semiconductor layer 220, the cap insulating layer 171 is exposed.

Next, as shown in FIG. 3D, over the semiconductor layer 220 and the cap insulating layer 171, an insulating film (hereinafter referred to also as the covering insulating film 226) serving as the sidewalls 226 is formed by, e.g., a CVD method. Examples of the covering insulating film 226 (insulating film serving as the sidewalls 226) include silicon dioxide ($SiO_2$) and silicon nitride (SiN). The film thickness thereof is about 20 to 200 nm. The covering insulating film 226 covers not only the top surfaces of the cap insulating layer 171 and the semiconductor layer 220, but also the exposed side surfaces of the semiconductor layer 220.

Next, as shown in FIG. 3E, the covering insulating film 226 is subjected to a full etch-back process. As a result, the covering insulating film 226 is removed from the top surfaces of the cap insulating layer 171 and the semiconductor layer 220, while the sidewalls 226 are formed over the side surfaces of the semiconductor layer 220. The sidewalls 226 cover and protect the exposed side surfaces of the island-shaped semiconductor layer 220 such that the semiconductor layer 220 is not affected by another film or process.

Next, as shown in FIG. 3F, over the top surfaces of the cap insulating layer 171, the sidewalls 226, and the semiconductor layer 220, the gate insulating film 221 and the gate electrode 222 are deposited by, e.g., a sputtering method. In this case, the gate insulating film 221 covers the semiconductor layer 220 and the sidewalls 226. Here, the side surfaces of the semiconductor layer 220 are covered with the sidewalls 226 and do not show steep steps. Accordingly, the gate insulating film 221 is uninterruptedly continued from over the semiconductor layer 220 to the cap insulating layer 171. As a result, the side surfaces of the ends of the semiconductor layer 220 are protected not only with the sidewalls 266, but also with the gate insulating film 221. This more reliably prevents contact between the side surfaces of the ends of the semiconductor layer 220 and the gate electrode 222.

Examples of the material of the gate insulating film 221 include silicon oxide ($SiO_2$), silicon nitride ($SiN_x$), and an oxide of a metal such as Hf, Zr, Al, or Ta. Alternatively, a combination of the foregoing materials may also be used. The gate insulating film 221 made of such a material may also include nitrogen, carbon, or the like in addition to a metal and oxygen. The film thickness thereof is preferably about 0.5 to 50 nm. Thus, the semiconductor element 200 is provided with the dedicated gate insulating film 221. This allows a desired material to be used as the gate insulating film having a desired film thickness. As a result, an increase in gate capacitance (i.e., a characteristic improvement) and the like can be easily achieved.

On the other hand, examples of the material of the gate electrode 222 include titanium (Ti), titanium nitride (TiN), aluminum (Al), cobalt (Co), molybdenum (Mo), tantalum (Ta), tantalum nitride (TaN), tungsten (W), and tungsten nitride (WN). Alternatively, any of the foregoing materials in which carbon (C) or oxygen (O) is mixed or a laminated structure of any of the foregoing materials and another metal or the like may also be used. The film thickness thereof is preferably about 5 to 100 nm. Thus, the semiconductor element 200 is provided with the dedicated gate electrode 222. This allows a desired metal material to be used for the gate electrode. The material of the gate electrode 222 determines the effective work function of the semiconductor element (in-wiring-layer active element (component)) 200. As a result, there is no limit to the work function of the gate electrode to allow the threshold voltage to be set.

Next, as shown in FIG. 3G, using typical photolithography and dry etching, the gate electrode 222 and the gate insulating film 221 are patterned. By the patterning, a gate electrode shape as shown in the plan view of FIG. 2 is defined. That is, the gate electrode 222 and the gate insulating film 221 are patterned into such a gate electrode shape as to extend completely across (extend over) the semiconductor layer 220 (including the sidewalls 226) (there is also a form in which the gate insulating film 221 extends not completely across the semiconductor layer 220). At this time, as described above, the side surfaces of the ends of the semiconductor layer 220 are protected not only with the sidewalls 266, but also with the gate insulating film 221. This more reliably prevents contact between the side surfaces of the ends of the semiconductor layer 220 and the gate electrode 222.

Figure 3H:
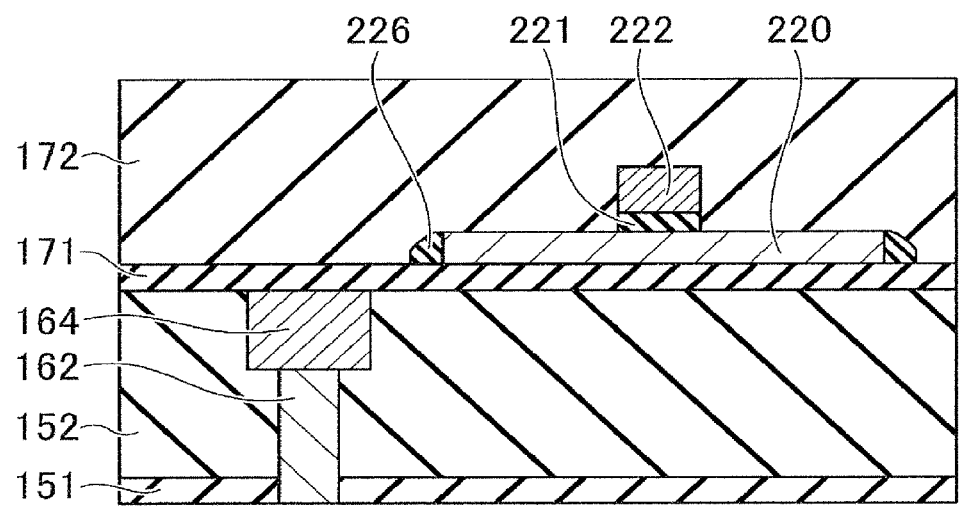
FIG. 3H is a cross-sectional view showing the example of the manufacturing method of the semiconductor device according to the first embodiment.
Figure 3I:
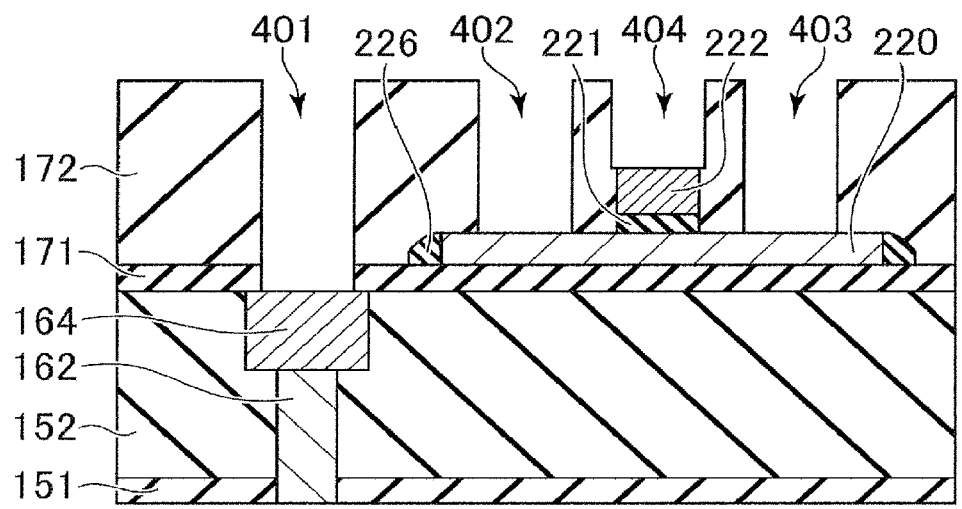
FIG. 3I is a cross-sectional view showing the example of the manufacturing method of the semiconductor device according to the first embodiment.
Figure 3J:
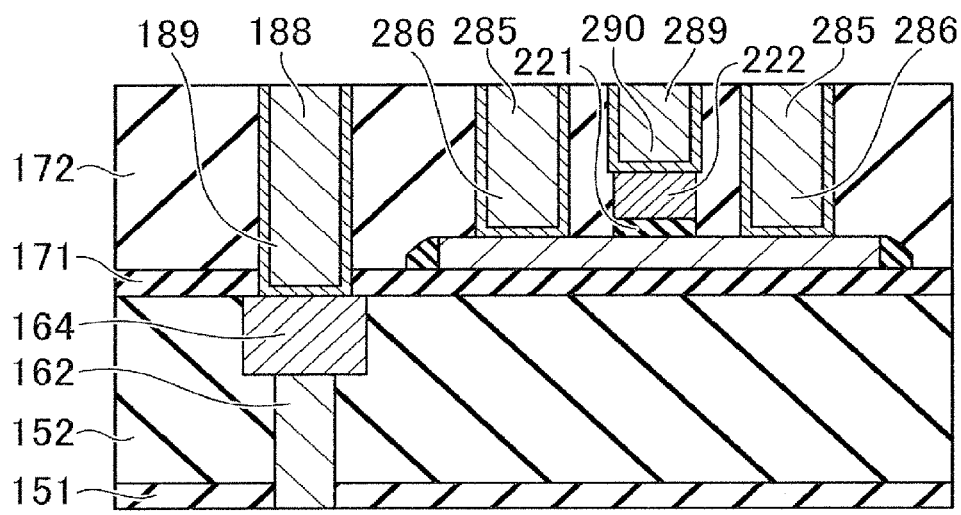
FIG. 3J is a cross-sectional view showing the example of the manufacturing method of the semiconductor device according to the first embodiment.

Next, as shown in FIG. 3H, the second interlayer insulating layer 172 is formed so as to cover the cap insulating layer 171, the sidewalls 226, the semiconductor layer 220, the gate insulating film 221, and the gate electrode 222. The second interlayer insulating layer 172 is a low-dielectric-constant insulating layer having a dielectric constant lower than that of silicon dioxide. Examples of the material of the second interlayer insulating layer 172 include a carbon-containing film such as a SiOC(H) film or SiLK (registered trademark). Subsequently, as shown in FIG. 3I, in the second interlayer insulating layer 172, holes 401 to 404 for the vias, the contact, and the wires are opened. Thereafter, as shown in FIG. 3J, the via 189, the contacts (source/drain electrodes) 286, the via 290 for the gate electrode, and the second wires 188, 285, and 289 are embedded using a single damascene method or a dual damascene method. As a result, the second wiring layer 170 is formed. Examples of the material of the vias 189 and 290, the contacts 286, and the second wires 188, 285, and 289 include copper (Cu) using tantalum (Ta)/tantalum nitride (TaN) or titanium (Ti)/titanium nitride (TiN) as a barrier film. At this time, the source/drain electrodes (contacts 286) are provided over the channel (semiconductor layer 220) after the formation of the channel (semiconductor 220). This allows the contact resistance between the channel and the source/drain electrode to be sufficiently reduced.

By the foregoing steps, the semiconductor device 100 according to the present embodiment is manufactured.

In the present embodiment, as the material of the gate electrode of the semiconductor element 200, not the same material as that of wiring, but a dedicated material can be used. This solves the problem that the work function of the gate electrode is fixed when the same material as that of wiring is used and allows any work function to be selected for the gate electrode. As a result, the threshold voltage of the semiconductor element 200 can be set to allow the in-wiring-layer active element (component) to be set in each of a normally-on mode and a normally-off mode.

Also, in the present embodiment, as the gate insulating film of the semiconductor element 200, not the Cu diffusion preventing layer, but a dedicated insulating film can be used. This solves the problem that, when the Cu diffusion preventing layer is used, the gate insulating film is excessively thickened to also satisfy a Cu diffusion barrier function, and allows the thickness of the gate insulating film to be set irrelevantly to the Cu diffusion barrier function. As a result, it becomes possible to further reduce the thickness of the gate insulating film and significantly increase the gate capacitance.

Also in the present embodiment, over the side surfaces of the ends of the semiconductor element 200, the sidewalls 226 are provided. By the function of the sidewalls 226, the semiconductor layer 220 and the gate electrode 222 can be electrically and physically isolated. This solves the problem that a short circuit occurs between the end surface of the semiconductor layer 220 and the gate electrode 222, and allows a significant improvement in the production yield of the device.

First Variation

Figure 4:
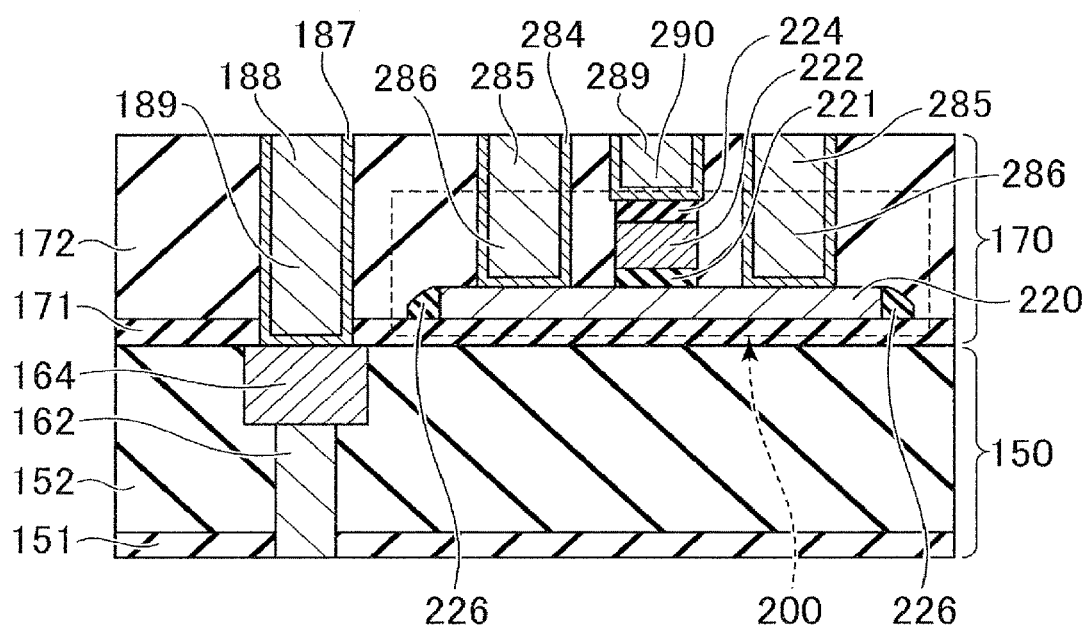
FIG. 4 is a cross-sectional view showing a first modification of the configuration of the semiconductor device according to the first embodiment.

FIG. 4 is a cross-sectional view showing a first variation of the configuration of the semiconductor device according to the present embodiment. When compared with the case shown in FIG. 1A, the case shown in FIG. 4 is different therefrom in that a hard mask 224 is provided over the gate electrode 222. Hereinbelow, a description will be given mainly of the difference therebetween.

In the present variation, the hard mask 224 is used for the processing of the gate electrode 222 and prevents direct contact between a resist and the gate electrode 222. Since the hard mask 224 is processed using the resist, ashing is performed, and then the gate electrode 222 is processed using the hard mask 224, the gate electrode is not exposed during the ashing of the resist. Accordingly, it is possible to avoid modification of the electrode such as the oxidation thereof.

To obtain such a configuration, in the step of FIG. 3F in the foregoing manufacturing method of the semiconductor device shown in FIGS. 3A to 3J, over the top surfaces of the cap insulating layer 171, the sidewalls 226, and the semiconductor layer 220, not only the gate insulating film 221 and the gate electrode 222, but also the hard mask 224 may further be deposited appropriately by, e.g., a plasma CVD method. Examples of the material of the hard mask 224 include insulating films of silicon dioxide ($SiO_2$), silicon oxycarbide (SiOC), carbon (C), silicon nitride (SiN), and the like and a combination thereof. The film thickness thereof is preferably, e.g., about 30 to 200 nm.

In the case of the present modification also, the same effect as obtained in the case shown in FIGS. 1A, 1B, and 2 can be obtained.

In addition, by the effect of the hard mask 224, it is possible to excellently provide contact with the gate electrode 222.

Second Modification

Figure 5A:
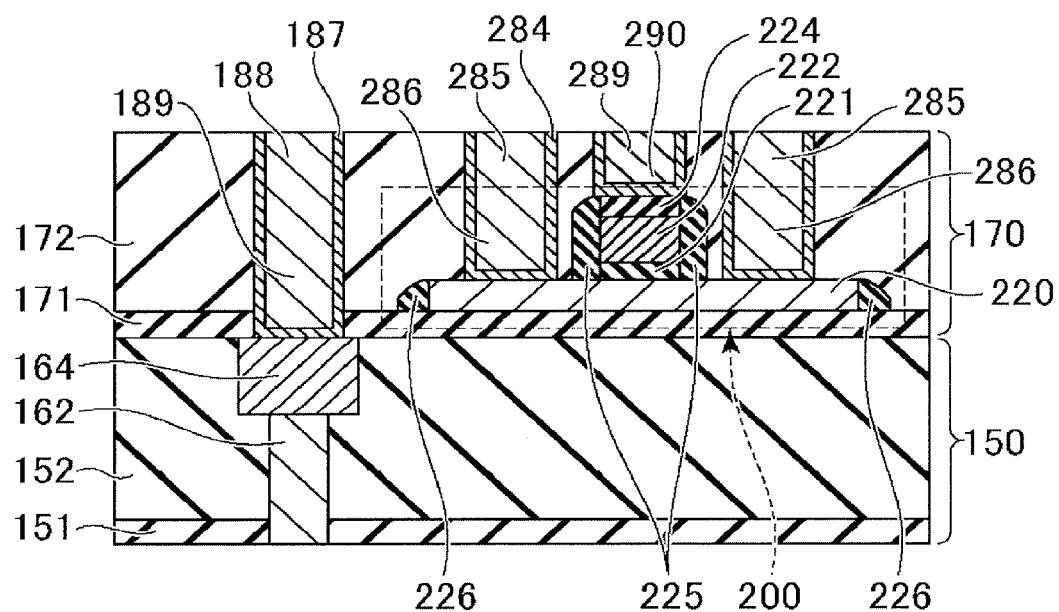
FIG. 5A is a cross-sectional view showing a second modification of the configuration of the semiconductor device according to the first embodiment.

FIG. 5A is a cross-sectional view showing a second modification of the configuration of the semiconductor device according to the present embodiment. When compared with the case shown in FIG. 4, the case shown in FIG. 5A is different therefrom in that sidewalls 225 are provided over the both side surfaces of a laminated structure of the gate insulating film 221, the gate electrode 222, and the hard mask 224. Hereinbelow, a description will be given mainly of the difference therebetween.

In the present variation, when the contacts (source/drain electrodes) 286 are formed, the sidewalls 225 prevents contact between the contacts (source/drain electrodes) 286 and the gate electrode 222. That is, when the holes 402 and 403 for the contacts 286 are formed, even if the holes 402 and 403 come excessively close to the gate electrode 222, contact with the gate electrode 222 can be prevented. As a result, the contacts 286 can be formed at proper positions.

To obtain such a structure, in the foregoing manufacturing method (method to which the alteration according to the first modification described above has been added) of the semiconductor device shown in FIGS. 3A to 3J, between the steps of FIGS. 3G and 3H, the following steps may be added appropriately. First, in the same manner as in the step of FIG. 3D, an insulating film (hereinafter referred to also as a covering insulating film 225) serving as the sidewalls 225 is formed by, e.g., a CVD method so as to cover the cap insulating layer 171, the sidewalls 226, the semiconductor layer 220, the gate insulating film 221, the gate electrode 222, and the hard mask 224. Examples of the material of the covering insulating film 225 (insulating film serving as the sidewalls 225) include silicon dioxide ($SiO_2$) and silicon nitride (SiN). The thickness thereof is about 10 to 200 nm. Then, in the same manner as in the step of FIG. 3E, the covering insulating film 225 is subjected to a full etch-back process. As a result, the covering insulating film 225 is removed from the top surfaces of the cap insulating layer 171, the sidewalls 226, and the semiconductor layer 220, while the sidewalls 225 are formed over the both side surfaces of the hard mask 224, the gate electrode 222, and the gate insulating film 221.

In the case shown in the present modification also, the same effects as obtained in the case shown in FIG. 4 can be obtained.

In addition, by the effect of the sidewalls 225, it is possible to prevent contact between the contacts (source/drain electrodes) 286 and the gate electrode 222 and form the contacts 286 at proper positions.

Third Modification

Figure 5B:
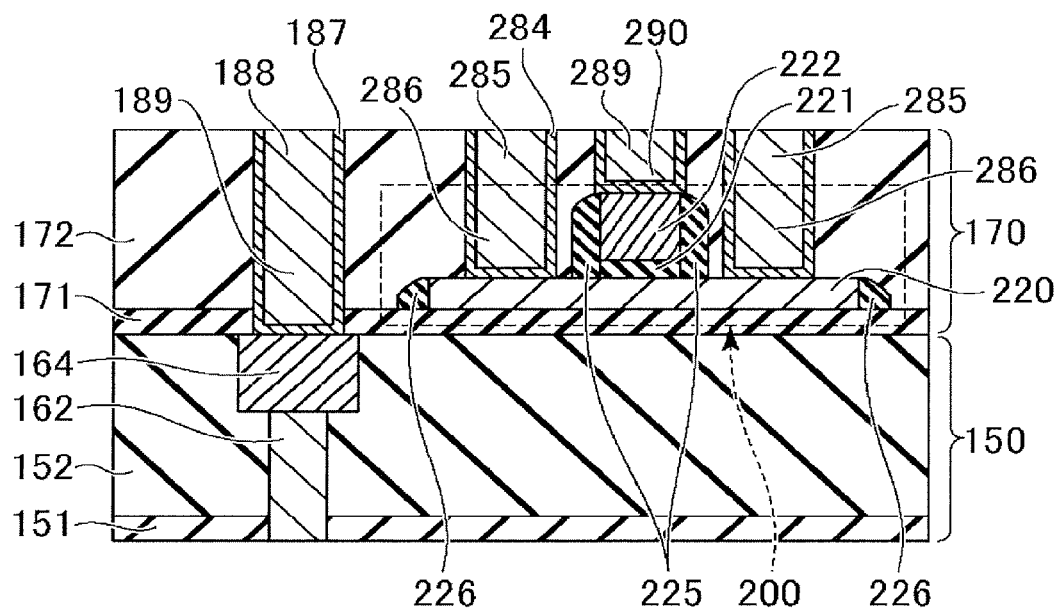
FIG. 5B is a cross-sectional view showing a third modification of the configuration of the semiconductor device according to the first embodiment.

FIG. 5B is a cross-sectional view showing a third modification of the configuration of the semiconductor device according to the present embodiment. When compared with the case shown in FIG. 5A, the case shown in FIG. 5B is different therefrom in that the hard mask 224 is not provided over the gate electrode 222. In a manner, the relationship between FIGS. 5A and 5B is the same as the relationship between FIGS. 1A and 4. In the case shown in FIG. 5B also, the same effects as achieved in the case shown in FIG. 5A (except for the effect of the hard mask 224) can be achieved.

Second Embodiment

Figure 6A:
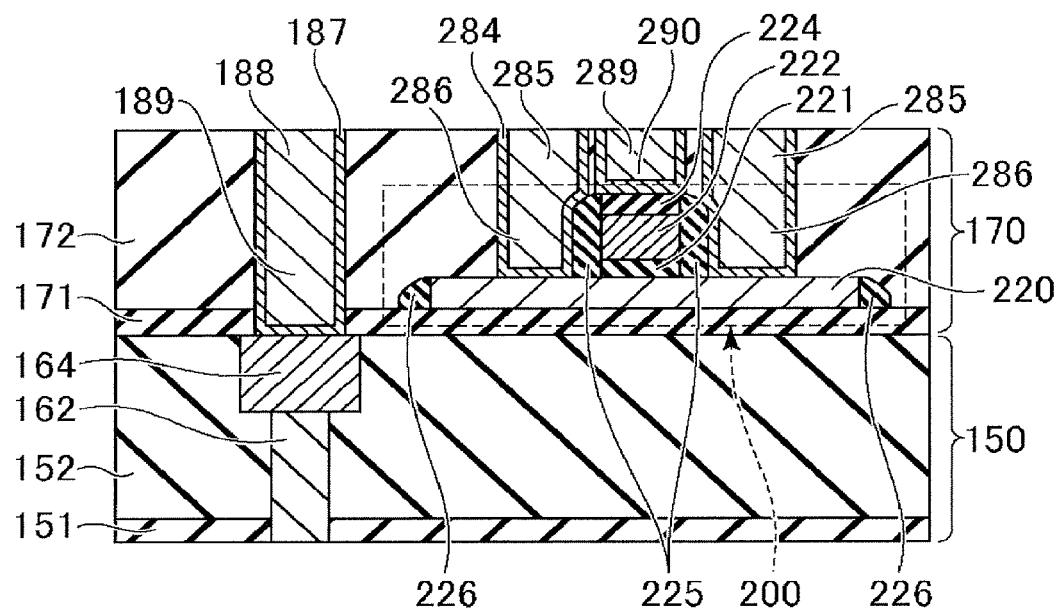
FIG. 6A is a cross-sectional view showing an example of a configuration of a semiconductor device according to a second embodiment.
Figure 7:
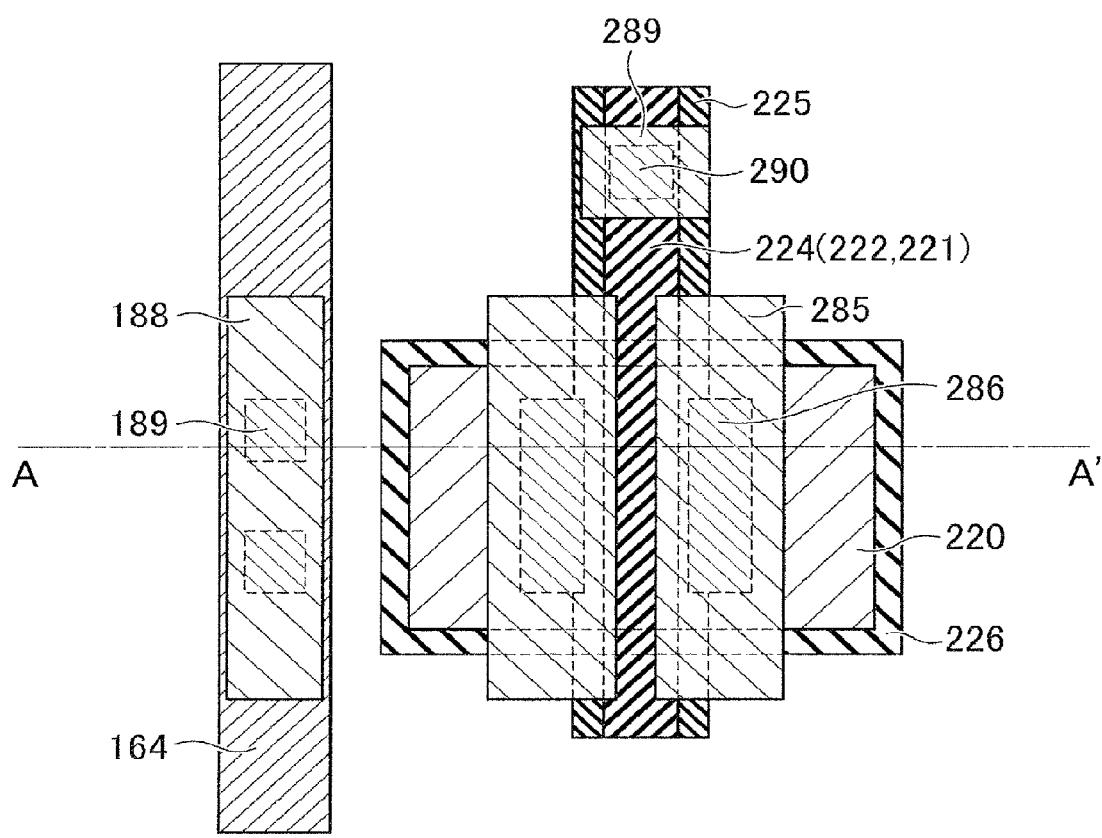
FIG. 7 is a plan view showing the example of the configuration of the semiconductor device according to the second embodiment.

A description will be given of a configuration of a semiconductor device according to the second embodiment. FIG. 6A is a cross-sectional view showing an example of the configuration of the semiconductor device according to the present embodiment. FIG. 7 is a plan view showing an example of the configuration of the semiconductor device according to the present embodiment. Note that FIG. 6A is a cross section along the line A-A' of FIG. 7. The semiconductor device of the present embodiment is different from the semiconductor device particularly in the second modification (FIG. 5A) of the first embodiment in that each of the contacts (source/drain electrodes) 286 is provided in a self-aligned manner. Hereinbelow, a description will be given mainly of the difference therebetween.

In the present embodiment, over the both side surfaces of the laminated structure of the hard mask 224, the gate electrode 222, and the gate insulating film 221, the sidewalls 225 are provided. The contacts (source/drain electrodes of the semiconductor element 200) 286 are provided in such a manner as to come in contact with the sidewalls 225. The gate electrode 222 has a shape which extends across the semiconductor layer 220 and the sidewalls 226. By the sidewalls 225, the positions of the contacts 286 are defined, and therefore the contacts 286 can be formed at proper positions.

Figure 6B:
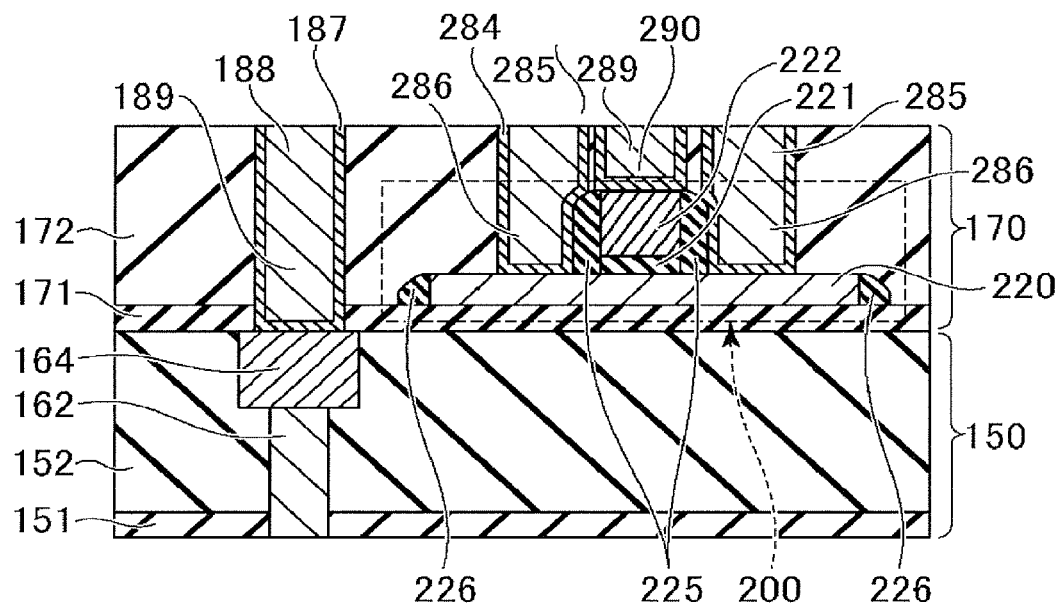
FIG. 6B is a cross-sectional view showing another example of the configuration of the semiconductor device according to the second embodiment.

In the semiconductor device according the present embodiment, as according to, e.g., the relationship between FIGS. 5A and 5B, the hard mask 224 need not be provided (or may be provided) over the gate electrode 222. FIG. 6B is a cross-sectional view showing another example of the configuration of the semiconductor device according to the present embodiment. When compared with the case shown in FIG. 6A, the case shown in FIG. 6B is different therefrom in that the hard mask 224 is not provided over the gate electrode 222. In a manner, the relationship between FIGS. 6B and 6A is the same as the relationship between FIGS. 5B and 5A. In the case shown in FIG. 6B also, the same effects (except for the effect of the hard mask 224) as shown in FIG. 6A can be achieved.

Such a configuration as shown in FIG. 6A can be implemented by the following steps. FIGS. 8A to 8E are cross-sectional views showing an example of a manufacturing method of the semiconductor device according to the present embodiment. Each of the drawings corresponds to a cross section along the line A-A' of FIG. 7. Note that, in FIGS. 8A to 8E, the illustration of the semiconductor substrate 101, the contact layer 130, and the wiring layer 140 is omitted.

First, after the steps in the manufacturing method of the semiconductor device of the first embodiment shown in FIGS. 3A to 3E, in the step of FIG. 3F, not only the gate insulating film 221 and the gate electrode 222, but also the hard mask 224 is further deposited by, e.g., a plasma CVD method over the top surfaces of the cap insulating layer 171, the sidewalls 226, and the semiconductor layer 220. Examples of the material of the hard mask 224 include insulating films of silicon dioxide ($SiO_2$), silicon oxycarbide (SiOC), carbon (C), silicon nitride (SiN), and the like and a combination thereof. The film thickness thereof is preferably about 30 to 200 nm. Then, in the same manner as in the step shown in FIG. 3G, using typical photolithography and dry etching, the hard mask 224, the gate electrode 222, and the gate insulating film 221 are patterned. By the patterning, a gate electrode shape as shown in the plan view of FIG. 7 is defined. That is, the hard mask 224, the gate electrode 222, and the gate insulating film 221 are patterned into the gate electrode shape which extends completely across (extends over) the semiconductor layer 220 (including the sidewalls 226).

Figure 8A:
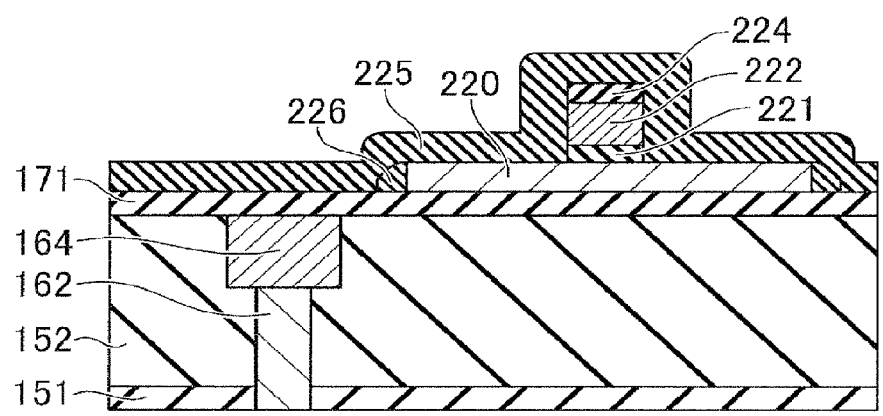
FIG. 8A is a cross-sectional view showing an example of a manufacturing method of the semiconductor device according to the second embodiment.

Next, as shown in FIG. 8A, the insulating film (hereinafter referred to also as the covering insulating film 225) serving as the sidewalls 225 is formed by, e.g., a CVD method so as to cover the cap insulating layer 171, the sidewalls 226, the semiconductor layer 220, the gate insulating film 221, the gate electrode 222, and the hard mask 224. Examples of the material of the covering insulating film 225 (insulating film serving as the sidewalls 225) include silicon dioxide ($SiO_2$) and silicon nitride (SiN). The thickness thereof is about 10 to 200 nm.

Figure 8B:
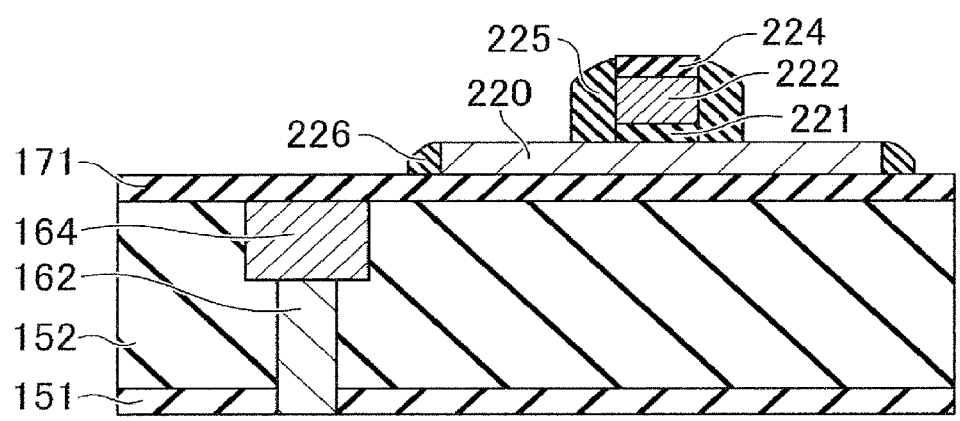
FIG. 8B is a cross-sectional view showing the example of the manufacturing method of the semiconductor device according to the second embodiment.

Next, as shown in FIG. 8B, the covering insulating film 225 is subjected to a full etch-back process. As a result, the covering insulating film 225 is removed from the top surfaces of the cap insulating layer 171, the sidewalls 226, and the semiconductor layer 220, while the sidewalls 225 are formed over the both side surfaces of the hard mask 224, the gate electrode 222, and the gate insulating film 221.

Figure 8C:
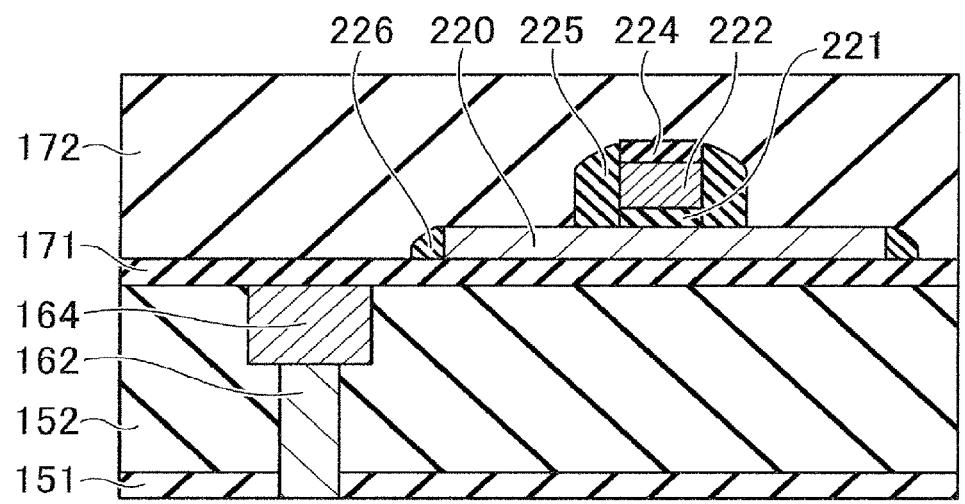
FIG. 8C is a cross-sectional view showing the example of the manufacturing method of the semiconductor device according to the second embodiment.
Figure 8D:
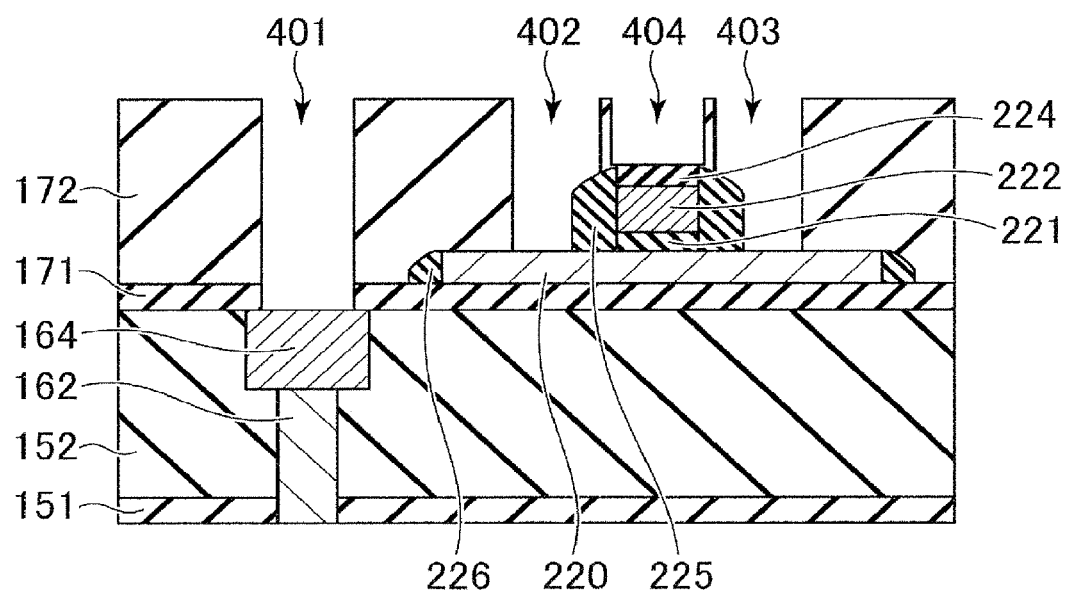
FIG. 8D is a cross-sectional view showing the example of the manufacturing method of the semiconductor device according to the second embodiment.

Next, as shown in FIG. 8C, the second interlayer insulating layer 172 is formed so as to cover the cap insulating layer 171, the sidewalls 226, the semiconductor layer 220, the sidewalls 225, the gate insulating film 221, the gate electrode 222, and the hard mask 224. The second interlayer insulating layer 172 is a low-dielectric-constant layer having a dielectric constant lower than that of silicon dioxide. Examples of the material of the second interlayer insulating layer 172 include a carbon-containing film such as a SiOC (H) film or SiLK (registered trademark). Subsequently, as shown in FIG. 8D, in the second interlayer insulating layer 172, the holes 401 to 404 for the vias, the contacts, and the wires are opened. In this case, the holes 402 and 403 for the contacts (source/drain electrodes) 286 are disposed closer to the sidewalls 225 than in the second modification (FIG. 5A) of the first embodiment. In addition, the etching rate of the material of the sidewalls 225 is significantly lower than the etching rate of the material of the second interlayer insulating layer 172. In other words, each of the holes 402 and 403 has a part thereof corresponding to the sidewall 225, and therefore the sidewall 225 may be etched together with the second interlayer insulating layer 172 during etching. However, since the etching rate of the sidewalls 225 is significantly low, only the second interlayer insulating layer 172 is etched, and the holes 402 and 403 can be formed in a so-called self-aligned manner with respect to the gate electrode 222.

Figure 8E:
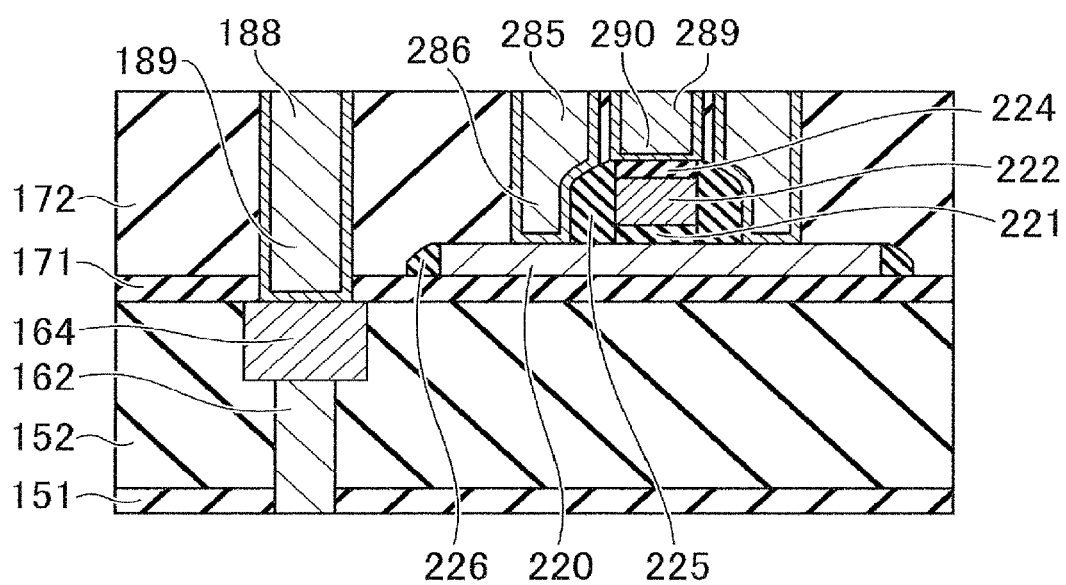
FIG. 8E is a cross-sectional view showing the example of the manufacturing method of the semiconductor device according to the second embodiment.

Next, as shown in FIG. 8E, the via 189, the contacts (source/drain electrodes) 286, the via 290 for the gate electrode, and the second wires 188, 285, and 289 are embedded using a single damascene method or a dual damascene method. In this manner, the second wiring layer 170 is formed. Examples of the via 189, the contacts 186 and 290, and the second wires 188, 285, and 289 include copper (Cu) using tantalum (Ta)/tantalum nitride (TaN) or titanium (Ti)/titanium nitride (TiN) as a barrier film. In this case, since the contacts (source/drain electrodes) 286 are disposed in a so-called self-aligned manner with respect to the gate electrode 222, the contacts 286 can be formed at proper positions.

By the foregoing steps, the semiconductor device 100 according to the present embodiment is manufactured.

However, to enable the foregoing semiconductor element 200 to be placed, it is necessary to carefully select a material for the hard mask 224 and the sidewalls 225. As the material of the hard mask 224 and the sidewalls 225, a material having a selectivity different from that of the second interlayer insulating layer 172 is preferably selected. For example, when silicon dioxide ($SiO_2$) is used as the material of the second interlayer insulating layer 172, it can be considered to use silicon nitride ($SiN_x$) or the like as the material of the hard mask 224 and the sidewalls 225. As a result, when the holes 402 and 403 for the contacts 286 are opened, it is possible to selectively leave the sidewalls 225 and prevent the gate electrode 222 from being exposed during the etching for opening the holes 402 and 403.

In the present embodiment also, the same effects as obtained in the first embodiment can be obtained.

In addition, in the present embodiment, the semiconductor element 200 has a top-gate element structure, not a bottom-gate element structure, and can be placed in a self-aligned manner. Accordingly, it is possible to precisely control the distances between the source/drain electrodes (contacts 286) and the gate (gate insulating film 221 and gate electrode 222). That is, alignment accuracy can be improved. When silicon nitride ($SiN_x$) or the like is used for the sidewalls 225 and the hard mask 224, the etching resistance thereof can prevent a short circuit between the gate and the source/drain electrodes.

Modification

Figure 9:
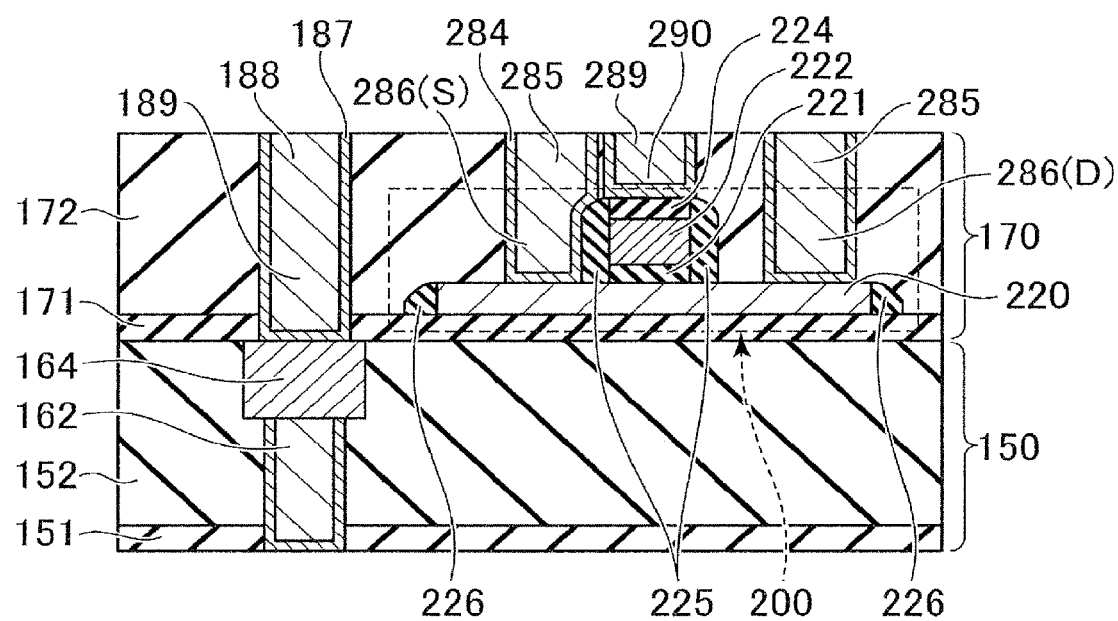
FIG. 9 is a cross-sectional view showing an example of a modification of the configuration of the semiconductor device according to the second embodiment.

FIG. 9 is a cross-sectional view showing a modification of the configuration of the semiconductor device according to the present embodiment. When compared to the case shown in FIG. 6A, the case shown in FIG. 9 is different therefrom in that the drain electrode (contact 286 (D)) is formed at a position distant from the sidewall 225. Hereinbelow, a description will be given mainly of the difference therebetween.

In the present embodiment, of the contacts 286 as the source/drain electrodes, the contact 286 (D) as the drain electrode is formed at a position distant from the sidewall 225. The placement is determined by lithography. On the other hand, the contact 286 (S) as the source electrode is formed at a position in contact with the sidewall 225, in the same manner as in the case shown in FIG. 6A.

Such a configuration can be implemented by adjusting the position of the hole 403 for the contact (source/drain electrode) 286 in the step of FIG. 8D in the manufacturing method of the semiconductor device according to the second embodiment described above. It is also possible to further provide sidewalls outside the sidewall 225 closer to the contact 286 (D) to provide the double sidewalls and thereby produce the shape of FIG. 9 by self alignment.

In the present modification also, the same effects as obtained in the second embodiment can be obtained.

In addition, in the present modification, by physically isolating the drain electrode (contact 286 (D)) from the gate electrode 222, the drain breakdown voltage of the semiconductor element 200 can be improved. On the other hand, by forming the source electrode (contact 286 (S)) by self alignment, the distance between the source electrode (contact 286 (S)) and the gate (gate insulating film 221 and gate electrode 222) can be precisely controlled with the width of the sidewall 225. This allows the source-side parasitic resistance to be minimized.

Third Embodiment

Figure 10:
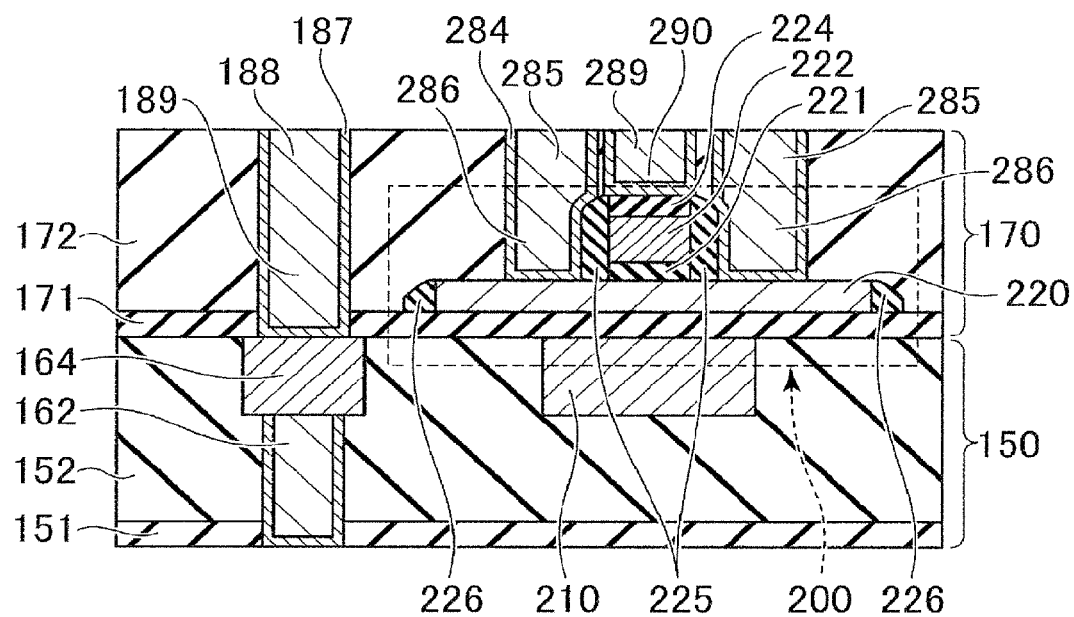
FIG. 10 is a cross-sectional view showing an example of a configuration of a semiconductor device according to a third embodiment.

A description will be given of a configuration of a semiconductor device according to the third embodiment. FIG. 10 is a cross-sectional view showing an example of the configuration of the semiconductor device according to the present embodiment. The semiconductor device of the present embodiment is different from the semiconductor device of the second embodiment in having a double-gate structure including a back gate 210. Hereinbelow, a description will be given mainly of the difference therebetween.

In the present embodiment, the back gate 210 is provided in the surface region of the first wiring layer 150, similarly to the first wire (Cu wire) 164 in the first wiring layer 150. The back gate 210 has the top surface thereof covered with the cap insulating layer 171. The back gate 210 is provided at a position opposing the gate electrode 222 via the cap insulating layer 171 and the semiconductor layer 220. For example, the back gate 210 is provided so as to cover the region of the semiconductor layer 220 extending from one (source electrode) of the contacts 286 to the other contact (drain electrode) 286 through the gate electrode 222. That is, the semiconductor layer 220 has the double gate structure having the gate electrode 222 and the back gate 210.

However, it is also possible to apply the back gate 210 provided in the present embodiment to each of the semiconductor elements 200 of the first embodiment, the modifications thereof, and the modification of the second embodiment.

To obtain such a configuration, when the first wiring layer 150 is formed in the manufacturing method of the semiconductor device of the second embodiment (in the step of FIG. 3A), the back gate (Cu wire) 210 is formed simultaneously with the first wire (Cu wire) 164. This allows the back gate 210 to be formed without providing an additional step. Moreover, when the gate electrode 222 and the like are formed, since the semiconductor layer 220 is formed over the region where the back gate 210 exists, the gate electrode 222 and the like are aligned with respect to the back gate 210 and patterned.

In the present embodiment also, the same effects as obtained in the second embodiment can be obtained.

In addition, in the present embodiment, the semiconductor element 200 is formed in the double gate structure to allow switching between the source/drain electrodes to be performed with a more excellent ON/OFF ratio. In addition, the sub-threshold characteristic is improved to allow driving at a lower voltage.

Modification

Figure 11:
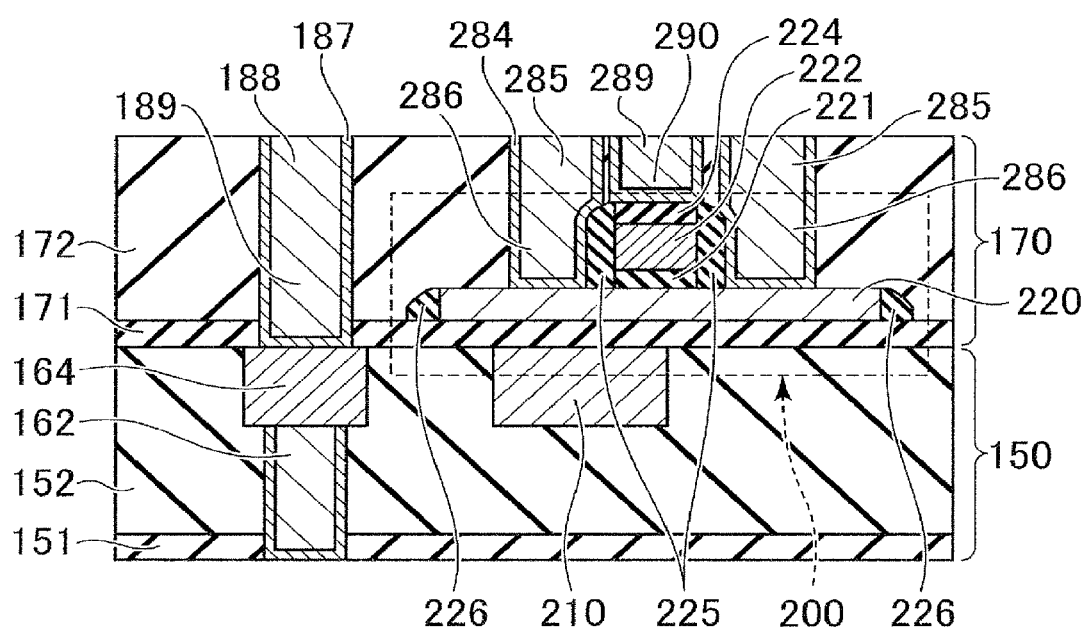
FIG. 11 is a cross-sectional view showing a modification of the configuration of the semiconductor device according to the third embodiment.

FIG. 11 is a cross-sectional view showing a modification of the configuration of the semiconductor device according to the present embodiment. Compared with the case shown in FIG. 10, the case shown in FIG. 11 is different therefrom in that the back gate 210 is disposed in the limited region of the semiconductor layer 220. Hereinbelow, a description will be given mainly of the difference therebetween.

In the present modification, the back gate 210 is provided at a position opposing one (source electrode) of the contacts 286 and a part of the gate electrode 222 via the cap insulating layer 171 and the semiconductor layer 220. Specifically, the back gate 210 is provided so as to cover the region of the semiconductor layer 220 extending from the one contact (source electrode) 286 to the gate electrode 222. Thus, in the present embodiment, the back gate 210 is disposed in the limited region of the channel (semiconductor layer 220).

Such a configuration can be implemented by, e.g., displacing the position of the back gate (Cu wire) 210 when the back gate (Cu wire) 210 is formed in the first wiring layer 150 in the manufacturing method of the semiconductor device of the third embodiment. Alternatively, when the gate electrode 222 and the like are formed, the gate electrode 222 and the like are aligned to be slightly displaced from the back gate 210 and patterned to allow such a configuration to be implemented.

In the present modification also, the same effects as obtained in the third embodiment can be obtained.

In addition, in the present modification, it is possible to cause the double-gate effect due to the back gate 210 only between, e.g., the source (the one contact 286) and the gate (gate electrode 222). Consequently, even when, e.g., the sidewalls 225 are thickened, a parasitic resistance can be sufficiently reduced by the back gate 210 between the source and gate while, between the source and the drain, the drain breakdown voltage can be precisely determined with the distance defined by the film thickness of the sidewall 225. That is, by thus changing the position of the back gate 210 to a desired position, the element characteristics of the semiconductor element 200 can be optimized.

Fourth Embodiment

Figure 12:
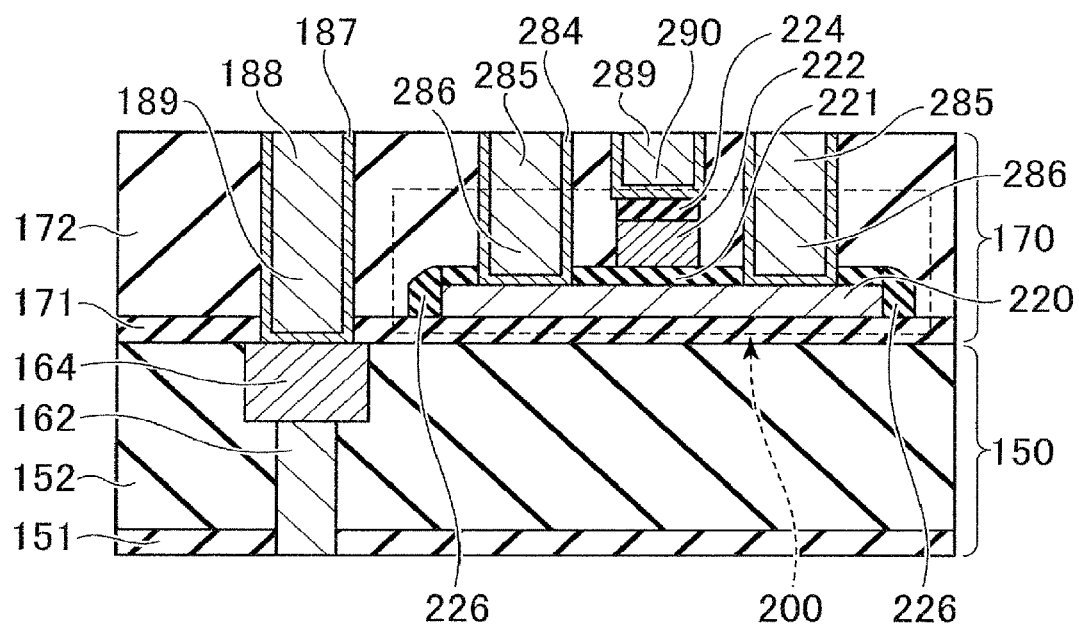
FIG. 12 is a cross-sectional view showing a configuration of a semiconductor device according to a fourth embodiment.
Figure 13:
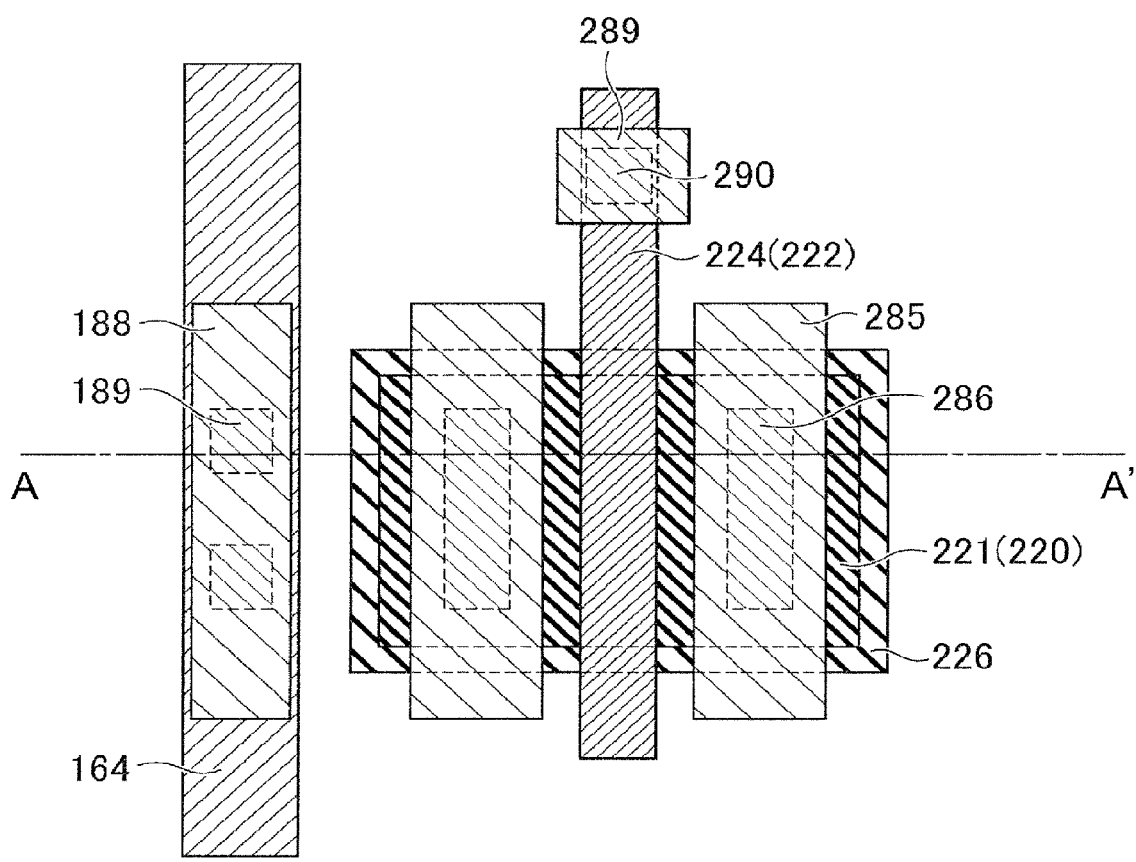
FIG. 13 is a plan view showing the configuration of the semiconductor device according to the fourth embodiment.

A description will be given of a configuration of a semiconductor device according to the fourth embodiment. FIG. 12 is a cross-sectional view showing an example of the configuration of the semiconductor device according to the present embodiment. FIG. 13 is a plan view showing the example of the configuration of the semiconductor device according to the present embodiment. Note that FIG. 12 is a cross section along the line A-A' of FIG. 13. The semiconductor device of the present embodiment is different from the semiconductor device of the first embodiment (FIG. 1A) in that the gate insulating film 221 covers the entire upper surface of the semiconductor layer 220. Hereinbelow, a description will be given mainly of the difference therebetween.

In the present embodiment, the gate insulating film 221 covers the entire upper surface of the island-shaped semiconductor layer 220. That is, the gate insulating film 221 overlaps the semiconductor layer 220 in planar view. In addition, the sidewalls 226 cover the both side surfaces of the semiconductor layer 220 and the gate insulating film 221. Note that the present embodiment also includes a form in which the gate insulating film 221 in the region where the gate electrode 222 does not exist is thinner than the gate insulating film 221 immediately under the gate electrode 222 or is partly missing. In this case, as will be described later, patterning is performed after the gate insulating film 221 is formed over the semiconductor layer 220. As a result, the semiconductor layer 220 is no longer affected by the patterning to allow easy control of the film quality thereof. In addition, contact between the gate electrode 222 and the semiconductor layer 220 can be more reliably prevented.

Such a configuration can be implemented by the following steps. FIGS. 14A to 14J are cross-sectional views each showing an example of a manufacturing method of the semiconductor device according to the present embodiment. Each of the drawings corresponds to a cross section along the line A-A' of FIG. 13. Note that, in FIGS. 14A to 14J, the illustration of the semiconductor substrate 101, the contact layer 130, and the wiring layer 140 is omitted.

First, as shown in FIG. 1B, the semiconductor substrate 101 is formed with the isolating layer 120. Then, over the semiconductor substrate 101, e.g., the transistor 121 is formed as the semiconductor element. Subsequently, the contact layer 130 (including the interlayer insulating layer 131 and the contacts 142), and the wiring layer 140 (including the interlayer insulating layer 132 and the wires (copper (Cu) wires) 144) are formed. For the foregoing steps, a conventionally known method can be used.

Figure 14A:
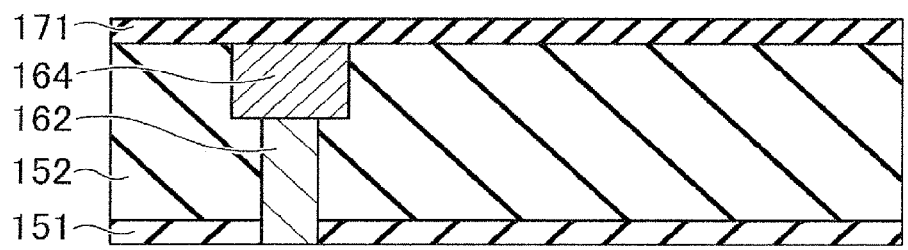
FIG. 14A is a cross-sectional view showing an example of a manufacturing method of the semiconductor device according to the fourth embodiment.

Next, as shown in FIG. 14A, over the wiring layer 140 (not shown), the cap insulating layer 151 for preventing diffusion of copper (Cu) and the first interlayer insulating layer 152 are deposited in this order. Subsequently, in the first interlayer insulating layer 152, the via 162 and the first wire 164 are embedded using a single damascene method or a dual damascene method. In this manner, the first wiring layer 150 is formed. Thereafter, the cap insulating layer 171 is formed so as to cover the first interlayer insulating film 152 and the first wire 164. The foregoing steps are performed by the same method as used to form a typical semiconductor device having a copper (Cu) wiring layer.

Figure 14B:
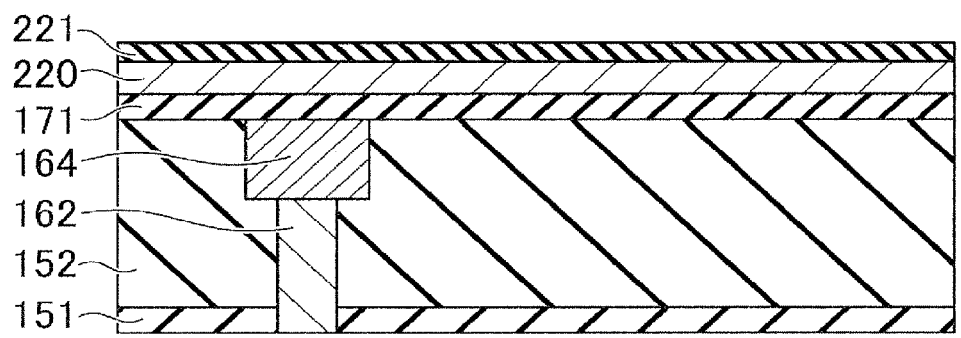
FIG. 14B is a cross-sectional view showing the example of the manufacturing method of the semiconductor device according to the fourth embodiment.
Figure 14C:
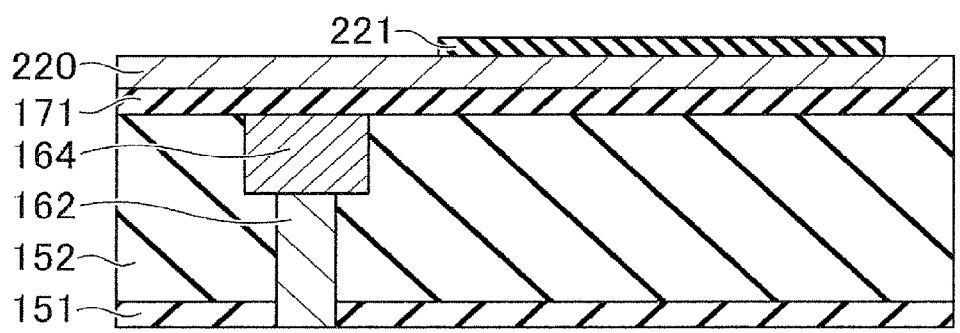
FIG. 14C is a cross-sectional view showing the example of the manufacturing method of the semiconductor device according to the fourth embodiment.
Figure 14D:
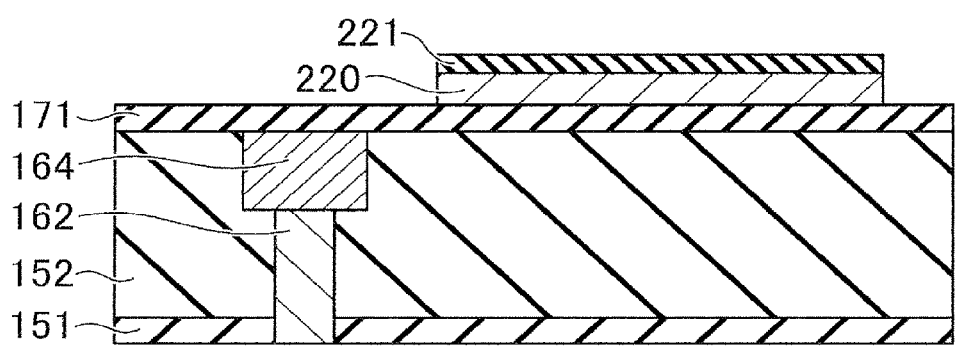
FIG. 14D is a cross-sectional view showing the example of the manufacturing method of the semiconductor device according to the fourth embodiment.

Next, as shown in FIG. 14B, over the cap insulating layer 171, the semiconductor layer 220 serving as the channel of the semiconductor element 200 is formed by, e.g., a sputtering method. Further, the gate insulating film 221 is deposited thereover by, e.g., a sputtering method. Subsequently, as shown in FIG. 14C, the gate insulating film 221 is patterned by typical photolithography and dry etching. As a result, the island-shaped gate insulating film 221 is formed. Then, as shown in FIG. 14D, the semiconductor layer 220 under the gate insulating film 221 is patterned by dry etching using the gate insulating film 221 as a mask. As a result, a laminated structure of the island-shaped gate insulating film 221 and the semiconductor layer 220 is formed.

Figure 14E:
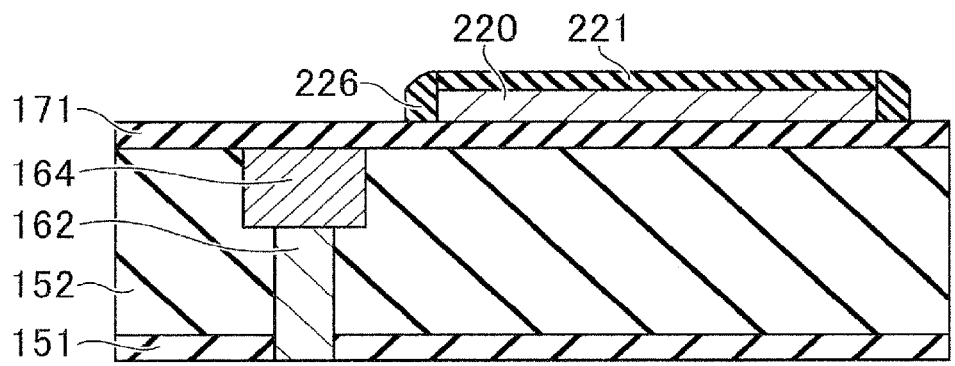
FIG. 14E is a cross-sectional view showing the example of the manufacturing method of the semiconductor device according to the fourth embodiment.

Next, as shown in FIG. 14E, over the gate insulating film 221 and the cap insulating layer 171, an insulating film (hereinafter referred to also as the covering insulating film 226) serving as the sidewalls 226 is formed by, e.g., a CVD method. Then, the covering insulating film 226 is subjected to a full etch-back process. As a result, over the side surfaces of the gate insulating film 221 and the semiconductor layer 220, the sidewalls 226 are formed. The sidewalls 226 cover and protect the exposed side surfaces of the island-shaped semiconductor layer 220 such that the semiconductor layer 220 is not affected by another film or process.

Figure 14F:
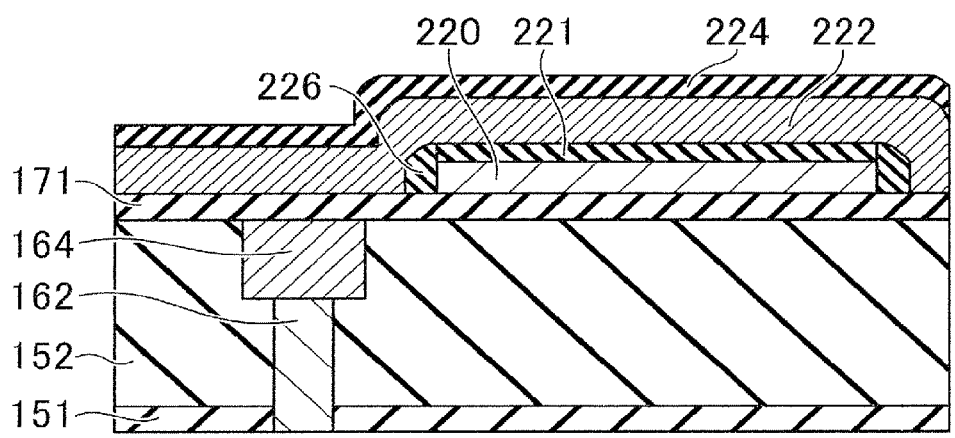
FIG. 14F is a cross-sectional view showing the example of the manufacturing method of the semiconductor device according to the fourth embodiment.
Figure 14G:
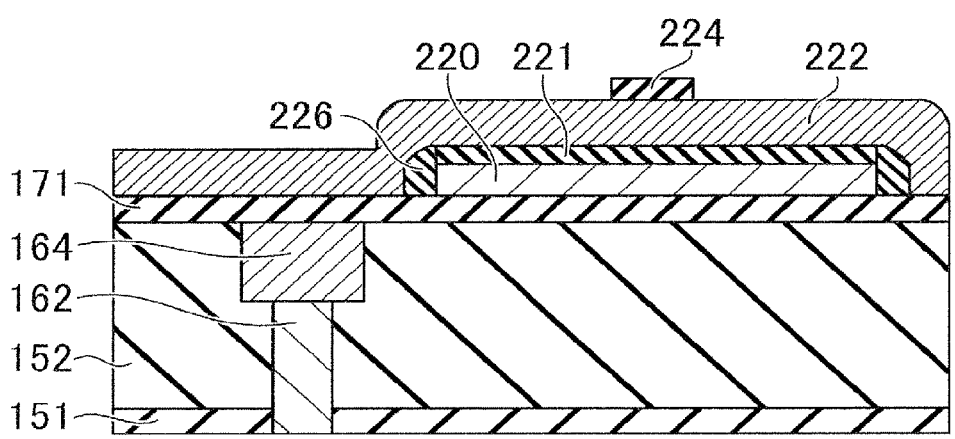
FIG. 14G is a cross-sectional view showing the example of the manufacturing method of the semiconductor device according to the fourth embodiment.
Figure 14H:
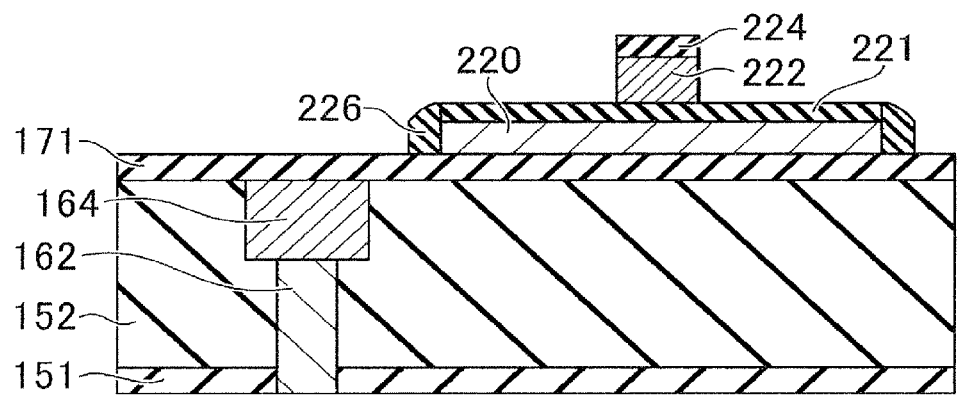
FIG. 14H is a cross-sectional view showing the example of the manufacturing method of the semiconductor device according to the fourth embodiment.

Next, as shown in FIG. 14F, over the top surfaces of the cap insulating layer 171, the sidewalls 226, and the gate insulating film 221, the gate electrode 222 and the hard mask 224 are deposited by, e.g., a sputtering method. Subsequently, as shown in FIG. 14G, using typical photolithography and dry etching, the hard mask 224 is patterned. Subsequently, as shown in FIG. 14H, the gate electrode 222 under the hard mask 224 is patterned by dry etching using the hard mask 224 as a mask. As a result, a laminated structure of the hard mask 224 and the gate electrode 222 which has a gate electrode shape as shown in the plan view of FIG. 13 is formed.

Figure 14I:
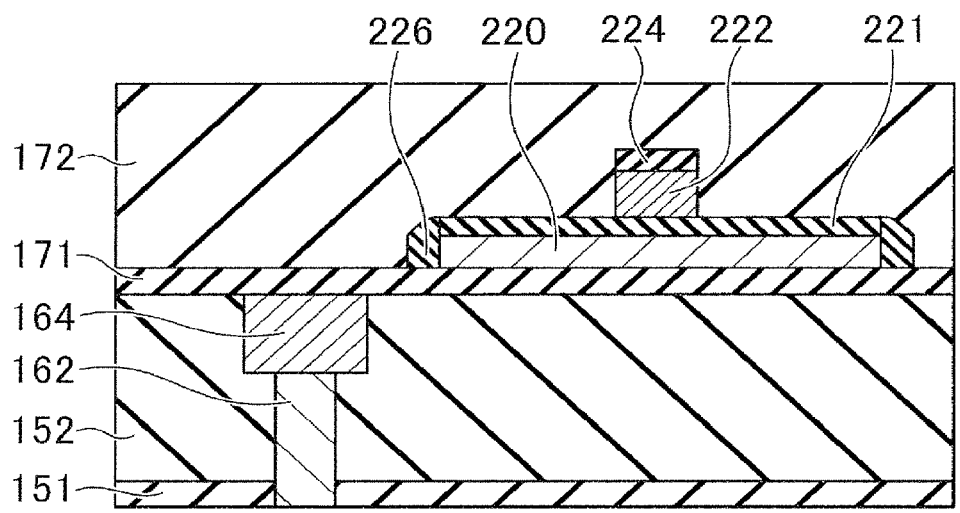
FIG. 14I is a cross-sectional view showing the example of the manufacturing method of the semiconductor device according to the fourth embodiment.
Figure 14J:
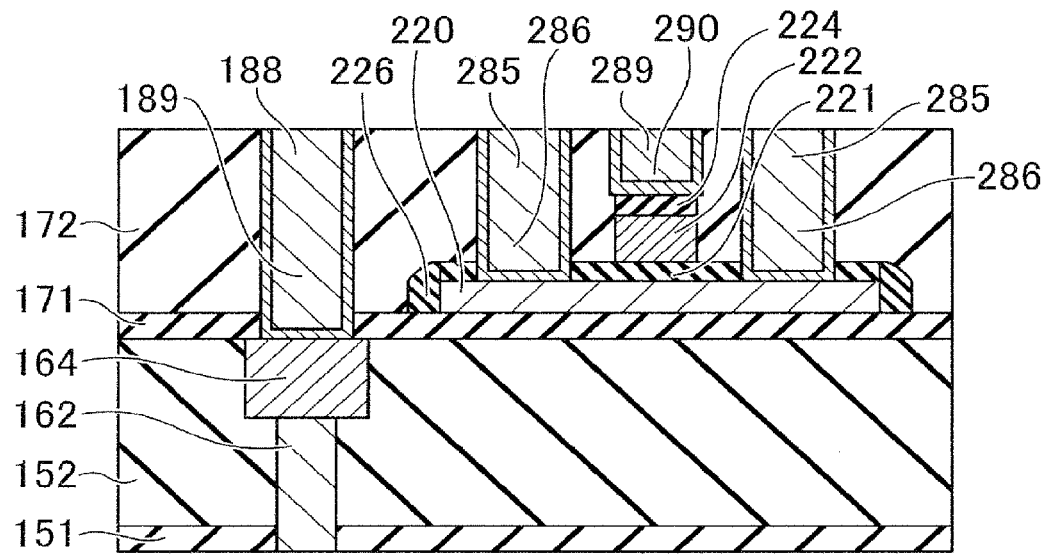
FIG. 14J is a cross-sectional view showing the example of the manufacturing method of the semiconductor device according to the fourth embodiment.

Next, as shown in FIG. 14I, the second interlayer insulating layer 172 is formed so as to cover the cap insulating layer 171, the sidewalls 226, the gate insulating film 221, the gate electrode 222, and the hard mask 224. Subsequently, as shown in FIG. 14J, in the second interlayer insulating layer 172, the holes for the vias, the contacts, and the wires are opened. Thereafter, the via 189, the contacts (source/drain electrodes) 286, the via 290 for the gate electrode, and the second wires 188, 285, and 289 are embedded using a single damascene method or a dual damascene method. As a result, the second wiring layer 170 is formed.

By the foregoing steps, the semiconductor device 100 according to the present embodiment is manufactured.

Note that, as a method for forming the sidewalls 226, a technique which oxidizes the end surfaces of the semiconductor layer 220 to partially change the semiconductor layer 220 into an insulator or the like can also be used besides the step of FIG. 14E described above. Note that, when the gate electrode 222 is patterned, the gate insulating film 221 is also etched. Therefore, the present embodiment also includes a form in which the gate insulating film 221 in the region where the gate electrode 222 does not exist is thinner than the gate insulating film 221 immediately under the gate 222 or is missing.

In the present embodiment also, the same effects as obtained in the first embodiment can be obtained.

In addition, in the present embodiment, patterning is performed after the gate insulating film 221 is formed over the semiconductor layer 220 so that the semiconductor layer 220 is no longer affected by the patterning (no longer affected by direct application of a resist and a resist removing operation). This allows easy control of the film quality of the semiconductor layer 220, specifically control of a composition such as oxygen in the semiconductor layer 220 and the like.

Fifth Embodiment

Figure 15:
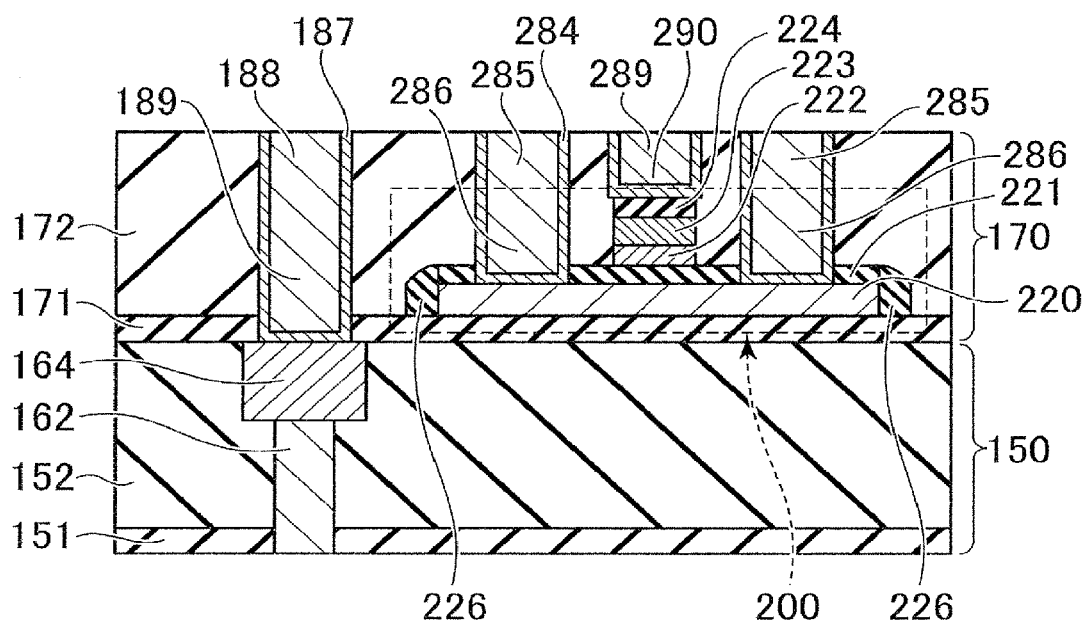
FIG. 15 is a cross-sectional view showing an example of a configuration of a semiconductor device according to a fifth embodiment.
Figure 16:
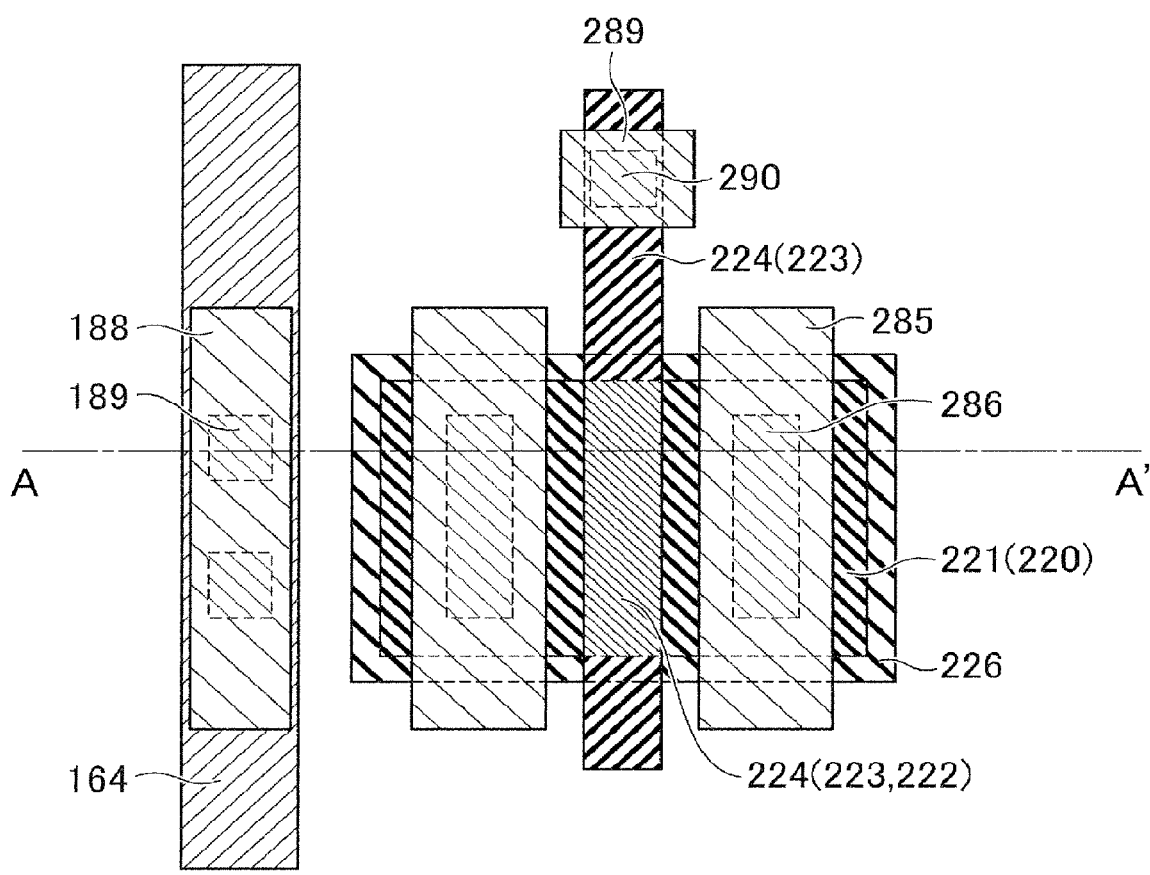
FIG. 16 is a plan view showing the example of the configuration of the semiconductor device according to the fifth embodiment.

A description will be given of a configuration of a semiconductor device according to a fifth embodiment. FIG. 15 is a cross-sectional view showing an example of the configuration of the semiconductor device according to the present embodiment. FIG. 16 is plan view showing the example of the configuration of the semiconductor device according to the present embodiment. Note that FIG. 15 is a cross section along the line A-A' of FIG. 16. The semiconductor device of the present embodiment is different from the semiconductor device of the fourth embodiment (FIG. 12) in that the gate electrode includes two layers. Hereinbelow, a description will be given mainly of the difference therebetween.

In the present embodiment, the gate electrode includes the two layers of the lower gate electrode 222 and an upper gate electrode 223. The lower gate electrode 222 exists only over the semiconductor layer 220. The upper gate electrode 223 is formed not only to exist over the semiconductor layer 200, but also to extend across the semiconductor layer 220. The materials of the two gate electrodes may be the same as or different from each other. Note that the present embodiment also includes a form in which the gate insulating film 221 in the region where the lower gate electrode 222 does not exist is thinner than the gate insulating film 221 immediately under the lower gate electrode 222 or is missing. In this case, as will be described later, patterning is performed after the gate insulating film 221 and the lower gate electrode 222 are formed over the semiconductor layer 220. As a result, the semiconductor layer 220 and the gate insulating film 221 are no longer affected by the patterning to allow easy control of the film quality thereof.

Such a configuration can be implemented by the following steps. FIGS. 17A to 17H are cross-sectional views showing an example of a manufacturing method of the semiconductor device according to the present embodiment. Each of the drawings corresponds to a cross section along the line A-A' of FIG. 16. Note that, in FIGS. 17A to 17H, the illustration of the semiconductor substrate 101, the contact layer 130, and the wiring layer 140 is omitted.

First, as shown in FIG. 1B, the semiconductor substrate 101 is formed with the isolating layer 120. Then, over the semiconductor substrate 101, e.g., the transistor 121 is formed as the semiconductor element. Subsequently, the contact layer 130 (including the interlayer insulating layer 131 and the contacts 142), and the wiring layer 140 (including the interlayer insulating layer 132 and the wires (copper (Cu) wires) 144) are formed. For the foregoing steps, a conventionally known method can be used.

Figure 17A:
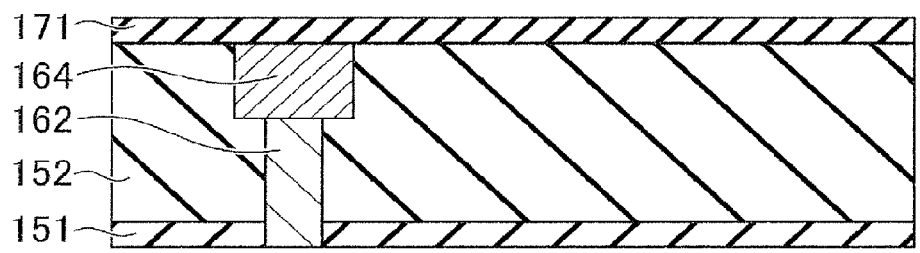
FIG. 17A is a cross-sectional view showing an example of a manufacturing method of the semiconductor device according to the fifth embodiment.

Next, as shown in FIG. 17A, over the wiring layer 140 (not shown), the cap insulating layer 151 for preventing diffusion of copper (Cu) and the first interlayer insulating layer 152 are deposited in this order. Subsequently, in the first interlayer insulating layer 152, the via 162 and the first wire 164 are embedded using a single damascene method or a dual damascene method. In this manner, the first wiring layer 150 is formed. Thereafter, the cap insulating layer 171 is formed so as to cover the first interlayer insulating film 152 and the first wire 164. The foregoing steps are performed by the same method as used to form a typical semiconductor device having a copper (Cu) wiring layer.

Figure 17B:
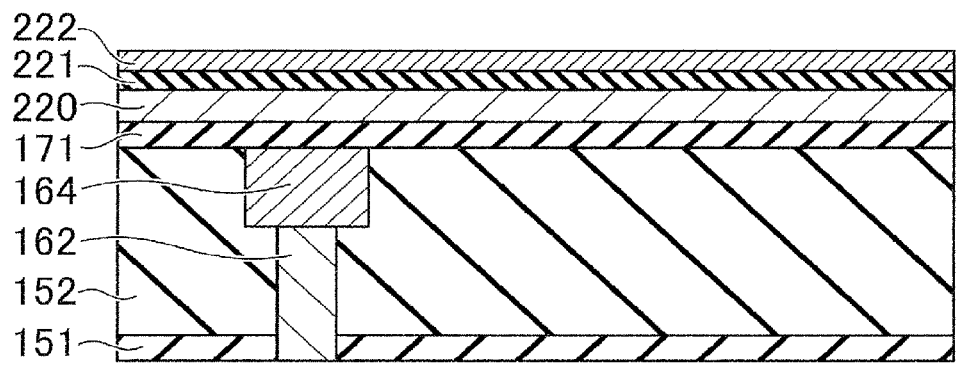
FIG. 17B is a cross-sectional view showing the example of the manufacturing method of the semiconductor device according to the fifth embodiment.
Figure 17C:
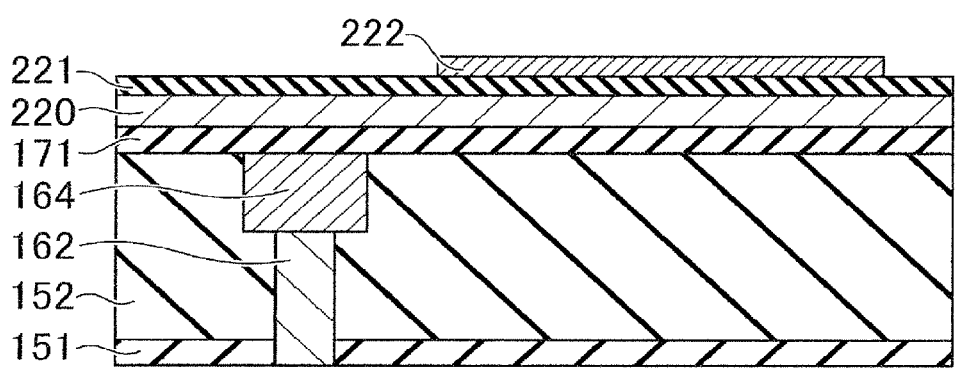
FIG. 17C is a cross-sectional view showing the example of the manufacturing method of the semiconductor device according to the fifth embodiment.
Figure 17D:
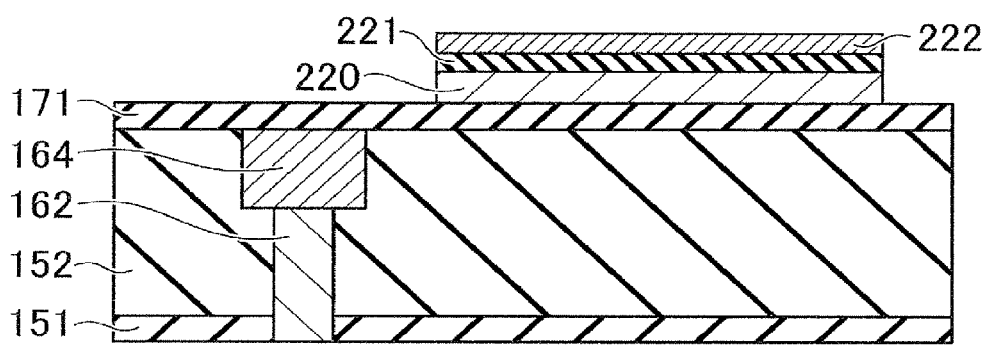
FIG. 17D is a cross-sectional view showing the example of the manufacturing method of the semiconductor device according to the fifth embodiment.

Next, as shown in FIG. 17B, over the cap insulating layer 171, the semiconductor layer 220 serving as the channel of the semiconductor element 200, the gate insulating film 221, and the lower gate electrode 222 are deposited in this order by, e.g., a sputtering method. Subsequently, as shown in FIG. 17C, the lower gate electrode 222 is patterned by typical photolithography and dry etching. As a result, the island-shaped lower gate electrode 222 is formed. Then, as shown in FIG. 17D, the gate insulating film 221 and the semiconductor layer 220 each under the lower gate electrode 222 are patterned by dry etching using the lower gate electrode 222 as a mask. As a result, a laminated structure of the island-shaped lower gate electrode 222, the gate insulating film 221, and the semiconductor layer 220 is formed. At this time, the gate insulating film 221 and the semiconductor layer 220 are protected by the lower gate electrode 222 and therefore scarcely affected by photolithography and dry etching.

Figure 17E:
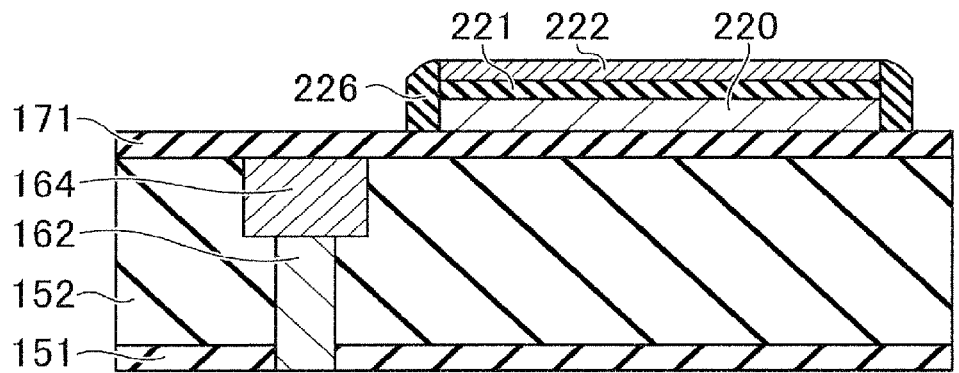
FIG. 17E is a cross-sectional view showing the example of the manufacturing method of the semiconductor device according to the fifth embodiment.

Next, as shown in FIG. 17E, over the lower gate electrode 222 and the cap insulating layer 171, an insulating film (hereinafter referred to also as the covering insulating film 226) serving as the sidewalls 226 is formed by, e.g., a CVD method. Then, the covering insulating film 226 is subjected to a full etch-back process. As a result, over the side surfaces of the lower gate electrode 222, the gate insulating film 221, and the semiconductor layer 220, the sidewalls 226 are formed. The sidewalls 226 cover and protect the exposed side surfaces of the island-shaped gate insulating film 221 and the semiconductor layer 220 such that the gate insulating film 221 and the semiconductor layer 220 are not affected by another film or process.

Figure 17F:
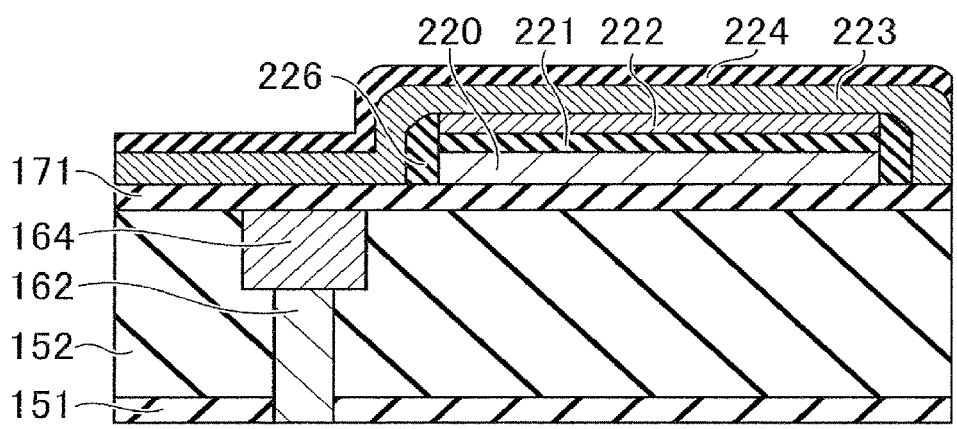
FIG. 17F is a cross-sectional view showing the example of the manufacturing method of the semiconductor device according to the fifth embodiment.
Figure 17G:
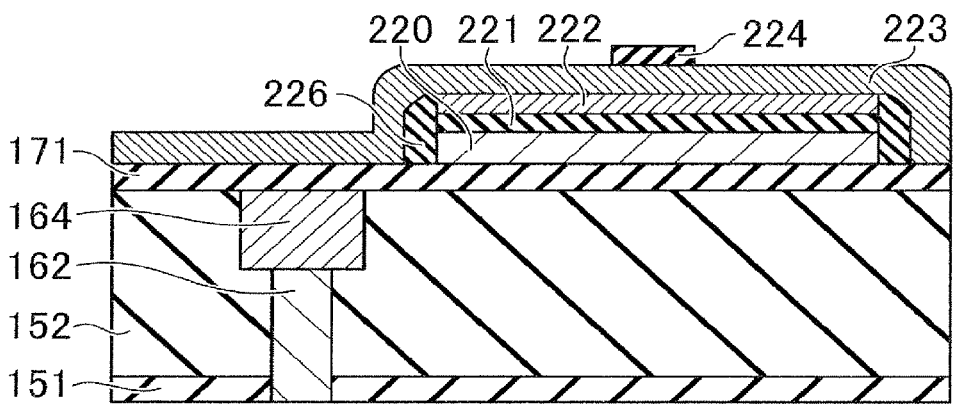
FIG. 17G is a cross-sectional view showing the example of the manufacturing method of the semiconductor device according to the fifth embodiment.

Next, as shown in FIG. 17F, over the top surfaces of the cap insulating layer 171, the sidewalls 226, and the lower gate electrode 222, the upper gate electrode 223 and the hard mask 224 are deposited by, e.g., a sputtering method. Subsequently, as shown in FIG. 17G, using typical photolithography and dry etching, the hard mask 224 is patterned. Subsequently, as shown in FIG. 17H, the upper gate electrode 222 and the lower gate electrode 222 each under the hard mask 224 are patterned by dry etching using the hard mask 224 as a mask. As a result, a laminated structure of the hard mask 224, the upper gate electrode 223, and the lower gate electrode 222 which has a gate electrode shape as shown in the plan view of FIG. 16 is formed. Note that, since the gate insulating film 221 is also etched when the lower gate electrode 222 is patterned, the present embodiment also includes a form in which the gate insulating film 221 in the region where the lower gate electrode 222 does not exist is thinner than the gate insulating film 221 immediately under the lower gate electrode 222 or missing.

The subsequent steps are as shown in the steps of FIGS. 14I to 14J in the manufacturing method of the semiconductor device according to the fourth embodiment.

By the foregoing steps, the semiconductor device 100 according to the present embodiment is manufactured.

In the present embodiment also, the same effects as obtained in the fourth embodiment can be obtained.

In addition, in the present embodiment, the lower gate electrode 222 is formed over the semiconductor layer 220 and the gate insulating film 221 and then patterned into the channel shape. Thereafter, the upper gate electrode 223 is formed and then patterned into the gate electrode shape. As a result, the semiconductor layer 220 and the gate insulating film 221 are no longer affected by the patterning (no longer affected by direct application of a resist and a resist removing operation). This allows easy control of the film quality of each of the semiconductor layer 220 and the gate insulating film 221 (specifically, control of a composition such as oxygen in the semiconductor layer 220, damage in the gate insulating film, oxygen loss, and the like).

Sixth Embodiment

Figure 19:
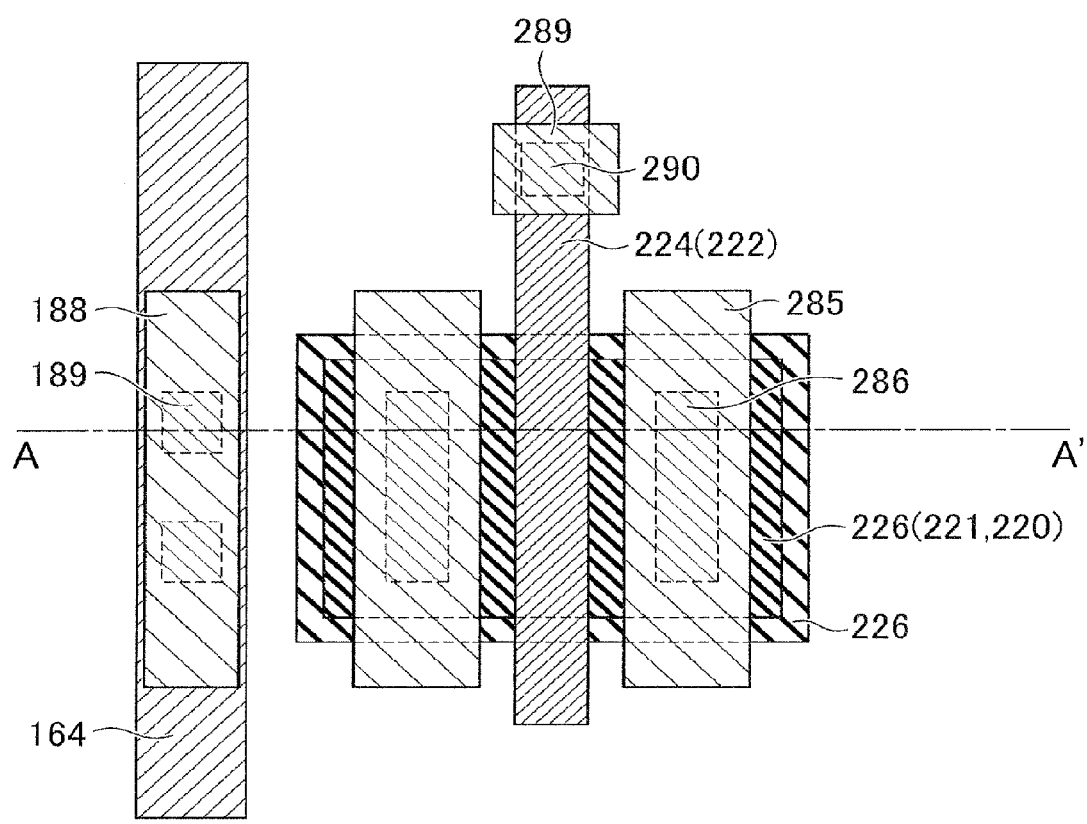
FIG. 19 is a plan view showing the example of the configuration of the semiconductor device according to the sixth embodiment.

A description will be given of a configuration of a semiconductor device according to a sixth embodiment. FIG. 18 is a cross-sectional view showing an example of the configuration of the semiconductor device according to the present embodiment. FIG. 19 is plan view showing an example of the configuration of the semiconductor device according to the present embodiment. Note that FIG. 18 is a cross section along the line A-A' of FIG. 19. The semiconductor device of the present embodiment is different from the semiconductor device of the fourth embodiment (FIG. 12) in that the gate insulating film has a double structure. Hereinbelow, a description will be given mainly of the difference therebetween.

In the present embodiment, over the gate insulating film 221, a gate insulating film is further formed. The gate insulating film is the covering insulating film 226 for the sidewalls 226 which is left as is over the gate insulating film 221 without being etched back (hereinafter referred to as the second gate insulating film 226). Accordingly, the second gate insulating film 226 covers the upper and end surfaces of the laminated structure of the semiconductor layer 220 and the gate insulating film 221 that have been patterned. That is, over the processed side surfaces of the semiconductor layer 220, the second gate insulating film 226 is formed as the sidewalls.

Such a configuration can be implemented by not performing a full etch-back process on the covering insulating film 226 in the step of FIG. 14E in the manufacturing method of the semiconductor device according to the fourth embodiment. In this case, the materials and thicknesses of the gate insulating film 221 and the covering insulating film 226 are set in consideration of the laminated structure of the gate insulating film. Note that the present embodiment also includes a form in which the gate insulating film 221 in the region where the gate electrode 222 does not exist is thinner than the gate insulating film 221 immediately under the lower gate electrode 222 or missing.

In the present modification also, the same effects as obtained in the fourth embodiment can be obtained.

In addition, in the present embodiment, the step of etching back the covering insulating film 226 is no longer necessary to allow the manufacturing process to be simplified. Moreover, since the step of etching back the covering insulating film 226 is not performed, damage to the gate insulating film and the like can be reduced. Depending on the material, a strain can also be introduced into the semiconductor layer 220 (channel) to allow an improvement in carrier mobility in the semiconductor layer 220.

Seventh Embodiment

Figure 20:
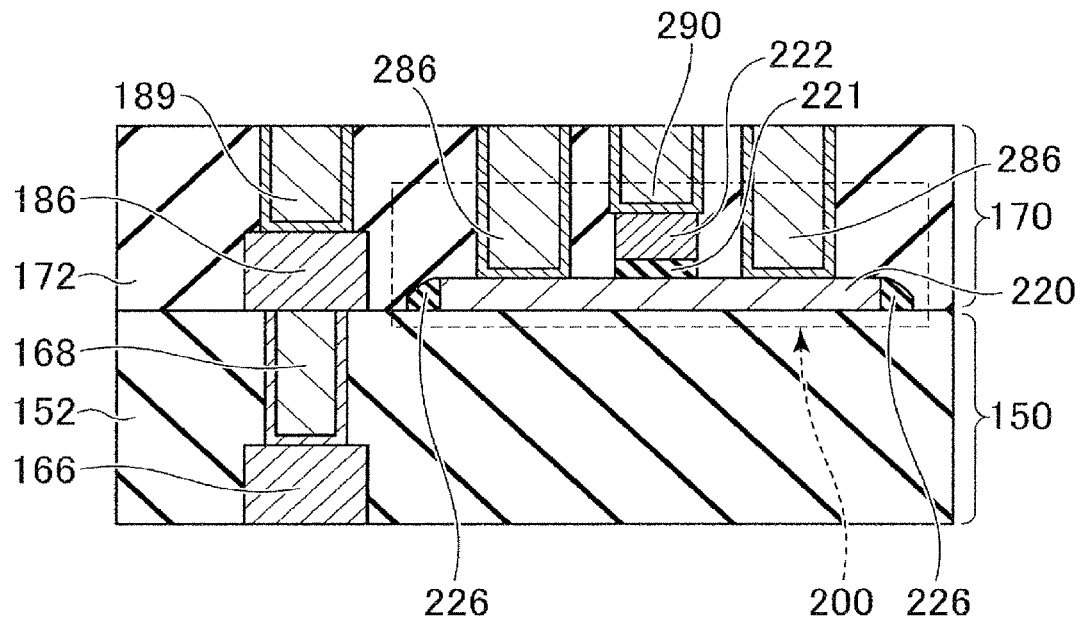
FIG. 20 is a cross-sectional view showing an example of a configuration of a semiconductor device according to a seventh embodiment.

A description will be given of a configuration of a semiconductor device according to a seventh embodiment. FIG. 20 is a cross-sectional view showing an example of the configuration of the semiconductor device according to the present embodiment. The semiconductor device of the present embodiment is different from the semiconductor device of the first embodiment (FIG. 1A) in which the semiconductor element (in-wiring-layer active element (component)) 200 is formed in the copper (Cu) wiring layer in that the semiconductor element (in-wiring-layer active element (component)) 200 is formed in an aluminum (Al) wiring layer. Hereinbelow, a description will be given mainly of the difference therebetween.

In the present embodiment, the semiconductor element (in-wiring-layer active element (component)) 200 is formed in the aluminum (Al) wiring layer. That is, the first wiring layer 150 includes the first wire 166 and the via 168 each made of aluminum (Al), and the second wiring layer 170 includes the second wire 186 and the via 189 each made of aluminum (Al). The semiconductor element 200 is formed in the second wiring layer, but the element structure thereof is the same as in the case shown in FIG. 1A.

Next, a description will be given of a manufacturing method of the semiconductor device according to the present embodiment. FIGS. 21A to 21G are cross-sectional views showing an example of the manufacturing method of the semiconductor device according to the present embodiment. Note that, in FIGS. 21A to 21G, the illustration of the semiconductor substrate 101, the contact layer 130, and the wiring layer 140 is omitted.

First, as shown in FIG. 1B, the semiconductor substrate 101 is formed with the isolating layer 120. Then, over the semiconductor substrate 101, e.g., the transistor 121 is formed as the semiconductor element. Subsequently, the contact layer 130 (including the interlayer insulating layer 131 and the contacts 142), and the wiring layer 140 (including the interlayer insulating layer 132 and the wire (aluminum (Al) wire) 144) are formed. For the foregoing steps, a conventionally known method can be used.

Figure 21A:
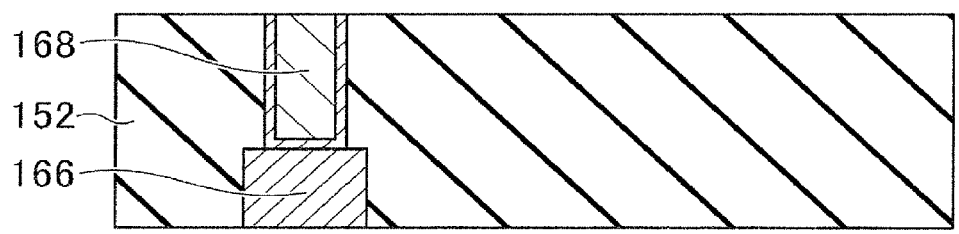
FIG. 21A is a cross-sectional view showing an example of a manufacturing method of the semiconductor device according to the seventh embodiment.

Next, as shown in FIG. 21A, after the first wire 166 of aluminum (Al) is formed, the first interlayer insulating layer 152 is deposited. Subsequently, in the first interlayer insulating layer 152, the via 168 is embedded using a damascene method. In this manner, the first wiring layer 150 is formed. The foregoing steps are performed by the same method as used to form a typical semiconductor device having an aluminum (Al) wiring layer.

Figure 21B:
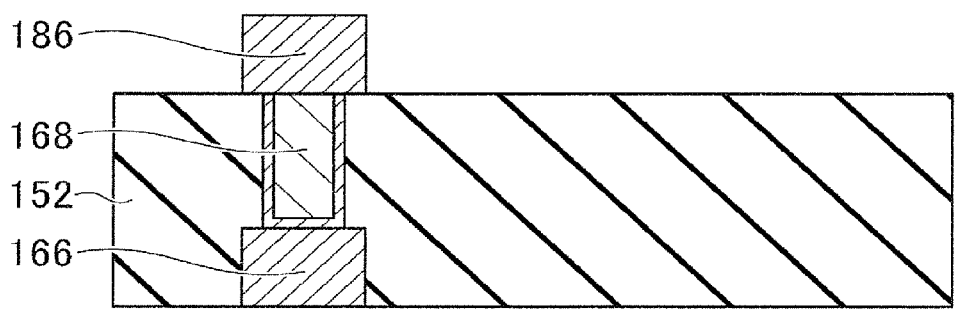
FIG. 21B is a cross-sectional view showing the example of the manufacturing method of the semiconductor device according to the seventh embodiment.
Figure 21C:
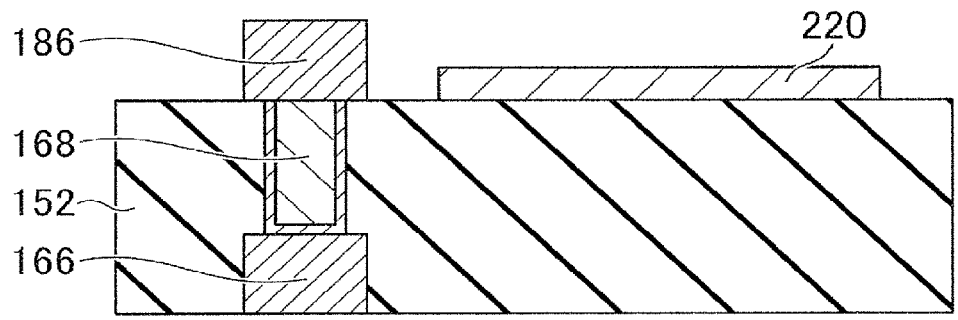
FIG. 21C is a cross-sectional view showing the example of the manufacturing method of the semiconductor device according to the seventh embodiment.

Next, as shown in FIG. 21B, over the first interlayer insulating layer 152, the second wire 186 of aluminum (Al) is formed. Subsequently, as shown in FIG. 21C, over the second wire 186 and the first interlayer insulating layer 152, the semiconductor layer 220 serving as the channel of the semiconductor element 200 is formed by, e.g., a sputtering method. Then, the semiconductor layer 220 is patterned using typical photolithography and dry etching. As a result, the island-shaped semiconductor layer 220 is formed.

Figure 21D:
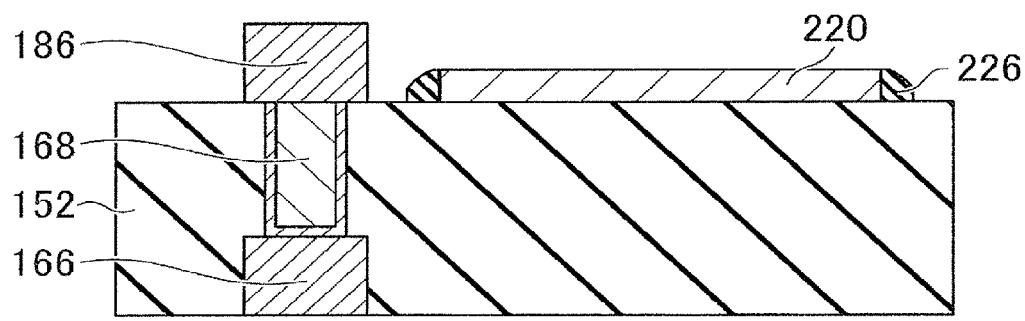
FIG. 21D is a cross-sectional view showing the example of the manufacturing method of the semiconductor device according to the seventh embodiment.

Next, as shown in FIG. 21D, over the semiconductor layer 220, the second wire 186, and the first interlayer insulating layer 152, an insulating film (hereinafter referred to also as the covering insulating film 226) serving as the sidewalls 226 is formed by, e.g., a CVD method. Then, the covering insulating film 226 is subjected to a full etch-back process. As a result, over the side surfaces of the semiconductor layer 220, the sidewalls 226 are formed. The sidewalls 226 cover and protect the exposed side surfaces of the island-shaped semiconductor layer 220 such that the semiconductor layer 220 is not affected by another film or process.

Figure 21E:
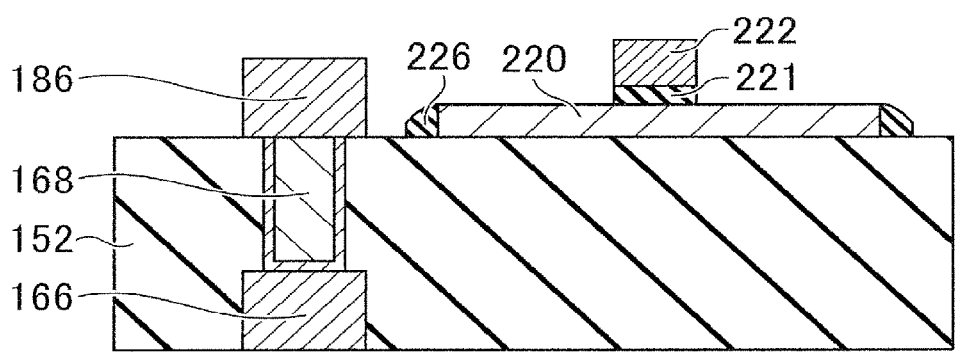
FIG. 21E is a cross-sectional view showing the example of the manufacturing method of the semiconductor device according to the seventh embodiment.

Next, as shown in FIG. 21E, over the top surfaces of the sidewalls 226, the semiconductor layer 220, the second wire 186, and the first interlayer insulating layer 152, the gate insulating film 221 and the gate electrode 222 are deposited by, e.g., a sputtering method. Then, using typical photolithography and dry etching, the gate electrode 222 and the gate insulating film 221 are patterned. In this manner, the gate electrode 222 and the gate insulating film 221 are patterned into a gate electrode shape which extends completely across (extends over) the semiconductor layer 220 (including the sidewalls 226). At this time, the side surfaces of the ends of the semiconductor layer 220 are protected not only by the sidewalls 226, but also by the gate insulating film 221. This more reliably prevents contact between the side surfaces of the ends of the semiconductor layer 220 and the gate electrode 222.

Figure 21F:
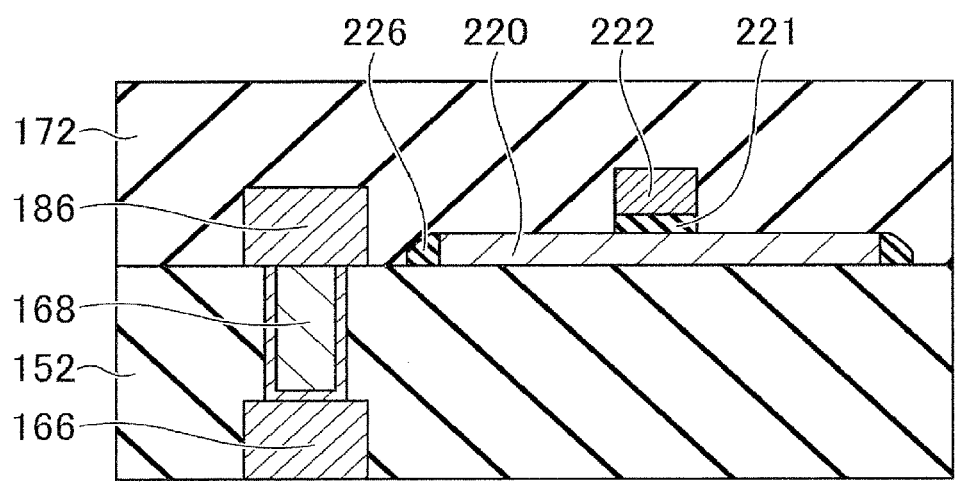
FIG. 21F is a cross-sectional view showing the example of the manufacturing method of the semiconductor device according to the seventh embodiment.
Figure 21G:
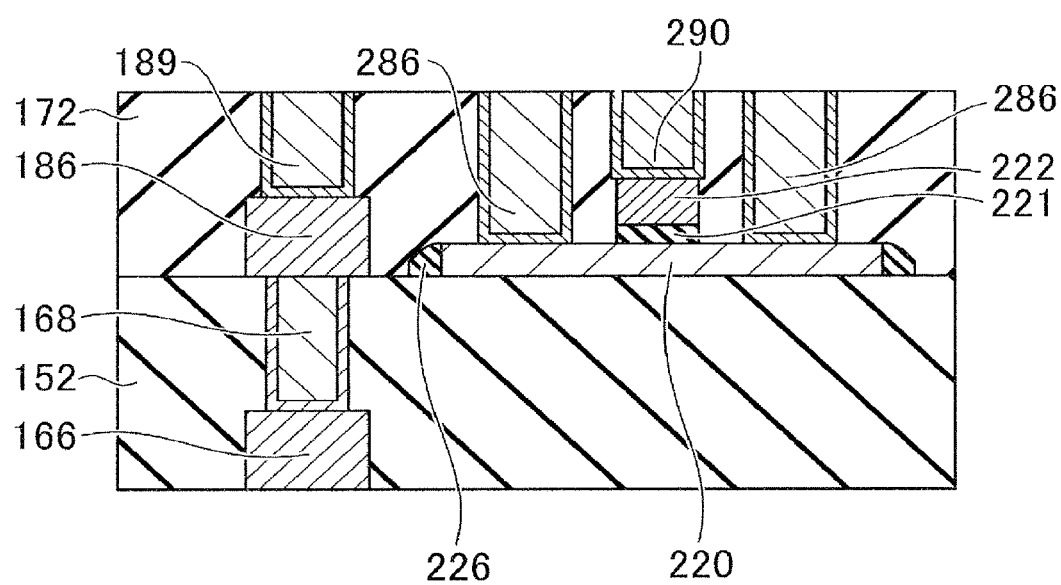
FIG. 21G is a cross-sectional view showing the example of the manufacturing method of the semiconductor device according to the seventh embodiment.

Next, as shown in FIG. 21F, the second interlayer insulating layer 172 is formed so as to cover the sidewalls 226, the semiconductor layer 220, the gate electrode 222, the second wire 186, and the first interlayer insulating layer 152. Subsequently, as shown in FIG. 21G, in the second interlayer insulating layer 172, the holes for the vias and the contacts are opened. Then, the via 189, the contacts (source/drain electrodes) 286, and the via 290 for the gate electrode are embedded using a damascene method. As a result, the second wiring layer 170 is formed.

By the foregoing steps, the semiconductor device 100 according to the present embodiment is manufactured.

In the present embodiment also, irrespective of the type of the wiring layer, the same effects as obtained in the first embodiment can be obtained. That is, irrespective of the generation of the semiconductor device, the semiconductor element (in-wiring-layer active element (component)) 200 can be incorporated in the wiring layer.

Eighth Embodiment

Figure 22:
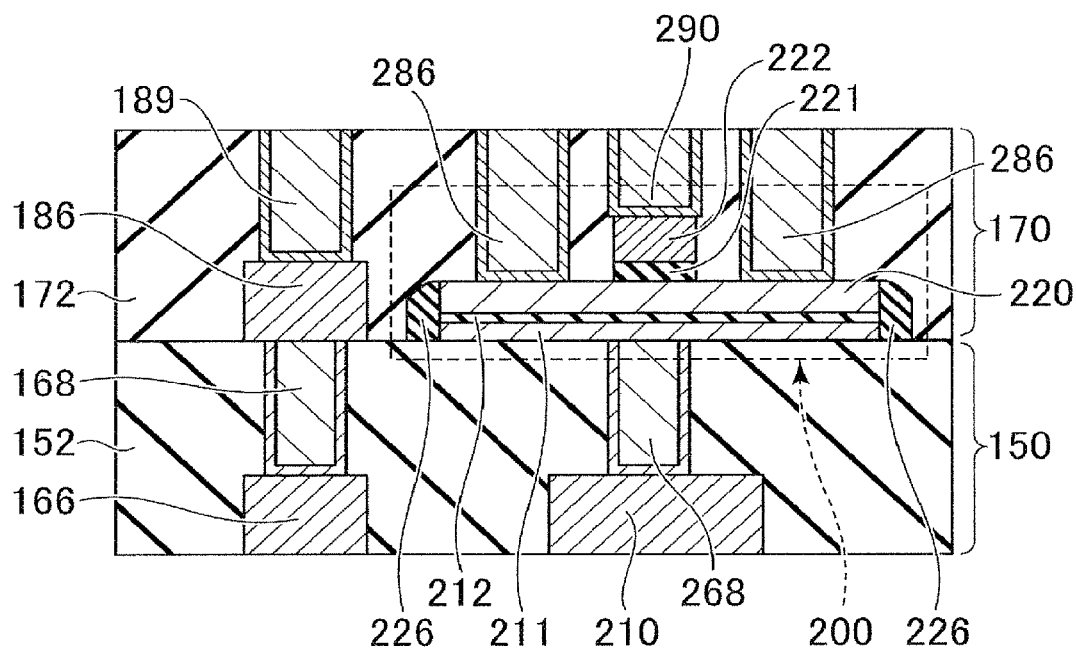
FIG. 22 is a cross-sectional view showing an example of a configuration of a semiconductor device according to an eighth embodiment.

A description will be given of a configuration of a semiconductor device according to an eighth embodiment. FIG. 22 is a cross-sectional view showing an example of the configuration of the semiconductor device according to the present embodiment. The semiconductor device of the present embodiment is different from the semiconductor device of the seventh embodiment (FIG. 20) in having a double gate structure having a back gate 211. Hereinbelow, a description will be given mainly of the difference therebetween.

In the present embodiment, the semiconductor element 200 further includes a back-gate insulating film 212 in contact with the lower portion of the semiconductor layer 220, and the back gate 211 in contact with the lower portion of the back-gate insulating film 212. The back-gate insulating film 212 and the back gate 211 have the same shape as that of the semiconductor layer 220 in planar view. The sidewalls 226 cover the side surfaces of the semiconductor layer 220, the back-gate insulating film 212, and the back gate 211. The first wiring layer 150 includes a first wire (210) for the back gate 211, and a via 268 coupling the first wire (210) to the back gate 211.

Such a configuration can be implemented by the following steps. First, in the step of FIG. 21A in the manufacturing method of the semiconductor device according to the seventh embodiment, the first wire (210) is formed in addition to the first wire 166. Thereafter, the first interlayer insulating layer 152 is deposited. Then, in the first interlayer insulating layer 152, the via 268 is embedded in addition to the via 168 using a damascene method. Subsequently, after the step of FIG. 21B, in the step of FIG. 21C, over the second wire 186, the via 268, and the first interlayer insulating layer 152, not the semiconductor layer 220, but the back gate 211 is formed by, e.g., a sputtering method, the back-gate insulating film 212 is formed by, e.g., a DVD method, and the semiconductor layer 220 is formed by, e.g., a sputtering method. Then, the laminated film of the back gate 211, the back-gate insulating film 212, and the semiconductor layer 220 is patterned into an island shape using typical photolithography and dry etching. The subsequent steps are the same as the steps of FIGS. 21D to 21G.

In the present embodiment also, the same effects as obtained in the seventh embodiment can be obtained.

In addition, according to the present embodiment, it is also possible to form a double gate structure in the aluminum (Al) wiring layer. This allows the semiconductor element (in-wiring-layer active element (component)) having the double gate structure to be incorporated in the wiring layer irrespective of the generation of the semiconductor device.

Ninth Embodiment

Figure 23:
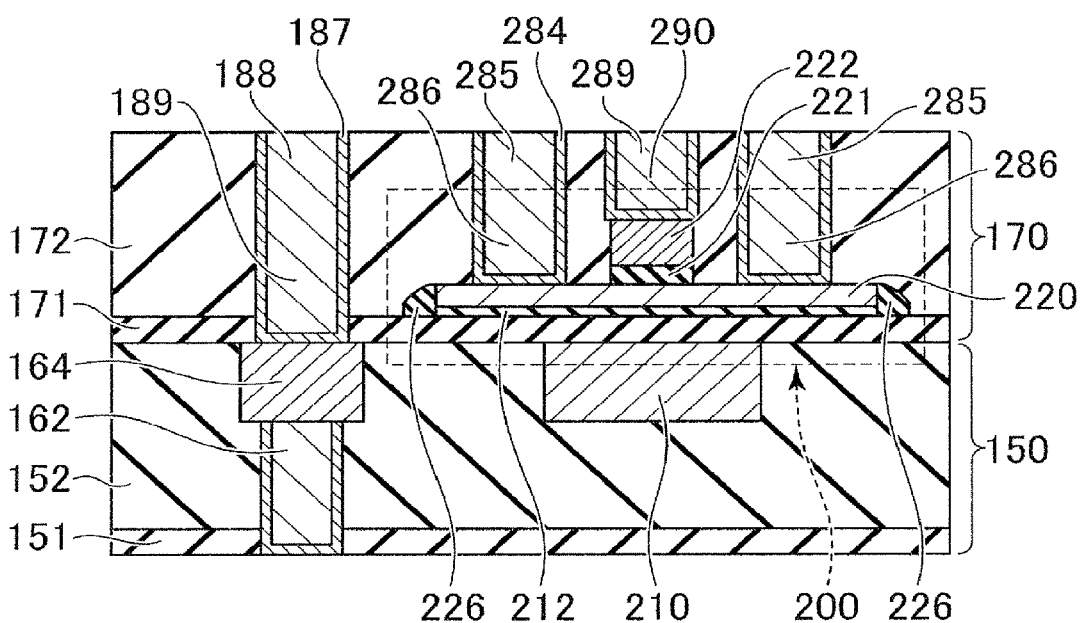
FIG. 23 is a cross-sectional view showing an example of a configuration of a semiconductor device according to a ninth embodiment.
Figure 24:
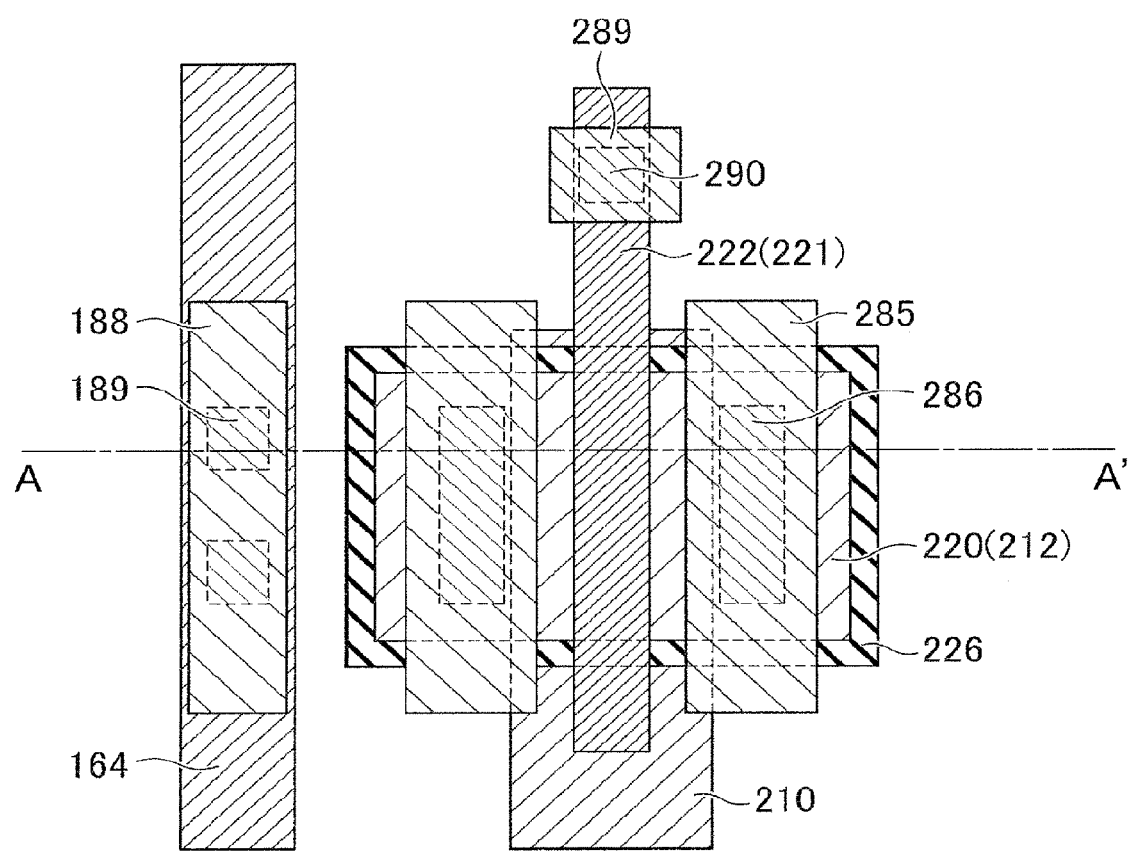
FIG. 24 is a plan view showing the example of the configuration of the semiconductor device according to the ninth embodiment.

A description will be given of a configuration of a semiconductor device according to the ninth embodiment. FIG. 23 is a cross-sectional view showing an example of the configuration of the semiconductor device according to the present embodiment. FIG. 24 is a plan view showing an example of the configuration of the semiconductor device according to the present embodiment. Note that FIG. 23 is a cross section along the line A-A' of FIG. 24. The semiconductor device of the present embodiment is different from the semiconductor device of the first embodiment (FIG. 1A) in having a double gate structure having a charge retaining (storing) function. Hereinbelow, a description will be given mainly of the difference therebetween.

In the present embodiment, the semiconductor element 200 further includes the insulating film 212, the cap insulating layer 171, and the back gate 210 which are provided under the semiconductor layer 220 in addition to the gate insulating film 221 and the gate electrode 222 which are provided over the semiconductor layer 220.

The back gate 210 is provided in the surface region of the first wiring layer 150, similarly to the first wire (Cu wire) 164 in the first wiring layer 150. The back gate 210 has the top surface thereof covered with the cap insulating layer 171. The back gate 210 is provided at a position opposing the gate electrode 222 via the cap insulating layer 171 and the semiconductor layer 220. For example, the back gate 210 is provided so as to cover the region extending from one (source electrode) of the contacts 286 of the semiconductor layer 220 to the other contact (drain electrode) 286 through the gate electrode 222. That is, the semiconductor element 200 has the double gate structure having the gate electrode 222 and the back gate 210.

In the cap insulating layer 171, charges extracted from the semiconductor layer 220 by the voltage applied to the back gate 210 are retained or released therefrom into the semiconductor layer 220. Thus, the cap insulating layer 171 has the function of a charge retaining layer. That is, the semiconductor element 200 has a memory function. Note that examples of the material of the cap insulating layer 171 include silicon nitride ($SiN_x$) and silicon carbonitride (SiCN), and the film thickness of the cap insulating layer 171 is about 10 to 50 nm. The insulating film 212 (tunnel insulating film) provides isolation between the cap insulating layer 171 and the semiconductor layer 220 so as to prevent inappropriate movement of charges. Examples of the material of the insulating film 212 include silicon dioxide ($SiO_2$), aluminum oxide ($Al_2O_3$), another metal oxide, and a combination thereof. The thickness of the insulating film 212 is about 3 to 20 nm.

Note that the cap insulating layer 171 located under the insulating film 212 functions as the charge retaining layer.

However, a structure in which a new charge retaining film is interposed between the cap insulating layer 171 and the insulating film 212 may also be used. In this case, examples of the material of the interposed charge retaining film include films of silicon nitride ($SiN_x$), silicon carbonitride (SiCN), aluminum oxide ($Al_2O_3$), and silicon dioxide ($SiO_2$) to each of which an extremely small amount of impurity has been added, another trap insulating film, a polysilicon floating gate, silicon nanocrystal embedded in a silicon dioxide film, and a metal oxide semiconductor. The thickness of the interposed charge retaining film is about 2 to 30 nm.

By having a structure described above, the semiconductor element 200 according to the present embodiment can operate as, e.g., a memory.

The following is the operation of the semiconductor element 200 as the memory.

Data writing is implemented by, e.g., applying a predetermined voltage (e.g., +3 V or 0 V) to the back gate 210 and to the gate electrode 222 to extract charges (e.g., electrons) from the semiconductor layer 220 and injecting the charges into the cap insulating layer 171 as the charge retaining layer. Data erasing is implemented by, e.g., applying a predetermined voltage (e.g., −3 V or +3 V) to the back gate 210 and to the gate electrode 222 to eject charges (e.g., electrons) from the cap insulating layer 171 as the charge retaining layer and injecting the charges into the semiconductor layer 220. Data reading is performed by detecting a variation in the threshold voltage of a transistor (hereinafter referred to also as an upper transistor) including the semiconductor layer 220, the gate insulating film 221, and the gate electrode 222 since the threshold voltage varies in accordance with the quantity of the charges retained in the cap insulating layer 171. More specifically, the variation in threshold voltage is detected as a variation in the current value of the transistor at a given fixed read voltage (voltage applied to the gate during reading). Accordingly, the back gate 210 can also be regarded as a control gate (or a control electrode) which controls the entrance/exit of charges. The gate electrode 222 can also be regarded as a read gate (or a read gate electrode) which performs data reading.

Also, the semiconductor element 200 according to the present embodiment can operate as, e.g., a transistor having a controllable threshold voltage.

The following is the operation of the semiconductor element 200 as the transistor having the controllable threshold voltage.

For example, by applying a predetermined voltage to the back gate 210 and to the gate electrode 222 to extract charges from the semiconductor layer 220 and injecting the charges into the cap insulating layer 171 as the charge retaining layer, the threshold voltage of the upper transistor described above can be changed. For example, when the upper transistor is of an n-type, as the quantity of retained electrons as the charges increases in the cap insulating layer 171, the threshold voltage increases. On the other hand, when the upper transistor is of a p-type, as the quantity of retained holes as the charges increases in the cap insulating layer 171, the threshold voltage increases. At this time, through such retention of carriers by the cap insulating layer 171, the threshold voltage can be permanently changed.

In addition, by controlling the voltage applied to the back gate 210 in correspondence to the timing of the operation of the upper transistor described above, it is also possible to dynamically change the threshold voltage of the upper transistor.

Such a configuration can be produced by adding the following modifications to the manufacturing method of the semiconductor device of the first embodiment. First, when the first wiring layer 150 is formed in the step of FIG. 3A, the back gate (Cu wire) 210 is formed simultaneously with the formation of the first wire (Cu wire) 164. Also, in the step of FIG. 3B, before the semiconductor layer 220 is formed, the insulating film 212 is formed over the cap insulating layer 171 by, e.g., a CVD method. Then, when the gate electrode 222 and the like are formed in the step of FIG. 3G, since the semiconductor layer 220 is formed over the region where the back gate 210 exists, the gate electrode 222 and the like are aligned with respect to the back gate 210 and patterned.

In the present embodiment also, the same effects as obtained in the first embodiment can be obtained.

In addition, in the present embodiment, it is possible to form the film for the charge retaining layer without adding a new step and interpose the tunnel insulating film between the charge retaining film and the channel by adding only one depositing step. This allows the back gate 210, the cap insulating layer 171, the insulating film 212, and the semiconductor layer 220 to form a structure equivalent to an NMOS (Metal-Nitride-Oxide-Semiconductor) structure. As a result, the semiconductor element 200 having a memory structure can be formed at low cost. Additionally, the charge retaining function of the cap insulating layer 171 enables a nonvolatile threshold modulation operation (including a memory function) to be performed. That is, the semiconductor element 200 having the function of a transistor having a changeable threshold can be formed. Moreover, the insulating film 212 enables the nonvolatile threshold modulation operation (including the memory function) to be stably performed even at a higher temperature. Furthermore, since the tunnel insulating film (insulating film 212) is formed on the side of the channel (semiconductor layer 220) where the back gate 210 is provided, it is possible to implement a nonvolatile threshold modulation operation characteristic without involving a change in the gate capacitance of the in-wiring-layer active element (component) (semiconductor element 200).

Tenth Embodiment

Figure 25:
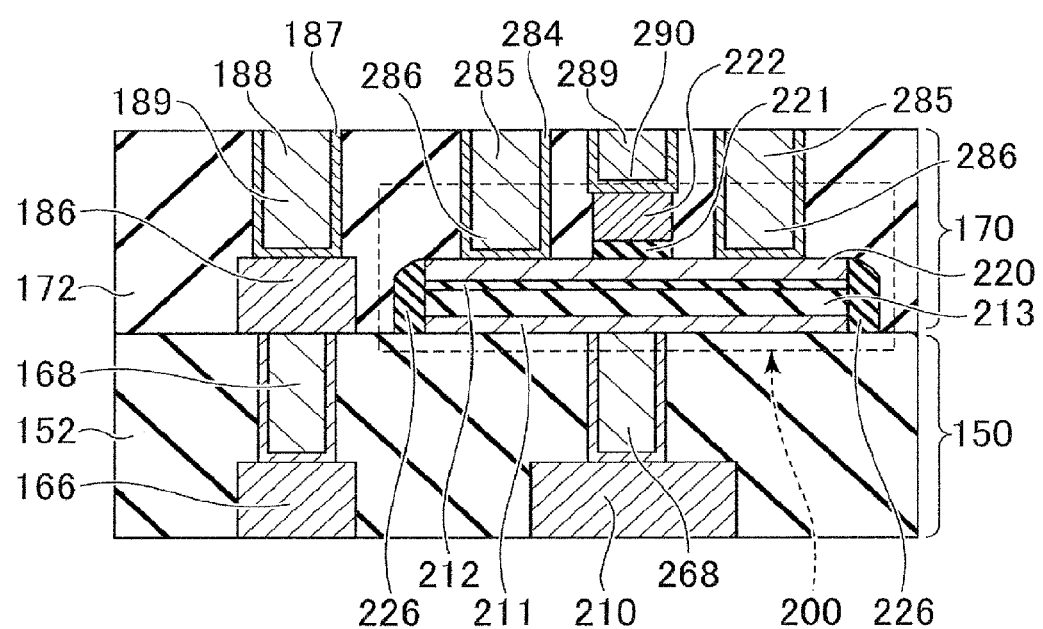
FIG. 25 is a cross-sectional view showing an example of a configuration of a semiconductor device according to a tenth embodiment.
Figure 26:
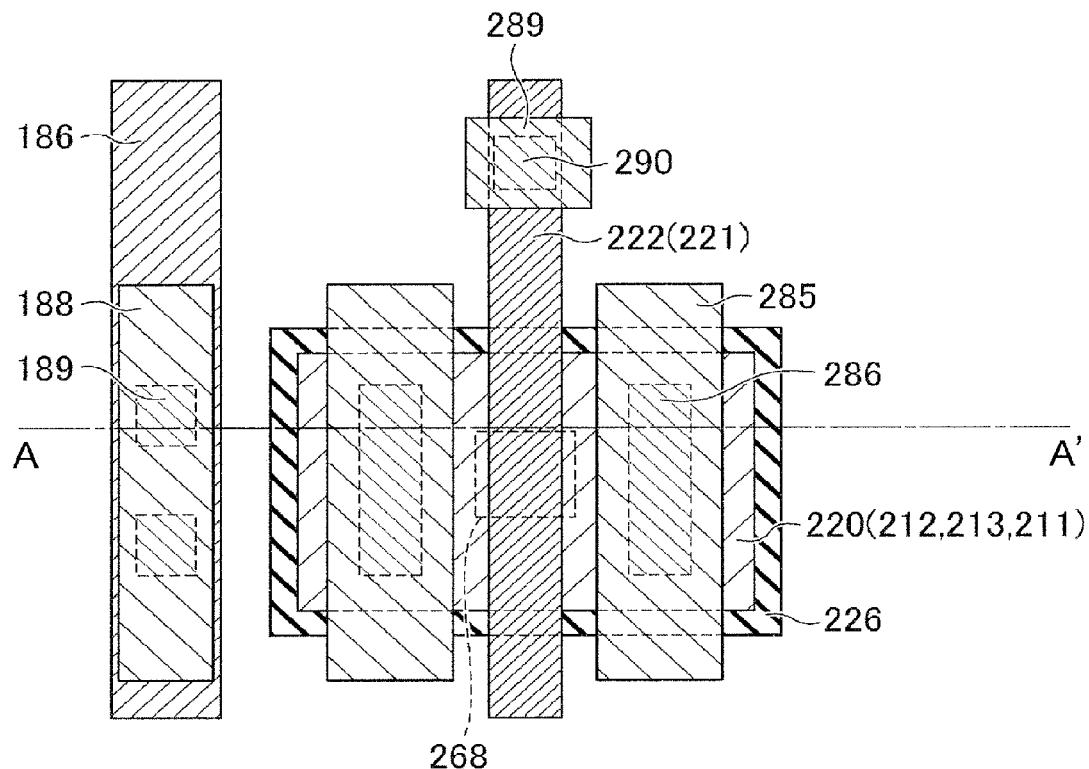
FIG. 26 is a plan view showing the example of the configuration of the semiconductor device according to the tenth embodiment.

A description will be given of a configuration of a semiconductor device according to the tenth embodiment. FIG. 25 is a cross-sectional view showing an example of the configuration of the semiconductor device according to the present embodiment. FIG. 26 is a plan view showing the example of the configuration of the semiconductor device according to the present embodiment. Note that FIG. 25 is a cross section along the line A-A' of FIG. 26. The semiconductor device of the present embodiment is different from the semiconductor device of the eighth embodiment (FIG. 22) in having a charge retaining layer. Hereinbelow, a description will be given mainly of the difference therebetween.

In the present embodiment, the semiconductor element 200 further includes an insulating film 213 having a charge retaining function between the back-gate insulating film 212 under the semiconductor layer 220 and the back gate 211 coupled to the upper portion of the via 268. The semiconductor layer 220, the back-gate insulating film 212 in contact with the lower side of the semiconductor layer 220, the insulating film 213 in contact with the lower side of the back-gate insulating film 212, and the back gate 211 in contact with the lower side of the insulating film 213 have the same shape (island shape) in planar view. The sidewalls 226 cover the side surfaces of the semiconductor layer 220, the back-gate insulating film 212, the insulating film 213, and the back gate 211. In this case, the back gate 211 can also be regarded as a control gate (or control electrode) which controls the entrance/exit of charges. The gate electrode 222 can also be regarded as a read gate (or read gate electrode) which performs data reading.

Such a configuration can be implemented by the following steps. In the manufacturing method of the semiconductor device according to the eighth embodiment, over the second wire 186, the via 268, and the first interlayer insulating layer 152, the back gate 211 is formed by, e.g., a sputtering method, the insulating film 213 and the back-gate insulating film 212 are formed by, e.g., a CVD method, and the semiconductor layer 220 is formed by, e.g., a sputtering method. Then, the laminate film of the back gate 211, the insulating film 213, the back-gate insulating film 212, and the semiconductor layer 220 is patterned into an island shape using typical photolithography and dry etching. The subsequent steps are the same as in the steps of FIGS. 21D to 21G.

In the present embodiment also, the same effects as achieved in the eighth embodiment can be achieved.

In addition, in the present embodiment, the same semiconductor element 200 as in the ninth embodiment can be formed even in an aluminum (Al) wiring layer. That is, the present embodiment can also achieve the effects of the ninth embodiment resulting from the addition of the film having the charge retaining function. As a result, an in-wiring-layer active element (component) capable of a nonvolatile threshold modulation operation (including a memory function) can be incorporated in the semiconductor device according to the same design without depending on the generation of the semiconductor device.

Eleventh Embodiment

Figure 27:
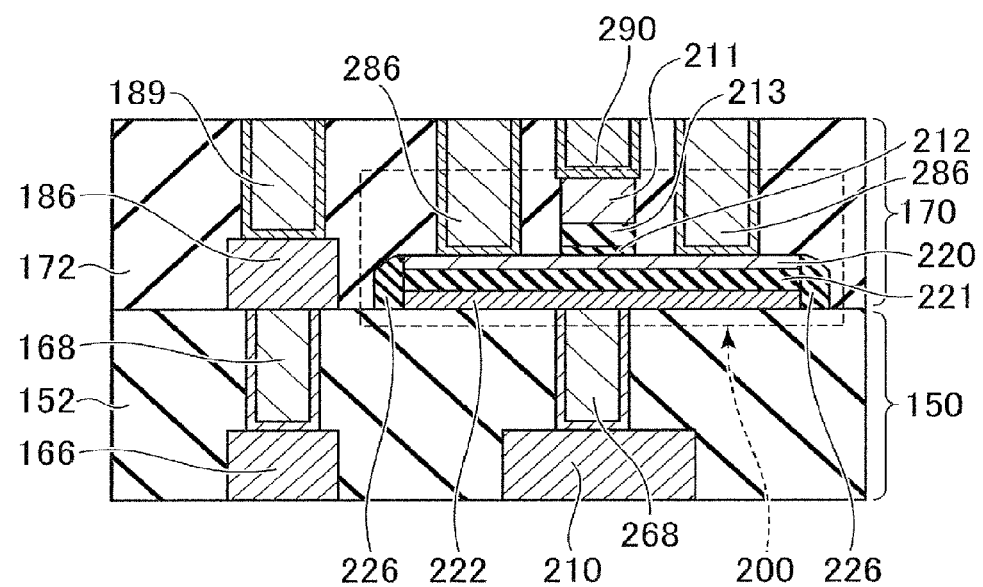
FIG. 27 is a cross-sectional view showing an example of a configuration of a semiconductor device according to an eleventh embodiment.

A description will be given of a configuration of a semiconductor device according to the eleventh embodiment. FIG. 27 is a cross-sectional view showing an example of the configuration of the semiconductor device according to the present embodiment. The semiconductor device of the present embodiment is different from the semiconductor device of the tenth embodiment (FIG. 25) in that the positions of the gate electrode 222, the gate insulating film 221, the semiconductor layer 220, the back-gate insulating film 212, the insulating film 213, and the back gate 211 are vertically reversed. Hereinbelow, a description will be given mainly of the difference therebetween.

The semiconductor element 200 of each of the tenth embodiment and the present embodiment is an in-wiring-layer active element (component) capable of a nonvolatile threshold modulation operation (including a memory function). However, in the semiconductor element 200 of the tenth embodiment, the gate insulating film 221 under the gate electrode 222 as the top gate is thin and in contact with the semiconductor layer 220 to have a large gate capacitance, while the insulating film 213 over the back gate 211 as the bottom gate has the charge retaining function and is in contact with the semiconductor layer 220 via the back-gate insulating film 212. On the other hand, in the semiconductor element 200 of the present embodiment, the gate electrode 222 and the gate insulating film 221 serve as the bottom gate which is in contact with the semiconductor layer 220, while the gate electrode 211 and the insulating film 213 serve as the top gate which is in contact with the semiconductor layer 220 via the gate insulating film 212. That is, the functions of the top gate and the bottom gate in the tenth embodiment are reversed in the present embodiment. In this case, the top-side gate electrode 211 can also be regarded as a control gate (or a control electrode) which controls the entrance/exit of charges. On the other hand, the back-side gate electrode 222 can also be regarded as a read gate (or a read gate electrode) which performs data reading.

Such a configuration can be implemented by reversing the order in which the individual films forming a gate stack are laminated in the manufacturing method of the semiconductor device of the tenth embodiment. In this manner, the semiconductor device according to the present embodiment (semiconductor device including the in-wiring-layer active element (component) capable of the nonvolatile threshold modulation operation (including the memory function)) is formed in which the functions of the top gate and the bottom gate are reverse to those in the semiconductor device of the tenth embodiment.

In the present embodiment, the same effects as obtained in the tenth embodiment can be obtained.

In addition, in the present embodiment, the area of the insulating film 213 having the function of the charge retaining layer is reduced to allow the operations of injecting, retaining, and releasing charges to be performed more stably.

Twelfth Embodiment

Figure 28:
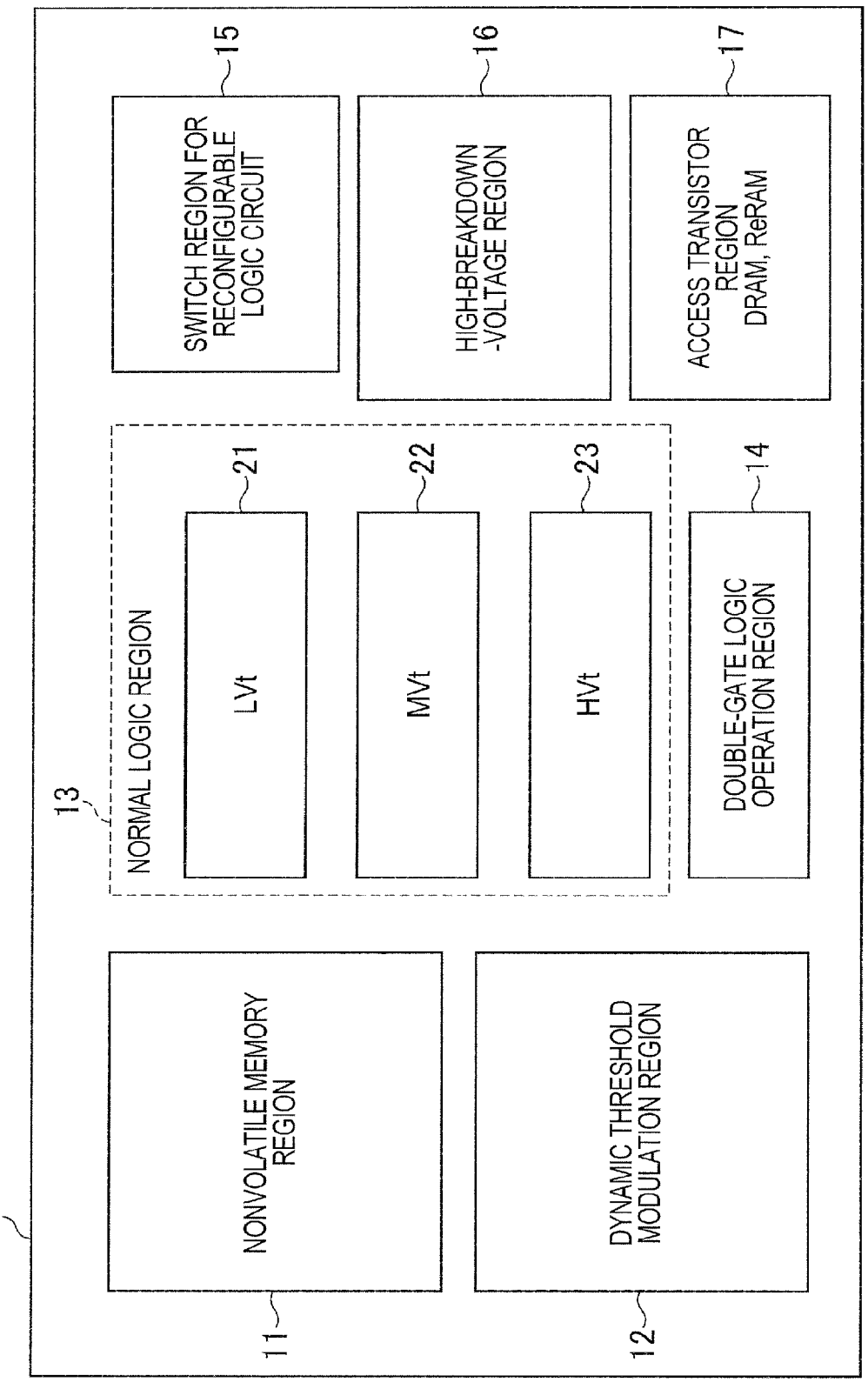
FIG. 28 is a layout chart schematically showing an example of a configuration of a semiconductor device according to a twelfth embodiment.

A description will be given of a configuration of a semiconductor device according to the twelfth embodiment. FIG. 28 is a layout chart schematically showing an example of the configuration of the semiconductor device according to the twelfth embodiment. The drawing shows the layout of a semiconductor element over a wiring layer. Accordingly, in the drawing, the layout of the semiconductor element in the surface region of the semiconductor substrate 101 which is provided below the wiring layer is omitted.

The semiconductor device of the present embodiment is a semiconductor chip 10. An example is shown in which, in the semiconductor chip 10, the semiconductor element 200 of any of the first to eleventh embodiments is disposed at any place. The semiconductor chip 10 includes a nonvolatile memory region 11, a dynamic threshold modulation region 12, a normal logic region 13, a double-gate logic operation region 14, a switch region for reconfigurable logic circuit 15, a high-breakdown-voltage region 16, and an access transistor/DRAM/ReRAM region 17.

In the nonvolatile memory region 11, for example, the semiconductor element 200 of any of the ninth to eleventh embodiments can be used as a nonvolatile memory. In the dynamic threshold modulation region 12, the semiconductor element 200 of any of the ninth to eleventh embodiments can be used as a transistor subjected to dynamic threshold voltage modulation. In the normal logic region 13, of the semiconductor elements 200 of the ninth to eleventh embodiments, one having the threshold voltage thereof set at a low level can be used as a transistor for a low threshold voltage region (LVt region) 21, one having the threshold voltage thereof set at a middle level can be used as a transistor for a middle threshold voltage region (MVt region) 22, and one having the threshold voltage thereof set at a high level can be used as a transistor for a high threshold voltage region (HVt region) 23. In the double-gate logic operation region 14, the semiconductor element of any of the third and eighth to eleventh embodiments can be used as a double-gate transistor. In the switch region for reconfigurable logic circuit 15, the semiconductor element 200 of any of the first to eleventh embodiments can be used as a switch for switching a logic circuit using the semiconductor element in the surface region of the semiconductor substrate 101. In the high-breakdown-voltage region 16, the semiconductor element 200 of any of the modification of the second embodiment and the ninth to eleventh embodiments can be used as a transistor for a high breakdown voltage. In the access transistor/DRAMM/ReRAM region 17, the semiconductor element 200 of any of the first to eleventh embodiments can be used as an access transistor for a DRAM (Dynamic Random Access Memory) or a ReRAM (Resistance Random Access Memory).

A manufacturing method of the semiconductor device of the present embodiment is as described above in each of the embodiments.

In the present embodiment, the effects of the semiconductor devices of the individual embodiments used herein can be achieved.

In addition, in the present embodiment, particularly by the semiconductor element 200 of each of the ninth to eleventh embodiments, a nonvolatile threshold adjusting function can be implemented. This allows the semiconductor elements 200 of the foregoing semiconductor chip 10 to be implemented with one type of element in the same wiring layer. It is also possible to form a region not having a charge retaining film.

Some or all of the foregoing embodiments and modifications can also be described as in the following notes, but are not limited to the following.

(Note 1) A semiconductor device, including: a first wiring layer having a first interlayer insulating layer and a first wire embedded in the first interlayer insulating layer; a second wiring layer having a second interlayer insulating layer formed above the first wiring layer and a second wire embedded in the second interlayer insulating layer; and a semiconductor element provided at least in the second wiring layer, wherein the semiconductor element includes: a semiconductor layer provided in the second wiring layer; a first gate insulating film provided in contact with the semiconductor layer; a first gate electrode provided on the opposite side of the semiconductor layer via the first gate insulating film; and a first side wall film provided over a side surface of the semiconductor layer.

(Note 2)

In a semiconductor device according to Note 1, the first gate electrode extends from over the semiconductor layer beyond the first side wall film.

(Note 3)

In a semiconductor device according to Note 1, a material of the semiconductor layer is an oxide semiconductor.

(Note 4)

In a semiconductor device according to Note 1, the semiconductor element further includes a hard mask provided over the first gate electrode.

(Note 5)

In a semiconductor device according to Note 1, the semiconductor element further includes: a second side wall film provided over a side surface of the first gate electrode.

(Note 6)

In a semiconductor device according to Note 5, an etching rate of a material of the second side wall film is different from an etching rate of a material of the second interlayer insulating layer.

(Note 7)

In a semiconductor device according to Note 6, a material of the second interlayer insulating layer includes a silicon oxide, and a material of the second side wall film includes a silicon nitride.

(Note 8)

In a semiconductor device according to Note 1, the semiconductor element includes first vias as a source electrode and a drain electrode, and the first via as the drain electrode is disposed at a predetermined distance from the gate electrode.

(Note 9)

In a semiconductor device according to Note 1, the semiconductor element further includes: a second gate insulating film provided in contact with the semiconductor layer on the opposite side of the first gate insulating film with respect to the semiconductor layer; and a second gate electrode provided in contact with the second gate insulating film on the opposite side of the first gate electrode with respect to the semiconductor layer.

(Note 10)

In a semiconductor device according to Note 9, the second gate is the first wire or a metal coupled to the first wire.

(Note 11)

In a semiconductor device according to Note 10, a region where the second gate electrode is formed is a part of a region where the semiconductor layer exists in planar view.

(Note 12)

In a semiconductor device according to Note 1, the first gate insulating film is provided over an entire upper surface of the semiconductor layer.

(Note 13)

In a semiconductor device according to Note 12, the first side wall film is provided so as to further cover a side surface of the first gate insulating film.

(Note 14)

In a semiconductor device according to Note 13, the first side wall film is provided so as to further cover an upper surface of the first gate insulating film.

(Note 15)

In a semiconductor device according to Note 1, the first gate electrode includes a metal film including not less than two layers.

(Note 16)

In a semiconductor device according to Note 15, the metal film in a layer under the first gate electrode is provided only over a portion of the first gate insulating film located over the semiconductor layer, and the metal film in a layer over the first gate electrode is provided over the first gate insulating film to have such a shape as to extend across the semiconductor layer.

(Note 17)

In a semiconductor device according to Note 15, the metal film in the layer under the first gate electrode contains a titanium nitride.

(Note 18)

In a semiconductor device according to Note 17, the metal film in the layer over the first gate electrode contains aluminum (Al).

(Note 19)

In a semiconductor device according to Note 9, the semiconductor element further includes: a first insulating film provided so as to come in contact with either one of the first gate insulating film and the second gate insulating film, and the first or second gate insulating film in contact with the first insulating film or the first insulating film has a charge retaining function.

(Note 20)

In a semiconductor device according to Note 19, the gate electrode closer to the insulating film having the charge retaining function is a control electrode.

(Note 21)

In a semiconductor device according to Note 20, the control electrode is embedded in the first wiring layer.

(Note 22)

In a semiconductor device according to Note 21, the first wire is a Cu wire.

(Note 23)

In a semiconductor device according to Note 20, the control electrode is coupled to the first wire through a via in the first wiring layer.

(Note 24)

In a semiconductor device according to Note 23, the first wire is an Al wire.

(Note 25)

In a semiconductor device according to Note 19, the insulating film having the charge retaining function contains silicon and nitrogen.

(Note 26)

In a semiconductor device according to Note 19, the gate electrode closer to the insulating film not having the charge retaining function is a read gate electrode.

(Note 27)

In a semiconductor device according to Note 19, the insulating film having the charge retaining function functions as a wire diffusion barrier film in a region where the semiconductor element is absent.

(Note 28)

In a semiconductor device according to Note 19, the semiconductor element has a threshold which is adjusted with a quantity of charges injected into the insulating film having the charge retaining function.

(Note 29)

A method of manufacturing a semiconductor device, including the steps of: forming an island-shaped semiconductor layer over a wiring layer having a first wire; forming an insulating film so as to cover the semiconductor layer and the wiring layer therewith; etching back the insulating film to form a first side wall film covering a side surface of the semiconductor layer; and forming a gate insulating film and a gate electrode in this order over the semiconductor layer, wherein the gate electrode is formed over the gate insulating film so as to extend over the semiconductor layer and the first side wall film.

While the invention achieved by the present inventors has been specifically described heretofore based on the embodiments thereof, the present invention is not limited thereto. It will be appreciated that various changes and modifications can be made in the invention within a scope not departing from the gist thereof. Also, the techniques described in the individual embodiments and the modifications thereof are also applicable to other embodiments and modifications unless a technical contradiction occurs.

What is claimed is:

1. A method of manufacturing a semiconductor device, comprising steps of:
   (a) forming a first wiring over a semiconductor substrate;
   (b) forming a first insulating film over the first wiring:
   (c) forming a semiconductor layer over the first insulating film;
   (d) forming a first gate insulating film over the semiconductor layer;
   (e) patterning the first gate insulating film;
   (f) after the step (e), patterning the semiconductor layer by using the first gate insulating film as a mask;
   (g) after the step (f), forming a first side wall which is made of a second insulating film, over a side surface of the semiconductor layer so as to surround the semiconductor layer in a plan view;
   (h) forming a first gate electrode over the first gate insulating film, the first side wall and the first insulating film;
   (i) patterning the first gate electrode such that the first gate insulating film is exposed from the first gate electrode in a gate length direction;
   (j) after the step (i), forming a third insulating film over the first gate electrode, the first gate insulating film, the first side wall and the first insulating film; and
   (k) forming a first contact for a drain electrode and a second contact for a source electrode in the third insulating film and the first gate insulating film in order to be connected to the semiconductor layer,
   wherein, after the step (i), as considered in a gate width direction, the first gate electrode is located over the first gate insulating film, the first side wall, and parts of the first insulating film disposed to opposite sides of the semiconductor layer in a region surrounding the semiconductor layer and the first sidewall in the plan view, and
   wherein, in the gate width direction in the plan view, the first side wall has portions located between the side surface of the semiconductor layer and portions of the first gate electrode formed over the parts of the first insulating film.

2. A method of manufacturing a semiconductor device according to claim 1, wherein, in the step (e), the first gate insulating film is patterned by using a resist film, and wherein the resist film is removed before the step (f).

3. A method of manufacturing a semiconductor device according to claim 2, wherein the first side wall is also formed over a side surface of the first gate insulating film.

4. A method of manufacturing a semiconductor device according to claim 3, wherein the semiconductor layer includes an InGaZnO layer, an InZnO layer, a ZnO layer, a ZnAlO layer, a ZnCuO layer, an NiO layer, an SnO layer, an $SnO_2$ layer, a CuO layer or a $Cu_2O$ layer.

5. A method of manufacturing a semiconductor device according to claim 4, wherein the first gate insulating film includes a silicon oxide film, a silicon nitride film or an oxide film of Hf, Zr, Al or Ta.

6. A method of manufacturing a semiconductor device according to claim 5, wherein the second insulating film is made of a different material from the first gate insulating film.

* * * * *